United States Patent
Oh et al.

(10) Patent No.: US 7,772,768 B2
(45) Date of Patent: Aug. 10, 2010

(54) POLARIZER AND FLAT PANEL DISPLAY APPARATUS INCLUDING THE SAME

(75) Inventors: Jong-Seok Oh, Suwon-si (KR);
Jong-Hyuk Lee, Suwon-si (KR);
Young-Woo Song, Suwon-si (KR);
Kyu-Hwan Hwang, Suwon-si (KR);
Joon-Gu Lee, Suwon-si (KR);
Jae-Heung Ha, Suwon-si (KR);
Chul-Woo Park, Suwon-si (KR)

(73) Assignee: Samsung Mobile Display Co., Ltd., Yongin-si (KR)

( * ) Notice: Subject to any disclaimer, the term of this patent is extended or adjusted under 35 U.S.C. 154(b) by 297 days.

(21) Appl. No.: 11/837,451

(22) Filed: Aug. 10, 2007

(65) Prior Publication Data
US 2008/0225389 A1   Sep. 18, 2008

(30) Foreign Application Priority Data
Mar. 2, 2007   (KR) ............... 10-2007-0021159
Mar. 12, 2007  (KR) ............... 10-2007-0024191

(51) Int. Cl.
*H01J 1/62* (2006.01)
(52) U.S. Cl. ................................ 313/506; 313/504
(58) Field of Classification Search ............. 313/504, 313/506; 359/486
See application file for complete search history.

(56) References Cited

U.S. PATENT DOCUMENTS 6,665,119 B1   12/2003   Kurtz et al.

2004/0125449 A1   7/2004   Sales
2004/0212606 A1   10/2004   Miyachi et al.

FOREIGN PATENT DOCUMENTS

EP   1 879 242 A1   1/2008
JP   2002-328234 A   11/2002

(Continued)

OTHER PUBLICATIONS

Patent Abstracts of Japan, Publication No. 2006-178186, dated Jul. 6, 2006, in the name of Atsushi Amako et al.
Patent Abstracts of Japan, Publication No. 2007-033746, dated Feb. 8, 2007, in the name of Keihei Cho.

(Continued)

*Primary Examiner*—Vip Patel
(74) *Attorney, Agent, or Firm*—Christie, Parker & Hale, LLP

(57) ABSTRACT

A polarizer and a flat panel display apparatus including the polarizer are provided. The polarizer includes: a base; and a plurality of grids on the base, the plurality of grids including a first component and a second component, and having a thickness in a thickness direction of the polarizer. The first component includes a dielectric material and the second component includes a metal. The first component and the second component have a concentration gradient in the thickness direction, wherein a concentration of the first component in the grids increases along a thickness direction toward the external light incidence side, and a concentration of the second component in the grids increases along a thickness direction away from the external light incidence side.

33 Claims, 31 Drawing Sheets

FOREIGN PATENT DOCUMENTS

| | | |
|---|---|---|
| JP | 2005-128228 A | 5/2005 |
| JP | 2006-178186 | 7/2006 |
| JP | 2007-003870 | 1/2007 |
| JP | 2007-33746 | 2/2007 |
| KR | 2002-0021129 | 3/2002 |
| KR | 10-2004-0030981 | 4/2004 |
| KR | 10-2005-0069386 | 7/2005 |

OTHER PUBLICATIONS

Korean Patent Abstracts, Publication No. 1020020021129 A, dated Mar. 18, 2002, in the name of Raymond T. Perkins et al.

Korean Patent Abstracts, Publication No. 1020040030981 A, dated Apr. 9, 2004 in the name of Koichi Miyashi et al.

Korean Patent Abstracts, Publication No. 1020050069386 A, dated Jul. 5, 2005, in the name of Doo Hyun Ko.

European Search Report for Application No. EP 07 25 3133, Dated Jun. 18, 2006.

EXTERNAL LIGHT

EXTERNAL LIGHT

EXTERNAL LIGHT

EXTERNAL LIGHT

EXTERNAL LIGHT

EXTERNAL LIGHT

EXTERNAL LIGHT

EXTERNAL LIGHT

POLARIZER AND FLAT PANEL DISPLAY APPARATUS INCLUDING THE SAME

CROSS-REFERENCE TO RELATED PATENT APPLICATION

This application claims priority to and the benefit of Korean Patent Application No. 10-2007-0021159, filed on Mar. 2, 2007, and Korean Patent Application No. 10-2007-0024191, filed on Mar. 12, 2007, in the Korean Intellectual Property Office, the disclosures of which are incorporated herein in their entirety by reference.

BACKGROUND OF THE INVENTION

1. Field of the Invention

The present invention relates to a polarizer and a flat panel display apparatus including the same.

2. Description of the Related Art

In recent years, display apparatuses have tended to be replaced by portable thin flat panel display apparatuses. Among flat panel display apparatuses, organic or inorganic light-emitting display apparatuses, which are self-emitting display apparatuses, have advantages such as a wide viewing angle, a good contrast, and a rapid response speed, and thus, are in the spotlight as next generation display apparatuses. Organic light-emitting display apparatuses including a light-emitting layer formed of an organic material exhibit better brightness, driving voltage, and response speed characteristics than inorganic light-emitting display apparatuses, and can provide multicolored images.

Flat panel display apparatuses are manufactured to be lightweight and thin in order to be portable and to be used outdoors. However, flat panel display apparatuses have problems in that contrast and visibility are lowered due to sunlight reflection when images are viewed outdoors. In particular, this problem is more serious in organic light-emitting display apparatuses because such reflection severely occurs on a metal reflective layer.

In view of the above problems, a circular polarizer is disposed on a surface of an organic light-emitting display apparatus. Generally, such a circular polarizer includes a linear polarization layer having thin wire grids formed of a metal. Here, the grids formed of a metal material reflect external light due to the characteristics of the material, which limits an enhancement in contrast.

SUMMARY OF THE INVENTION

Exemplary embodiments according to the present invention provide a polarizer capable of enhancing the contrast and visibility of a flat panel display apparatus, and a flat panel display apparatus including the same.

According to an aspect of an exemplary embodiment of the present invention, a polarizer is provided. The polarizer has an external light incidence side adapted to face an external light, and a side opposite the external light incidence side and spaced from the external light incidence side in a thickness direction of the polarizer. The polarizer includes: a base; and a plurality of grids on the base, the plurality of grids including a first component and a second component, and having a thickness in the thickness direction of the polarizer. The first component includes a dielectric material and the second component includes a metal, and the first component and second component have a concentration gradient in the thickness direction, wherein a concentration of the first component in the grids increases along a first direction parallel to the thickness direction toward the external light incidence side, and a concentration of the second component in the grids increases along a second direction parallel to the thickness direction away from the external light incidence side.

According to another aspect of an exemplary embodiment of the present invention, a polarizer is provided. The polarizer has an external light incidence side adapted to face an external light, and a side opposite the external light incidence side and spaced from the external light incidence side in a thickness direction of the polarizer. The polarizer includes: a base; and a plurality of grids on the base, the plurality of grids including a first component including a dielectric material and a second component including a metal, and having a thickness between a first end and a second end in the thickness direction of the polarizer and having a center between the first and second ends along the thickness direction. The first component and the second component have a concentration gradient in the thickness direction, and a concentration of the first component in the grids increases as the grids along a first direction parallel to the thickness direction from the center toward the first end or the second end, and a concentration of the second component in the grids increases along a second direction parallel to the thickness direction toward the center from the first end or the second end.

The first component may include at least one selected from the group consisting of $SiOx(x \geq 1)$, $SiNx(x \geq 1)$, $MgF_2$, $CaF_2$, $Al_2O_3$, $SnO_2$, indium tin oxide (ITO), indium zinc oxide (IZO), ZnO, and $In_2O_3$.

The second component may include at least one selected from the group consisting of Fe, Co, V, Ti, Al, Ag, Si, Cr, Mo, Ge, Y, Zn, Zr, W, Ta, Cu, and Pt.

The grids may be patterned in a stripe shape and be separated from each other, for example, by a predetermined distance.

According to another aspect of an exemplary embodiment of the present invention, an organic light-emitting display apparatus is provided. The organic light-emitting display apparatus has an image display side, and includes: a substrate; an organic light-emitting device on the substrate for displaying images at the image display side; a sealing member on the organic light-emitting device; a ¼ wavelength retardation layer on a surface corresponding to at least one of the substrate, the organic light-emitting device, or the sealing member; and a linear polarization layer on another surface corresponding to at least one of the substrate, the organic light-emitting device, or the sealing member or on a surface of the ¼ wavelength retardation layer, the linear polarization layer being closer than the ¼ wavelength retardation layer to the image display side. The linear polarization layer includes a plurality of grids including a first component and a second component, the first component includes a dielectric material, and the second component includes a metal. The first component and the second component have a concentration gradient in a thickness direction of the grids, wherein a concentration of the first component in the grids increases along a first direction parallel to the thickness direction toward the image display side, and a concentration of the second component in the grids increases along a second direction parallel to the thickness direction away from the image display side.

According to another aspect of an exemplary embodiment of the present invention, an organic light-emitting display apparatus is provided. The organic light-emitting display apparatus has an image display side, and includes: a substrate; an organic light-emitting device on the substrate for displaying images at the image display side; a sealing member on the organic light-emitting device; a ¼ wavelength retardation layer on a surface corresponding to at least one of the substrate, the organic light-emitting device, or the sealing member; and a linear polarization layer on another surface corresponding to at least one of the substrate, the organic light-emitting device, or the sealing member or on a surface of the ¼ wavelength retardation layer, the linear polarization layer being closer than the ¼ wavelength retardation layer to the image display side. The linear polarization layer includes a plurality of grids including a first component including a dielectric material and a second component including a metal, and having a thickness between a first end and a second end in a thickness direction of the grids and having a center between the first and second ends along the thickness direction. The first component and the second component have a concentration gradient in a thickness direction of the grids. A concentration of the first component in the grids increases along a first direction parallel to the thickness direction from the center toward the first end or the second end, and a concentration of the second component increases along a second direction parallel to the thickness direction toward the center from the first end or the second end.

The images may be displayed toward the substrate, the ¼ wavelength retardation layer may be disposed on the linear polarization layer, and the organic light-emitting device may be disposed on the ¼ wavelength retardation layer.

The images may be displayed toward the substrate, the linear polarization layer may be disposed on the substrate, the ¼ wavelength retardation layer may be disposed on the linear polarization layer, and the organic light-emitting device may be disposed on the ¼ wavelength retardation layer.

The images may be displayed toward the substrate, the ¼ wavelength retardation layer may be disposed on a surface of the substrate, the organic light-emitting device may be disposed on the ¼ wavelength retardation layer, and the linear polarization layer may be disposed on the other surface of the substrate opposite to the ¼ wavelength retardation layer.

The images may be displayed toward the substrate, and the ¼ wavelength retardation layer and the linear polarization layer may be sequentially stacked on a surface of the substrate opposite to the organic light-emitting device.

The images may be displayed toward the sealing member, the ¼ wavelength retardation layer may be disposed on the organic light-emitting device, and the linear polarization layer may be disposed on the ¼ wavelength retardation layer.

The images may be displayed toward the sealing member, and the organic light-emitting display apparatus may further include a protective layer between the organic light-emitting device and the ¼ wavelength retardation layer.

The images may be displayed toward the sealing member, and the ¼ wavelength retardation layer and the linear polarization layer may be sequentially disposed on a surface of the sealing member opposite to the organic light-emitting device.

The images may be displayed toward the sealing member, the ¼ wavelength retardation layer may be disposed on a surface of the sealing member facing the organic light-emitting device, and the linear polarization layer may be disposed on the other surface of the sealing member opposite to the ¼ wavelength retardation layer.

The images may be displayed toward the sealing member, the linear polarization layer may be disposed on a surface of the sealing member facing the organic light-emitting device, and the ¼ wavelength retardation layer may be disposed on a surface of the linear polarization layer facing the organic light-emitting device.

The images may be displayed toward the sealing member, a reflective layer may be further interposed between the substrate and the organic light-emitting device, the ¼ wavelength retardation layer may be disposed between the reflective layer and the organic light-emitting device, and the linear polarization layer may be disposed on the organic light-emitting device.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown.

Figure 1:
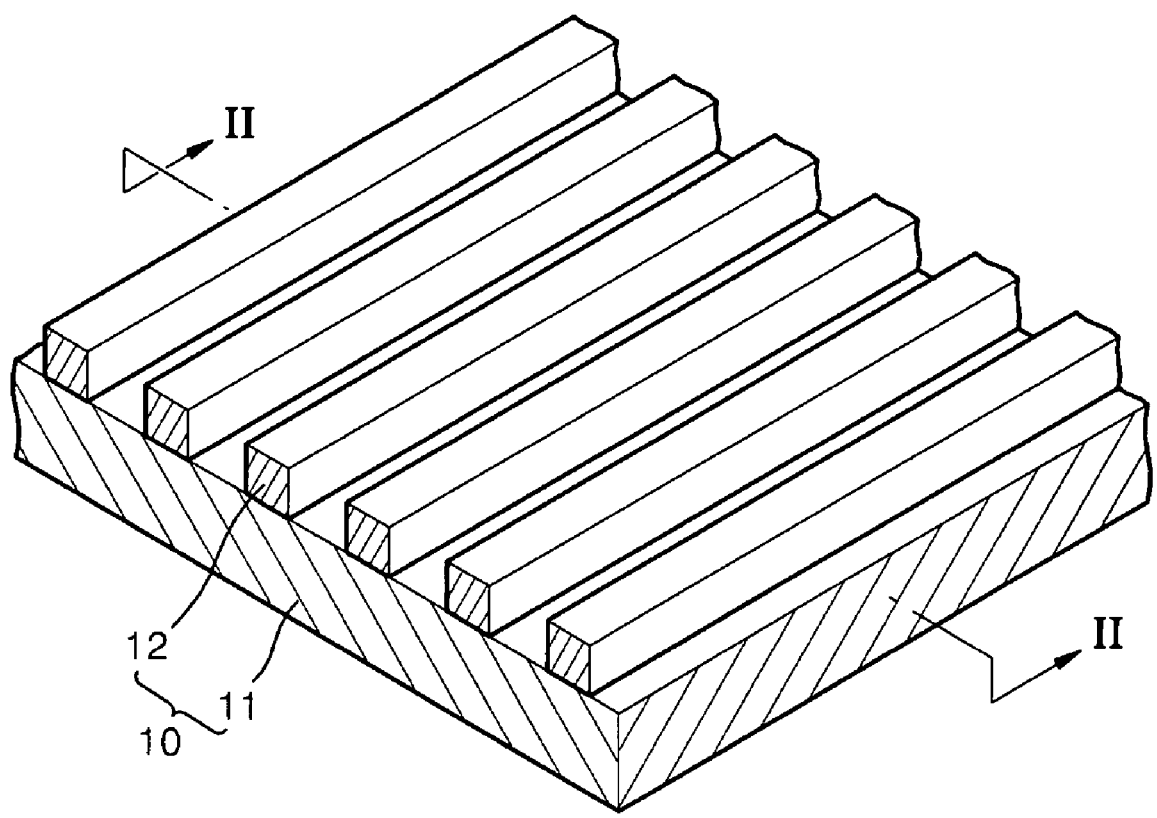
FIG. 1 is a schematic perspective view illustrating a polarizer according to an embodiment of the present invention.
Figure 2:
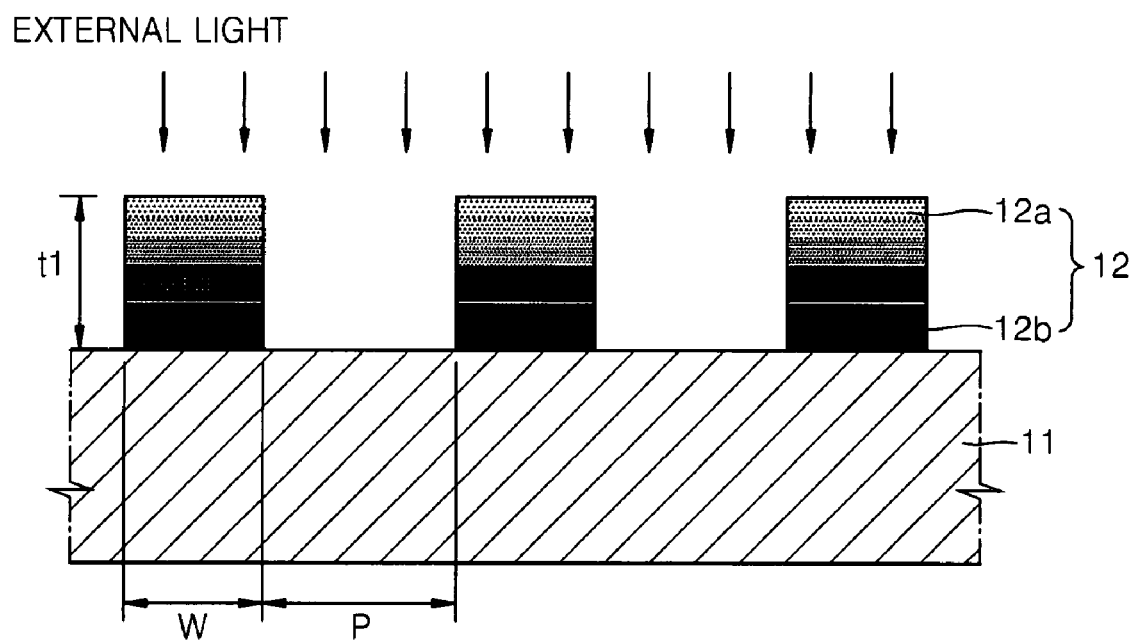
FIG. 2 is a partial sectional view of the polarizer taken along a line II-II of FIG. 1.
Figure 3:
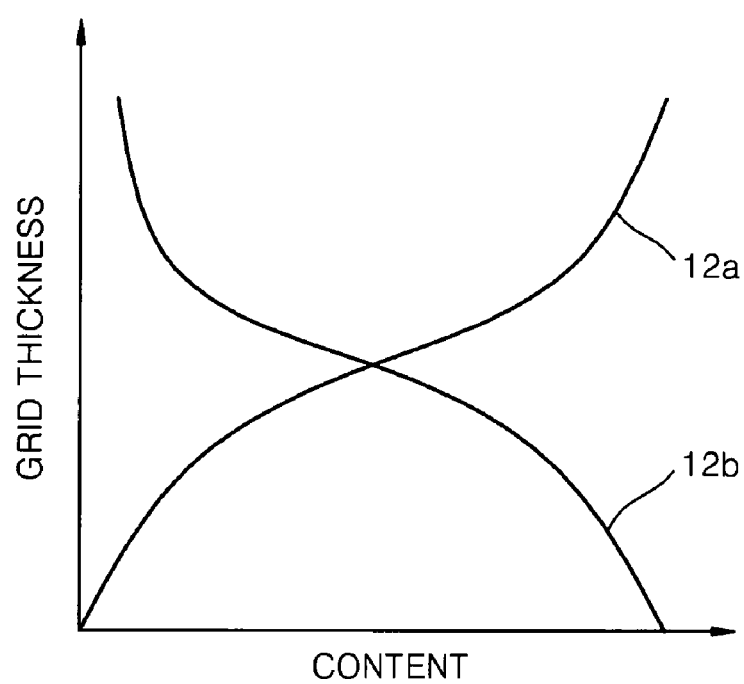
FIG. 3 is a graph illustrating the content (i.e., concentration) of a first component and a second component along the thickness direction of grids in the polarizer of FIG. 2.

FIG. 1 is a schematic perspective view illustrating a polarizer according to an embodiment of the present invention, and FIG. 2 is a partial sectional view taken along a line II-II of FIG. 1. FIG. 3 is a graph illustrating the content (i.e., concentration) of a first component and a second component along the thickness direction of grids in the polarizer of FIG. 2.

Referring to FIGS. 1 and 2, a polarizer 10 includes a base 11 and a plurality of grids 12. The base 11 may be formed of a transparent material in order to allow light generated from a display apparatus in which the polarizer 10 is to be disposed to efficiently pass through the polarizer 10. For this, the base 11 may be formed of glass or a flexible plastic. In order for the base 11 to be formed as a film, in one embodiment, the base 11 is formed using a plastic material.

The grids 12 are disposed on the base 11. The grids 12 may be patterned in the form of stripes which are parallel to each other and spaced apart from each other in order to polarize waves (e.g., predetermined waves) of electromagnetic waves. In order for the polarizer 10 to be used as a polarizer for visible light, the grids 12 may be formed to a width W of 100 to 500 nm and a thickness t1 of 300 to 500 nm. The grids 12 are separated from each other by a pitch P. In the described embodiment, the pitch P of the grids 12 is an important factor for determining the performance of the polarizer 10. If the pitch P of the grids 12 is larger than the wavelength of incident light, the polarizer 10 is used as a diffraction lattice rather than as a polarizer. On the other hand, if the pitch P of the grids 12 is smaller than the wavelength of incident light, the grids 12 mainly perform a polarization function.

Among optical constants, k is a constant related to light absorption. As the k value increases, the characteristics of a polarizer absorbing light vibrating in a direction (e.g., a predetermined direction) are enhanced. Metals have been widely used in conventional grids due to their high k values. However, metals have a high surface reflectance, thereby inducing the reflection of external light on surfaces of grids. This limits an enhancement in the entire contrast of a display apparatus.

In this regard, the grids 12 of the current embodiment of the present invention include a first component 12a and a second component 12b. The first component 12a includes a dielectric material. The first component 12a may include an insulating transparent material, e.g., SiOx (x≧1), SiNx (x≧1), MgF2, CaF2, Al2O3, SnO2, or the like. The first component 12a may also include a conductive transparent material, e.g., indium tin oxide (ITO), indium zinc oxide (IZO), ZnO, or In2O3. The second component 12b includes a metal. For example, the second component 12b may include Fe, Co, V, Ti, Al, Ag, Si, Cr, Mo, Ge, Y, Zn, Zr, W, Ta, Cu, or Pt. The first component 12a and the second component 12b have a concentration gradient in the thickness direction of the grids 12.

Referring to FIG. 3, the content (i.e., concentration) of the second component 12b increases along a thickness direction toward the base 11, and the content (i.e., concentration) of the first component 12a increases along a thickness direction away from the base 11. That is, the second component 12b is mainly distributed in portions of the grids 12 closer to the base 11, and the first component 12a is mainly distributed in portions of the grids 12 farther from the base 11. As illustrated in FIG. 2, external light is incident on the top part of FIG. 2, i.e., on an opposite side to the base 11. As it becomes closer to the external light, the grids 12 include a higher amount of the first component 12a including a dielectric material. That is, as it becomes closer to the base 11, the ratio of an opaque metal to a transparent material in the grids 12 is gradually increased. Therefore, the grids 12 can reduce or prevent an interfacial reflection that may be caused by a refractive index difference. Thus, when external light is incident on the grids 12, the grids 12 absorb the external light, thereby reducing or preventing the reflection of the external light.

In order for the first component 12a and the second component 12b to have a concentration gradient, the grids 12 may be formed using a co-deposition process or the like. When forming the grids 12 using a co-deposition process, the deposition rates of the first component 12a and the second component 12b can be adjusted with respect to time so that the content (i.e., concentration) of the first component 12a is inversely proportional to the content (i.e., concentration) of the second component 12b.

Figure 4:
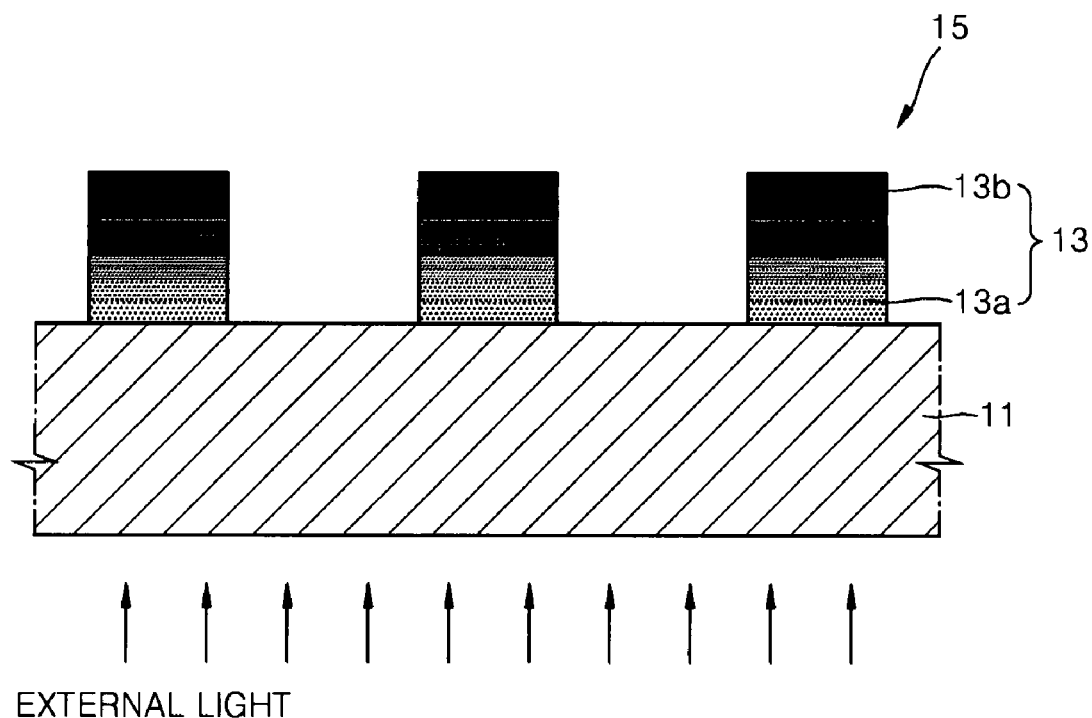
FIG. 4 is a partial sectional view illustrating a modified embodiment of the polarizer illustrated in FIG. 2.
Figure 5:
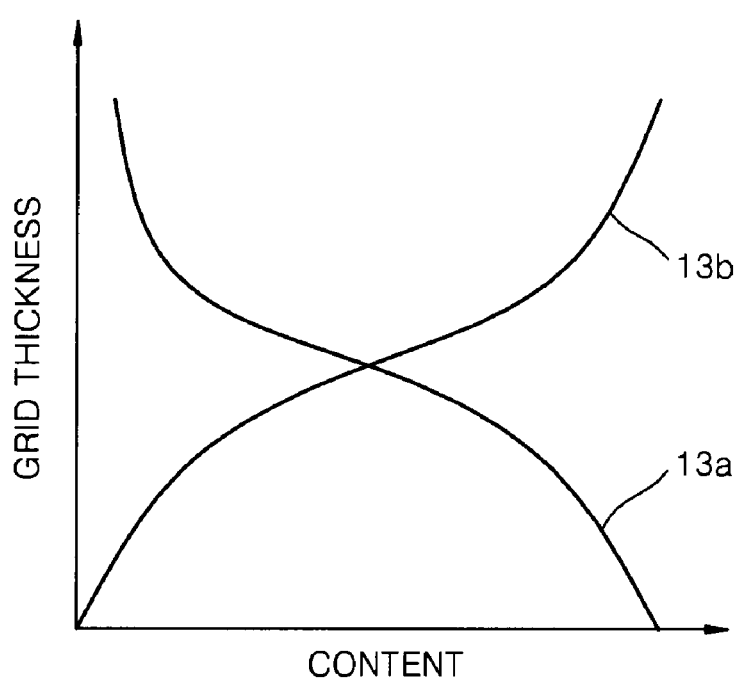
FIG. 5 is a graph illustrating the content (i.e., concentration) of a first component and a second component along the thickness direction of grids in the polarizer of FIG. 4.

FIG. 4 is a partial sectional view illustrating a modified embodiment of the polarizer illustrated in FIG. 2, and FIG. 5 is a graph illustrating the content (i.e., concentration) of a first component and a second component along the thickness direction of grids in the polarizer of FIG. 4. As can be seen in FIG. 5, from one end to the other end of the grids in the thickness direction, the respective concentrations of the first and second components are varied. Hereinafter, matters different from the previous embodiment will be mainly described. The same reference numerals refer to the same constitutional elements.

Referring to FIGS. 4 and 5, a polarizer 15 includes a base 11 and a plurality of grids 13. The grids 13 include a first component 13a and a second component 13b which have a concentration gradient in the thickness direction of the grids 13. External light is incident on the bottom part of FIG. 4, i.e., on the base 11. Along a thickness direction of the grids 12 toward the base 11, the content (i.e., concentration) of the first component 13a including a dielectric material increases. Along a thickness direction of the grids 12 away from the base 11, the content (i.e., concentration) of the second component 13b increases. That is, as it becomes closer to the base 11, the ratio of a transparent material to an opaque metal in the grids 13 is gradually increased. Therefore, the grids 13 can reduce or prevent an interfacial reflection that may be caused by a refractive index difference. Thus, when external light is incident on the grids 13, the grids 13 absorb the external light, thereby reducing or preventing the reflection of the external light. The structure, formation method, and effects of the grids 13 are as described above with reference to FIG. 2, and thus, descriptions thereof will be omitted.

A polarizer according to exemplary embodiments of the present invention can be applied in flat panel display apparatuses, e.g., organic light-emitting display apparatuses. Throughout the specification, the present invention will be described in terms of organic light-emitting display apparatuses. In organic light-emitting display apparatuses according to exemplary embodiments of the present invention, a linear polarization layer including a plurality of grids is directly formed on a substrate, a sealing member, or the like, instead of separately using a base. Grids of a linear polarization layer as will be described later are the same as the above-described grids of the polarizers, and thus, detailed descriptions about the structures, materials, and formation methods of the grids will be omitted.

Figure 6:
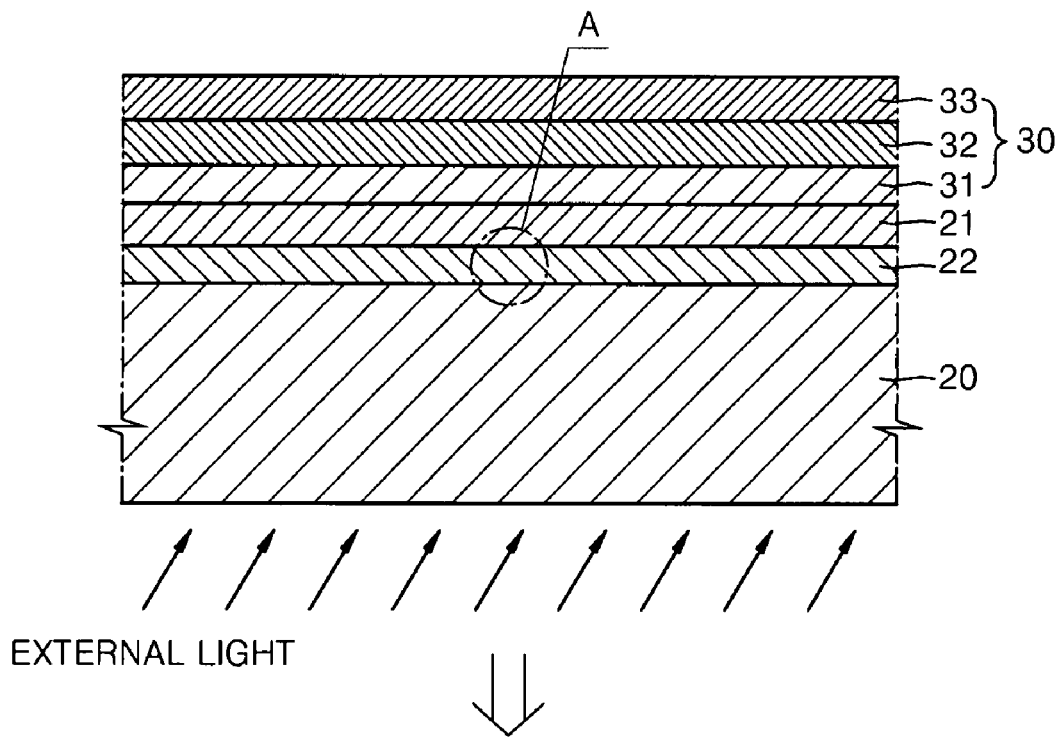
FIGS. 6, 8, and 10 are schematic sectional views illustrating bottom emission type organic light-emitting display apparatuses according to embodiments of the present invention.

FIG. 6 is a schematic sectional view illustrating a bottom emission type organic light-emitting display apparatus according to an embodiment of the present invention. Referring to FIG. 6, the organic light-emitting display apparatus includes a substrate 20 formed of a transparent material; and a linear polarization layer 22, a ¼ wavelength retardation layer 21, an organic light-emitting device 30, and a sealing member (not shown) which are sequentially disposed on the substrate 20.

The substrate 20 may be formed of a transparent glass material including $SiO_2$ as a main component. Although not shown, a buffer layer may be further disposed on the substrate 20 to make the substrate 20 smooth and to reduce or prevent the penetration of impurity elements. The buffer layer may be formed of $SiO_2$ and/or SiNx, or the like. A material for the substrate 20 is not limited to the above examples and may also be a transparent plastic material.

Figure 7:
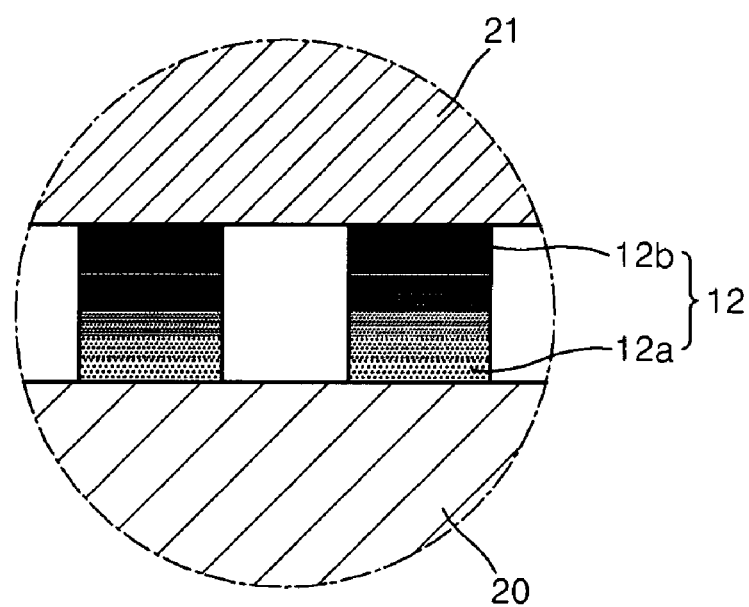
FIGS. 7, 9, and 11 are enlarged sectional views illustrating linear polarization layers of the organic light-emitting display apparatuses of FIGS. 6, 8, and 10, respectively.

The linear polarization layer 22 is disposed on the substrate 20. FIG. 7 is an enlarged view of a part A of FIG. 6 and specifically illustrates the structure of the linear polarization layer 22. The linear polarization layer 22 includes a plurality of grids 12. The grids 12 include a first component 12a and a second component 12b which have a concentration gradient in the thickness direction of the grids 12. The first component 12a includes a dielectric material and the second component 12b includes a metal. External light is incident on the substrate 20. The content (i.e., concentration) of the first component 12a increases along a thickness direction toward the substrate 20, and the content (i.e., concentration) of the second component 12b increases along a thickness direction toward the ¼ wavelength retardation layer 21. That is, as it becomes closer to the substrate 20, the ratio of a transparent material to an opaque metal in the grids 12 is gradually increased. Therefore, the grids 12 can reduce or prevent an interfacial reflection that may be caused by a refractive index difference. Thus, when external light is incident on the grids 12, the grids 12 absorb the external light, thereby reducing or preventing the reflection of the external light, resulting in better contrast. The detailed structure, formation method, and effects of the grids 12 are as described above with reference to FIGS. 1 through 5, and thus, descriptions thereof will be omitted.

The ¼ wavelength retardation layer 21 is disposed on the linear polarization layer 22. The ¼ wavelength retardation layer 21 may be formed by oblique deposition using an inorganic material. In this case, fine columns obliquely extend from a surface of the linear polarization layer 22. The oblique direction of the columns corresponds to a crystal growing direction. When depositing an inorganic material, the inorganic material is grown in a cylindrical shape. Thus, in the oblique deposition of the inorganic material, the cylindrical structures are slanted at an angle (e.g., a predetermined angle) with respect to a horizontal direction, thereby imparting a birefringence property to the ¼ wavelength retardation layer 21. The ¼ wavelength retardation layer 21 may be formed of an inorganic material, e.g., $TiO2$, TaOx, or the like. When using CaO or BaO, the ¼ wavelength retardation layer 21 can also have a moisture absorbing property.

The organic light-emitting device 30 is disposed on the ¼ wavelength retardation layer 21. The linear polarization layer 22 and the ¼ wavelength retardation layer 21 are stacked in such a manner that the linear polarization layer 22 is disposed closer than the ¼ wavelength retardation layer 21 to the external light incidence side. A transparent member may be interposed between the linear polarization layer 22 and the ¼ wavelength retardation layer 21.

The organic light-emitting device 30 includes first and second electrodes 31 and 33 facing each other and an organic light-emitting layer 32. The first electrode 31 may be formed of a transparent conductive material, e.g., ITO, IZO, $In_2O_3$, or ZnO. The first electrode 31 may be patterned by photolithography. In passive matrix (PM) organic light-emitting display apparatuses, the patterns of the first electrode 31 may be stripe-shaped lines that are separated from each other (e.g., by a predetermined distance). In active matrix (AM) organic light-emitting display apparatuses, the patterns of the first electrode 31 may be formed to correspond to pixels. The second electrode 33 is disposed on the first electrode 31. The second electrode 33 may be a reflective electrode and may be formed of aluminum, silver, and/or calcium. The second electrode 33 may be connected to an external terminal (not shown) so as to be used as a cathode. In PM organic light-emitting display apparatuses, the second electrode 33 may be formed as stripes that are orthogonal to the patterns of the first electrode 31. In AM organic light-emitting display apparatuses, the second electrode 33 may be formed over the entire active region for displaying images. The first electrode 31 and the second electrode 33 may also be used as a cathode and an anode, respectively.

The organic light-emitting layer 32 interposed between the first electrode 31 and the second electrode 33 emits light when the first electrode 31 and the second electrode 33 are electrically operated. In other words, the organic light-emitting layer 32 emits light when a current flows between the first electrode 31 and the second electrode 33. The organic light-emitting layer 32 may be formed of a low molecular weight organic material or a polymer organic material. When the organic light-emitting layer 32 is formed of a low molecular weight organic material, a hole transport layer, a hole injection layer, etc. may be stacked on a surface of the organic light-emitting layer 32 facing the first electrode 31, and an electron transport layer, an electron injection layer, etc. may be stacked on the other surface of the organic light-emitting layer 32 facing the second electrode 33. In addition, if necessary, various layers can be stacked. An available low molecular weight organic material may be copper phthalocyanine (CuPc), N,N'-di(naphthalene-1-yl)-N,N'-diphenyl-benzidine (NPB), tris-8-hydroxyquinoline aluminum (Alq3), or the like.

When the organic light-emitting layer 32 is formed of a polymer organic material, only a hole transport layer (HTL) may be disposed on a surface of the organic light-emitting layer 32 facing the first electrode 31. Here, the hole transport layer may be formed on the first electrode 31 by inkjet printing or spin coating using poly-(2,4)-ethylene-dihydroxy thiophene (PEDOT), polyaniline (PANI) or the like. The organic light-emitting layer 32 may be formed of PPV, soluble PPV's, cyano-PPV, polyfluorene, or the like, and may be color-patterned using a method commonly known in the art, e.g., inkjet printing, spin coating, or laser-assisted thermal transfer.

In the current embodiment of the present invention, light emitted from the organic light-emitting device 30 exits in the direction of the substrate 20, as illustrated in FIG. 6. A viewer can observe images on the bottom part of FIG. 6, i.e., on a lower surface of the substrate 20. In a conventional bottom emission type organic light-emitting display apparatus, when external light (e.g., sunlight) is incident on a substrate, contrast can be reduced. However, according to the current embodiment of the present invention, the linear polarization layer 22 and the ¼ wavelength retardation layer 21 constitute a circular polarizer, thus reducing or minimizing the reflection of external light. Among external light incident on a lower surface of the substrate 20, light components parallel to the absorption axis of the linear polarization layer 22 are absorbed in the linear polarization layer 22, and light components parallel to the transmission axis of the linear polarization layer 22 are transmitted through the linear polarization layer 22. The light components parallel to the transmission axis of the linear polarization layer 22 are converted to circularly polarized light rotating in one direction while passing through the ¼ wavelength retardation layer 21. The circularly polarized light is reflected from the second electrode 33 of the organic light-emitting device 30. At this time, the circularly polarized light rotating in one direction is converted to circularly polarized light rotating in the opposite direction. The circularly polarized light rotating in the opposite direction is converted to linearly polarized light orthogonal to the transmission axis of the linear polarization layer 22 while passing through the ¼ wavelength retardation layer 21. The linearly polarized light is absorbed along the absorption axis of the linear polarization layer 22 so that it is not emitted from the lower surface of the substrate 20. Therefore, the reflection of external light is reduced or minimized, thereby resulting in better contrast.

As described above, the linear polarization layer 22 include the plurality of the grids 12. The grids 12 include the first component 12a and the second component 12b which have a concentration gradient in the thickness direction of the grids 12. When external light incident on the substrate 20 reaches the linear polarization layer 22, the reflection of the external light on the grids 12 is reduced or minimized, thereby ensuring better contrast.

In one embodiment, the linear polarization layer 22 and the ¼ wavelength retardation layer 21 are directly formed on the substrate 20. Thus, there is no need to use an adhesive layer or the like, thereby producing a thin organic light-emitting display apparatus. Moreover, an image realized from a light-emitting layer is not transmitted through an adhesive layer, thereby enhancing brightness.

The linear polarization layer 22 and the ¼ wavelength retardation layer 21 can be formed using various methods. The construction of the linear polarization layer 22 and the ¼ wavelength retardation layer 21 can be applied to top emission type organic light-emitting display apparatuses as modified in consideration of the incident direction of external light, as well as to bottom emission type organic light-emitting display apparatuses as described above.

Figure 8:
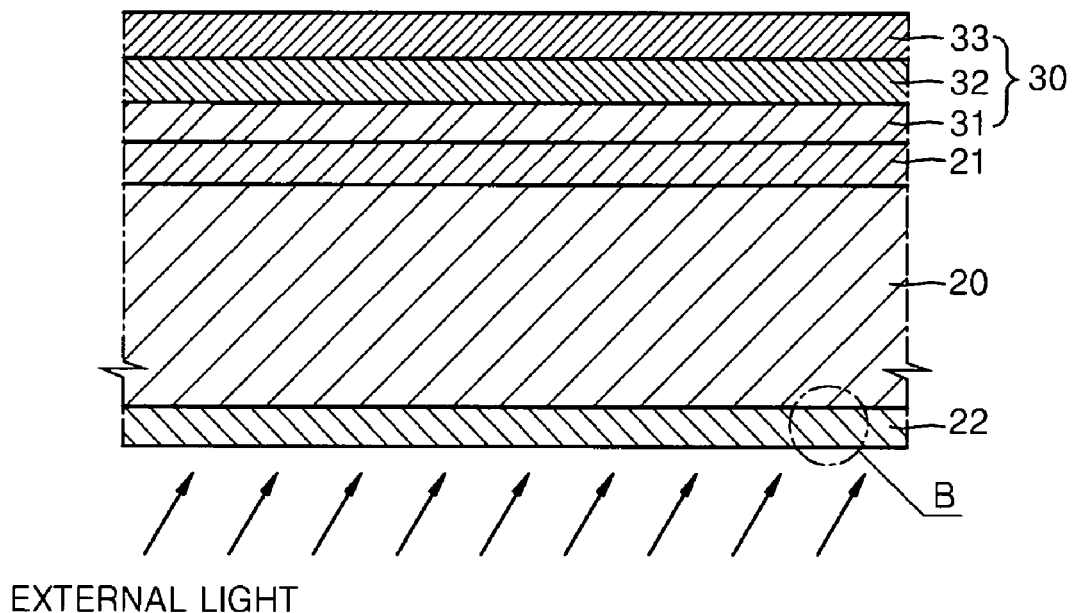
Figure 9:
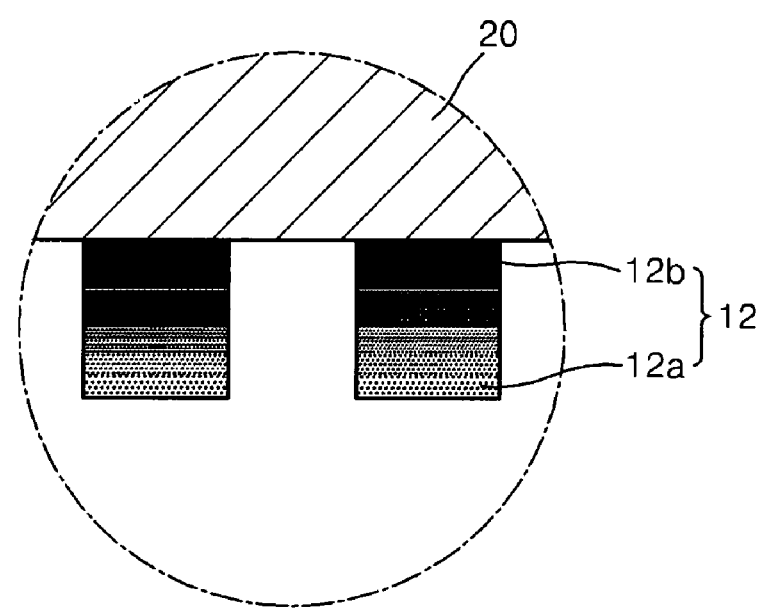

FIG. 8 is a sectional view illustrating a bottom emission type organic light-emitting display apparatus according to another embodiment of the present invention. Referring to FIG. 8, a linear polarization layer 22 is disposed on a surface of a substrate 20 facing external light, and a ¼ wavelength retardation layer 21 is disposed on the other surface of the substrate 20. An organic light-emitting device 30 is disposed on the ¼ wavelength retardation layer 21. A detailed structure of the linear polarization layer 22 is illustrated in FIG. 9 which is an enlarged view of a part B of FIG. 8. The linear polarization layer 22 includes a plurality of grids 12. The grids 12 include a first component 12a and a second component 12b which have a concentration gradient in the thickness direction of the grids 12. The first component 12a includes a dielectric material, and the second component 12b includes a metal. The content (i.e., concentration) of the first component 12a increases along a thickness direction away from the substrate 20, and the content (i.e., concentration) of the second component 12b increases along a thickness direction toward the substrate 20. That is, as it becomes closer to the substrate 20, the ratio of an opaque metal to a transparent material in the grids 12 is gradually increased. Therefore, the grids 12 can reduce or prevent an interfacial reflection that may be caused by a refractive index difference. Thus, when external light is incident on the grids 12, the grids 12 absorb the external light, thereby reducing or preventing the reflection of the external light, resulting in better contrast. The detailed structure, formation method, and effects of the grids 12 are as described above with reference to FIGS. 1 through 5, and thus, descriptions thereof will be omitted.

Like in the previous embodiment, in the current embodiment of the present invention, external light incident on an outer side of the substrate 20 is converted to a linearly polarized light parallel to the transmission axis of the linear polarization layer 22 while passing through the linear polarization layer 22. While passing through the ¼ wavelength retardation layer 21 via the substrate 20, the linearly polarized light is converted to a circularly polarized light rotating in one direction. The circularly polarized light is reflected from the second electrode 33 and is then converted to a circularly polarized light rotating in the opposite direction. The circularly polarized light rotating in the opposite direction is converted to a linearly polarized light orthogonal to the transmission axis of the linear polarization layer 22 while passing through the ¼ wavelength retardation layer 21. The linearly polarized light cannot be transmitted through the linear polarization layer 22, and thus, the reflected light cannot be viewed from a lower surface of the substrate 20, thereby resulting in better contrast due to a reduction in external light reflection. As described above, the linear polarization layer 22 includes the plurality of the grids 12, and the grids 12 include the first component 12a and the second component 12b which have a concentration gradient in the thickness direction of the grids 12. When an incident external light reaches the linear polarization layer 22, reflection of the external light on the grids 12 is reduced or minimized, thereby ensuring better contrast.

Figure 10:
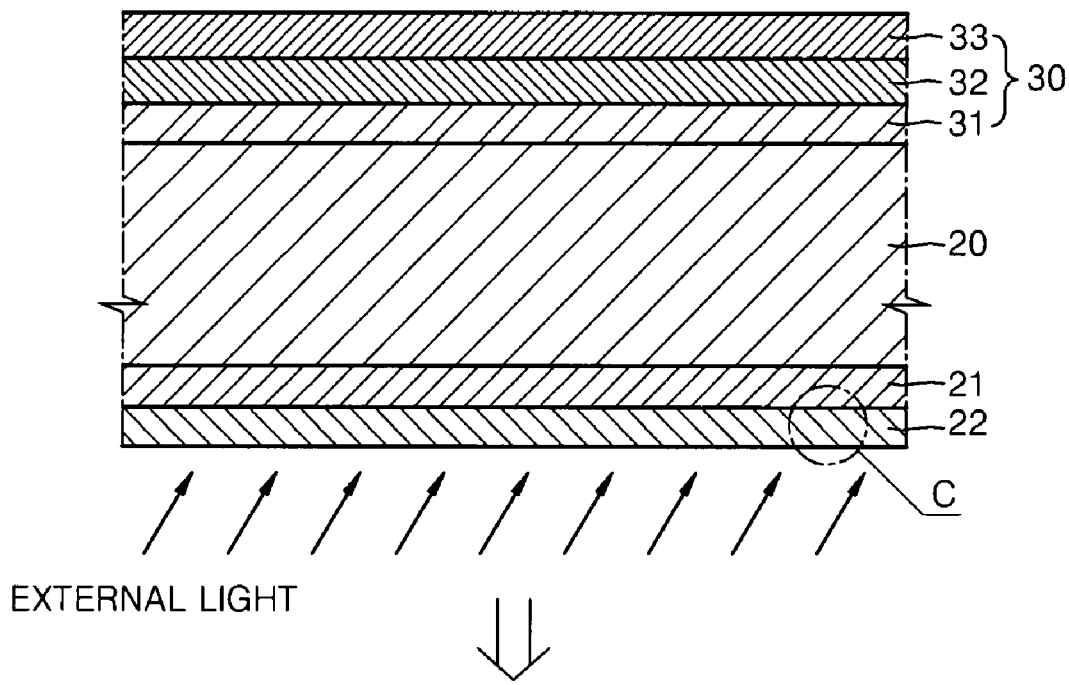

FIG. 10 is a sectional view illustrating a bottom emission type organic light-emitting display apparatus according to another embodiment of the present invention. Referring to FIG. 10, a ¼ wavelength retardation layer 21 and a linear polarization layer 22 are sequentially stacked on a surface of a substrate 20 facing external light, and an organic light-emitting device 30 is disposed on the other surface of the substrate 20. These constitutional elements are as described above.

Figure 11:
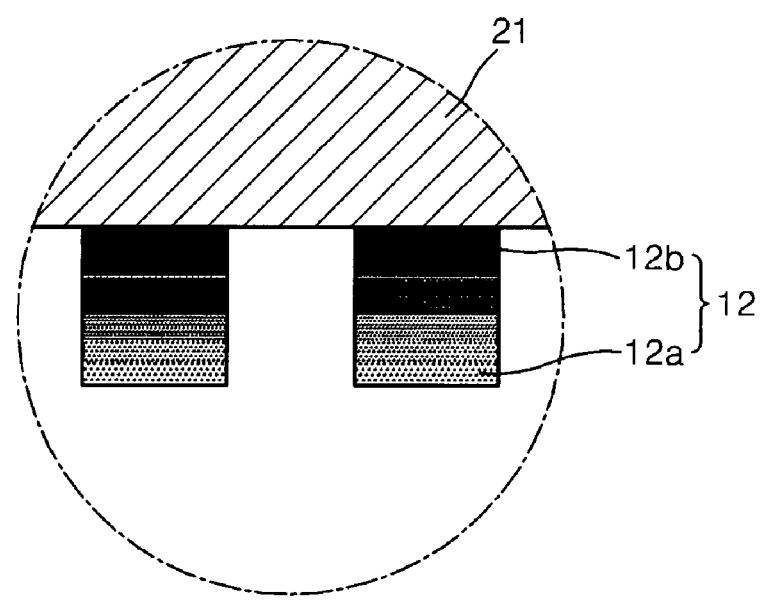

A detailed structure of the linear polarization layer 22 is illustrated in FIG. 11 which is an enlarged view of a part C of FIG. 10. The linear polarization layer 22 includes a plurality of grids 12. The grids 12 are disposed on a lower surface of the ¼ wavelength retardation layer 21. The grids 12 include a first component 12a and a second component 12b which have a concentration gradient in the thickness direction of the grids 12. The content (i.e., concentration) of the first component 12a increases along a thickness direction away from the ¼ wavelength retardation layer 21, and the content (i.e., concentration) of the second component 12b increases along a thickness direction toward the ¼ wavelength retardation layer 21. When an incident external light reaches the linear polarization layer 22, the reflection of the external light on the grids 12 is reduced or minimized, thereby ensuring better contrast.

Hitherto, exemplary embodiments of the present invention have been illustrated in terms of bottom emission type organic light-emitting display apparatuses for displaying images on a substrate side, but is not limited thereto. The present invention can also be applied to top emission type organic light-emitting display apparatuses for displaying images on an opposite side to a substrate.

Figure 12:
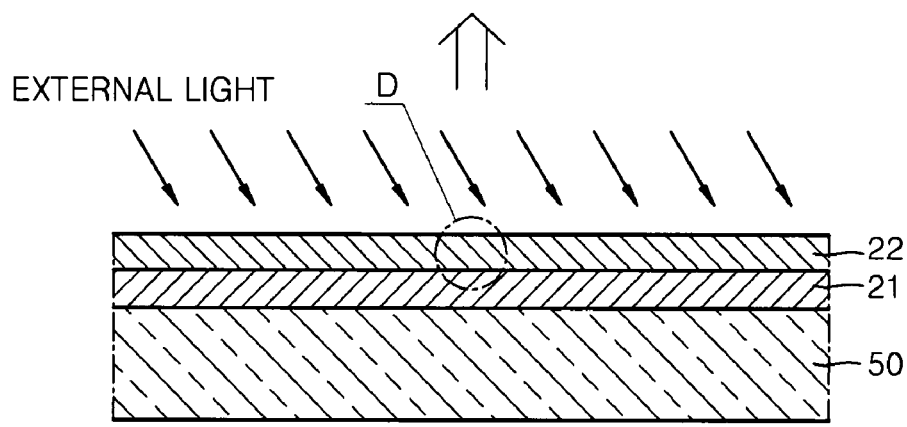
FIGS. 12, 14, 16, 18, and 21 are schematic sectional views illustrating top emission type organic light-emitting display apparatuses according to embodiments of the present invention.
Figure 12:
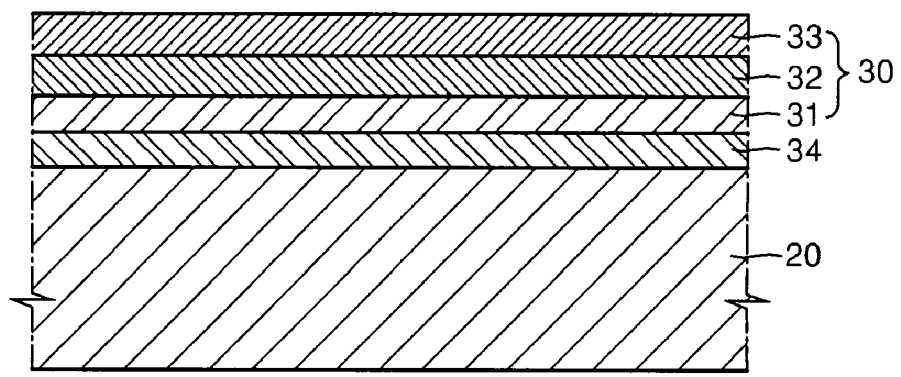

FIG. 12 is a sectional view illustrating a top emission type organic light-emitting display apparatus according to an embodiment of the present invention. Referring to FIG. 12, the organic light-emitting display apparatus includes a substrate 20; and a reflective layer 34, an organic light-emitting device 30, and a sealing member 50 which are disposed on the substrate 20.

The substrate 20 may be a transparent glass substrate as described above, but does not necessarily require a transparent property. Moreover, the substrate 20 may also be formed of plastic or metal in order to have a flexible property. When forming the substrate 20 using a metal, an insulating layer is further disposed on a surface of a metal layer.

The reflective layer 34 disposed on a surface of the substrate 20 may be formed of Ag, Mg, Al, Pt, Pd, Au, Ni, Nd, Ir, Cr, or a compound thereof. A first electrode 31 may be formed on the reflective layer 34 using a material having a high work function, e.g., ITO, IZO, ZnO, or $In_2O_3$. The first electrode 31 is used as an anode. If the first electrode 31 is used as a cathode, the first electrode 31 may be formed of Ag, Mg, Al, Pt, Pd, Au, Ni, Nd, Ir, Cr, or a compound thereof, so that the first electrode 31 can be used both as a cathode and a reflective layer. Hereinafter, the present invention will be described in terms of use of the first electrode 31 as an anode.

A second electrode 33 is formed as a transmissive electrode. The second electrode 33 may be formed as a thin translucent film using a material having a low work function, e.g., Li, Ca, LiF/Al, Al, Mg, or Ag. Of course, a transparent conductor, e.g., ITO, IZO, ZnO, or $In_2O_3$ may be disposed on the translucent film in order to solve a high resistance problem due to a decreased thickness. An organic light-emitting layer 32 interposed between the first electrode 31 and the second electrode 33 is as described above.

The sealing member 50 for sealing the organic light-emitting device 30 is disposed on the organic light-emitting device 30. The sealing member 50 protects the organic light-emitting device 30 from external moisture or oxygen and is formed of a transparent material. For this, the sealing member 50 may be a glass substrate, a plastic substrate, or a multi-layered structure including an organic material and an inorganic material.

Figure 13:
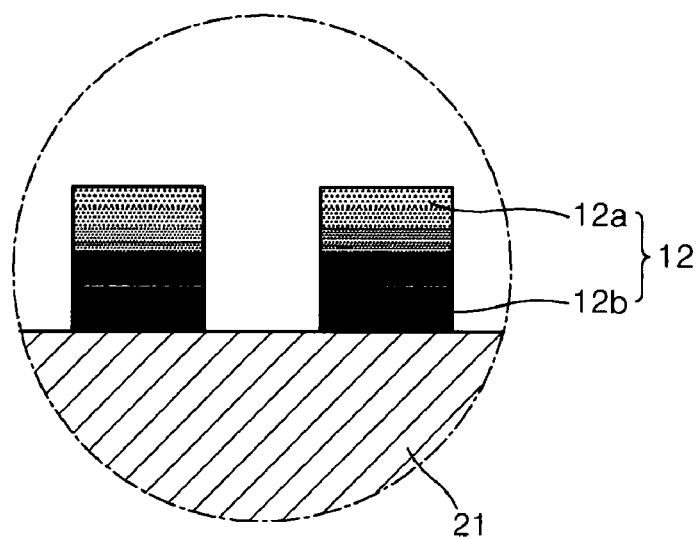
FIGS. 13, 15, 17, 19, and 22 are enlarged sectional views illustrating linear polarization layers of the organic light-emitting display apparatuses of FIGS. 12, 14, 16, 18, and 21, respectively.

A ¼ wavelength retardation layer 21 and a linear polarization layer 22 are sequentially stacked on an upper surface of the sealing member 50, i.e., on a surface of the sealing member 50 opposite to the organic light-emitting device 30. The structure of the linear polarization layer 22 is specifically illustrated in FIG. 13 which is an enlarged view of a part D of FIG. 12. A plurality of grids 12 are disposed on the ¼ wavelength retardation layer 21. A first component 12a includes a dielectric material, and a second component 12b includes a metal. The content (i.e., concentration) of the first component 12a increases along a thickness direction away from the ¼ wavelength retardation layer 21, and the content (i.e., concentration) of the second component 12b increases along a thickness direction toward the ¼ wavelength retardation layer 21. That is, as it becomes closer to the ¼ wavelength retardation layer 21, the ratio of an opaque metal to a transparent material in the grids 12 is gradually increased. Therefore, the grids 12 can reduce or prevent an interfacial reflection that may be caused by a refractive index difference. Thus, when external light is incident on the grids 12, the grids 12 absorb the external light, thereby reducing or preventing the reflection of the external light, resulting in better contrast. The detailed structure, formation method, and effects of the grids 12 are as described above with reference to FIGS. 1 through 5, and thus, descriptions thereof will be omitted.

According to the current embodiment of the present invention, when external light incident on an image display side, i.e., external light incident on the top part of FIG. 12 sequentially pass through the linear polarization layer 22 and the ¼ wavelength retardation layer 21 and is then reflected from a surface of the reflective layer 34, the reflected light cannot be transmitted through the linear polarization layer 22. The principle is as described above.

The grids 12 reduce or minimize the reflection of external light, thereby ensuring better contrast.

Figure 14:
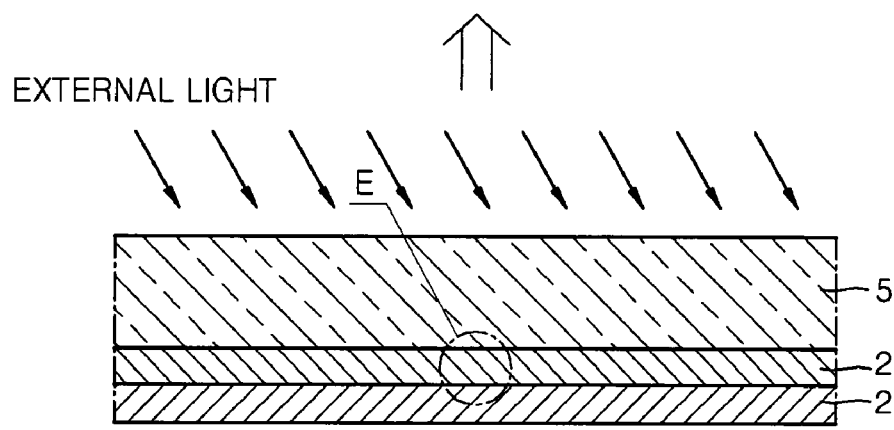
Figure 15:
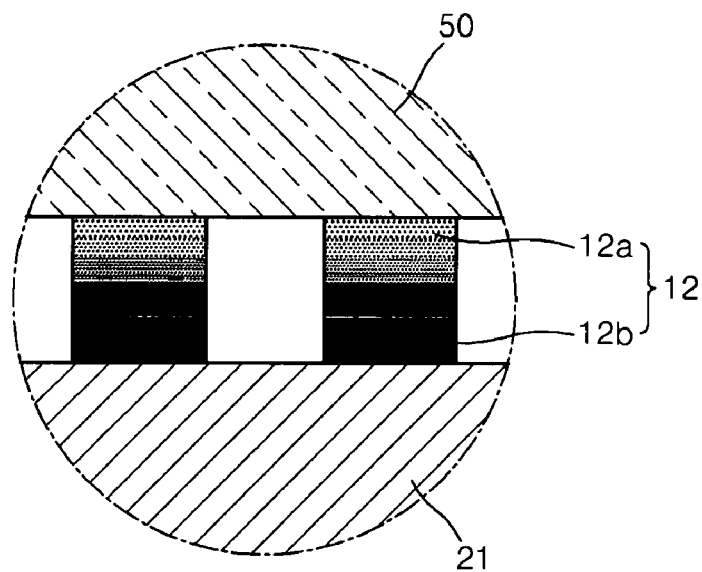

FIG. 14 is a sectional view illustrating a top emission type organic light-emitting display apparatus according to another embodiment of the present invention. Referring to FIG. 14, a linear polarization layer 22 and a ¼ wavelength retardation layer 21 are sequentially stacked on a surface of a sealing member 50 facing an organic light-emitting device 30. The structure of the linear polarization layer 22 is specifically illustrated in FIG. 15 which is an enlarged view of a part E of FIG. 14. A plurality of grids 12 are disposed on a lower surface of the sealing member 50. The grids 12 include a first component 12a and a second component 12b which have a concentration gradient in the thickness direction of the grids 12. The first component 12a includes a dielectric material and the second component 12b includes a metal. The content (i.e., concentration) of the first component 12a increases along a thickness direction toward the sealing member 50, and the content (i.e., concentration) of the second component 12b increases along a thickness direction toward the ¼ wavelength retardation layer 21. That is, as it becomes closer to the sealing member 50, the ratio of a transparent material to an opaque metal in the grids 12 is gradually increased. Therefore, the grids 12 can reduce or prevent an interfacial reflection that may be caused by a refractive index difference. Thus, when external light is incident on the grids 12, the grids 12 absorb the external light, thereby reducing or preventing the reflection of the external light, resulting in better contrast. The detailed structure, formation method, and effects of the grids 12 are as described above with reference to FIGS. 1 through 5, and thus, descriptions thereof will be omitted.

Figure 16:
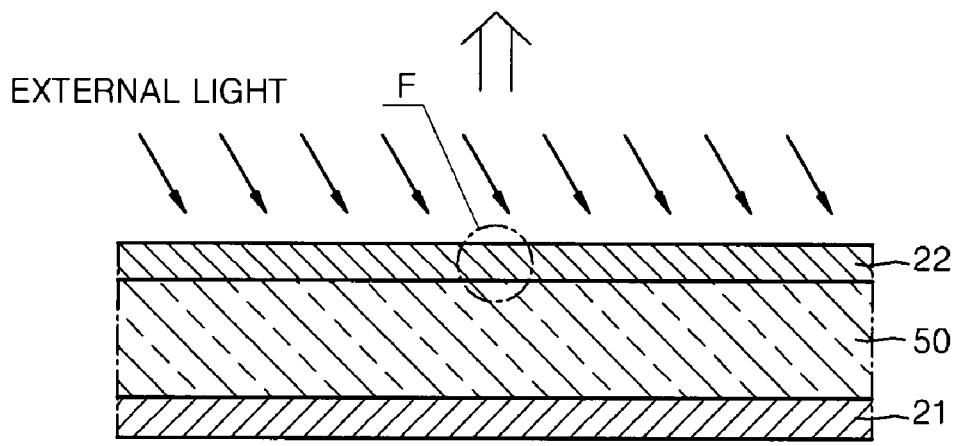
Figure 17:
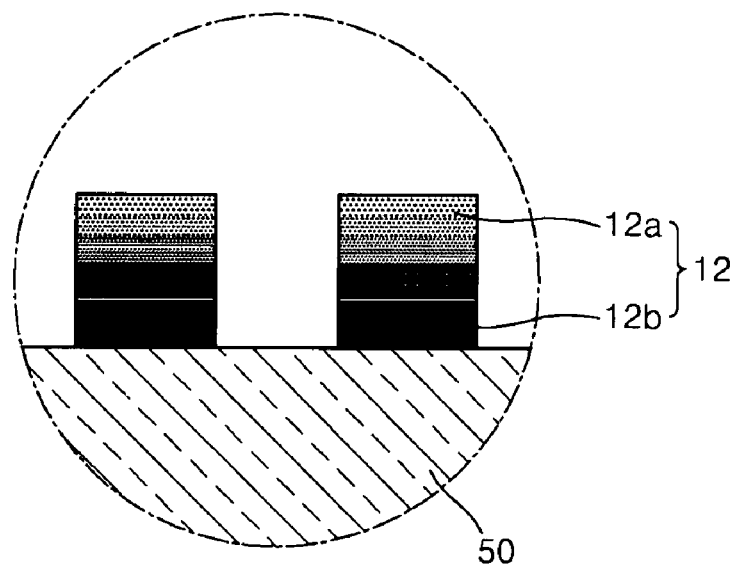

FIG. 16 is a sectional view illustrating a top emission type organic light-emitting display apparatus according to another embodiment of the present invention. Referring to FIG. 16, a linear polarization layer 22 is disposed on a surface of a sealing member 50 facing external light, and a ¼ wavelength retardation layer 21 is disposed on the other surface of the sealing member 50 facing an organic light-emitting device 30. The structure of the linear polarization layer 22 is specifically illustrated in FIG. 17 which is an enlarged view of a part F of FIG. 16. A plurality of grids 12 are disposed on an upper surface of the sealing member 50. The grids 12 include a first component 12a and a second component 12b which have a concentration gradient in the thickness direction of the grids 12. The first component 12a includes a dielectric material and the second component 12b includes a metal. The content (i.e., concentration) of the first component 12a increases along a thickness direction away from the sealing member 50, and the content (i.e., concentration) of the second component 12b increases along a thickness direction toward the sealing member 50. That is, as it becomes closer to the sealing member 50, the ratio of an opaque metal to a transparent material in the grids 12 is gradually increased. The detailed structure, formation method, and effects of the grids 12 are as described above, and thus, descriptions thereof will be omitted.

Figure 18:
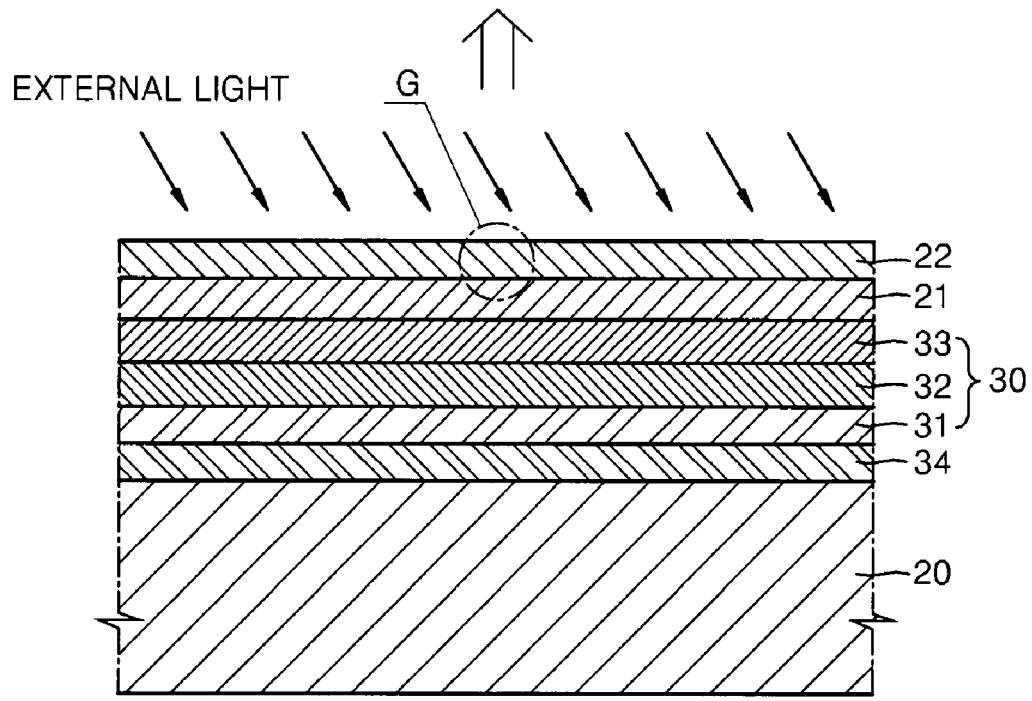
Figure 19:
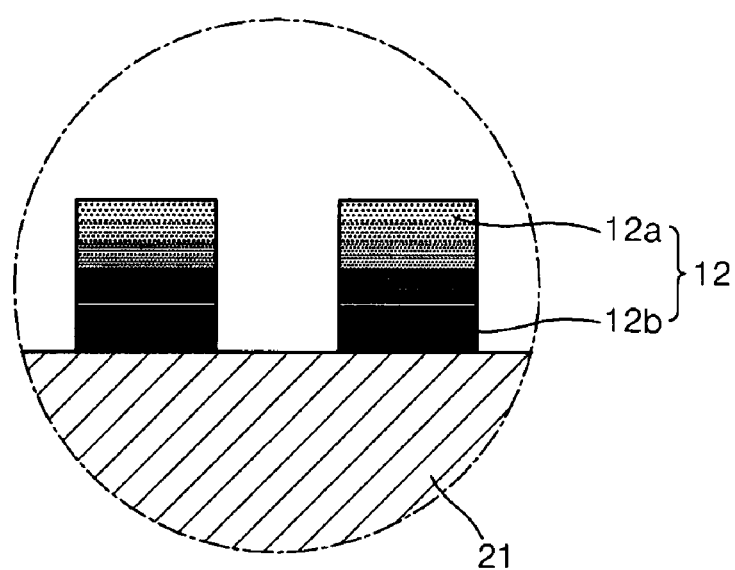

FIG. 18 is a sectional view illustrating a top emission type organic light-emitting display apparatus according to another embodiment of the present invention. Referring to FIG. 18, a reflective layer 34 is disposed on a substrate 20, an organic light-emitting device 30 is disposed on the reflective layer 34, a ¼ wavelength retardation layer 21 is disposed on the organic light-emitting device 30, and a linear polarization layer 22 is disposed on the ¼ wavelength retardation layer 21. The structure of the linear polarization layer 22 is specifically illustrated in FIG. 19 which is an enlarged view of a part G of FIG. 18. A plurality of grids 12 are disposed on the ¼ wavelength retardation layer 21.

The grids 12 include a first component 12a and a second component 12b which have a concentration gradient in the thickness direction of the grids 12. The first component 12a includes a dielectric material and the second component 12b includes a metal. The content (i.e., concentration) of the first component 12a increases along a thickness direction away from the ¼ wavelength retardation layer 21, and the content (i.e., concentration) of the second component 12b increases along a thickness direction toward the ¼ wavelength retardation layer 21. That is, as it becomes closer to the ¼ wavelength retardation layer 21, the ratio of an opaque metal to a transparent material in the grids 12 is gradually increased. The detailed structure, formation method, and effects of the grids 12 are as described above, and thus, descriptions thereof will be omitted.

Figure 20:
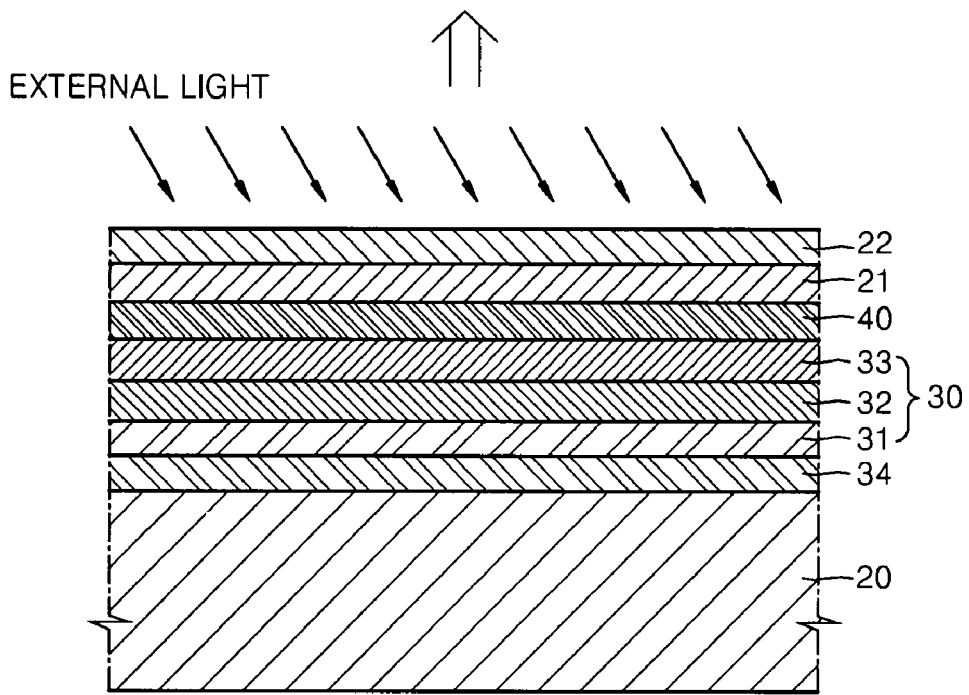
FIG. 20 is a schematic sectional view illustrating a modified embodiment of the top emission type organic light-emitting display apparatus of FIG. 18.

A protective layer may be interposed between a second electrode 33 and the ¼ wavelength retardation layer 21. Referring to FIG. 20, a protective layer 40 is disposed between a second electrode 33 of an organic light-emitting device 30 and a ¼ wavelength retardation layer 21. The structure of FIG. 20 is the same as that of FIG. 18 except the protective layer 40, and thus, only the protective layer 40 will be described. The protective layer 40 serves to reduce or prevent damage to the second electrode 33 which may be caused when forming the ¼ wavelength retardation layer 21. The protective layer 40 is formed of an inorganic material or an organic material. The inorganic material may be metal oxide, metal nitride, metal carbide, metal oxynitride, or a compound thereof. Examples of the metal oxide include silicon oxide, aluminum oxide, titanium oxide, indium oxide, tin oxide, indium tin oxide, and compounds thereof. Examples of the metal nitride include aluminum nitride, silicon nitride, and compounds thereof. The metal carbide may be silicon carbide, and the metal oxynitride may be silicon oxynitride. The inorganic material may also be silicone, or a ceramic derivative of silicone or metal. In addition, diamond-like carbon (DLC) may be used. The organic material may be an organic polymer, an inorganic polymer, an organometallic polymer, a hybrid organic/inorganic polymer, or the like. The organic material may also be an acrylic resin.

Figure 21:
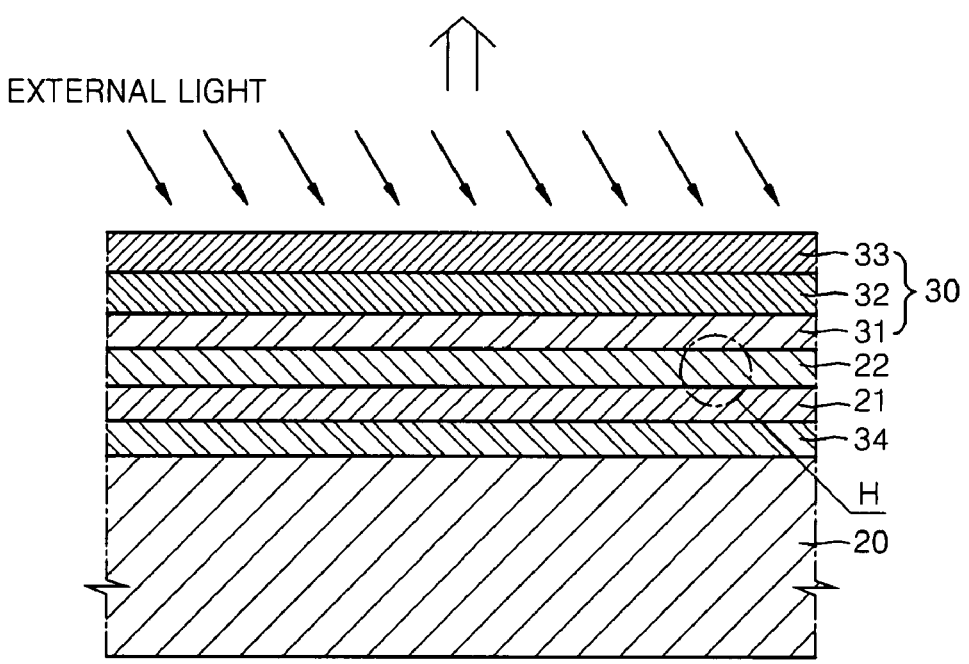
Figure 22:
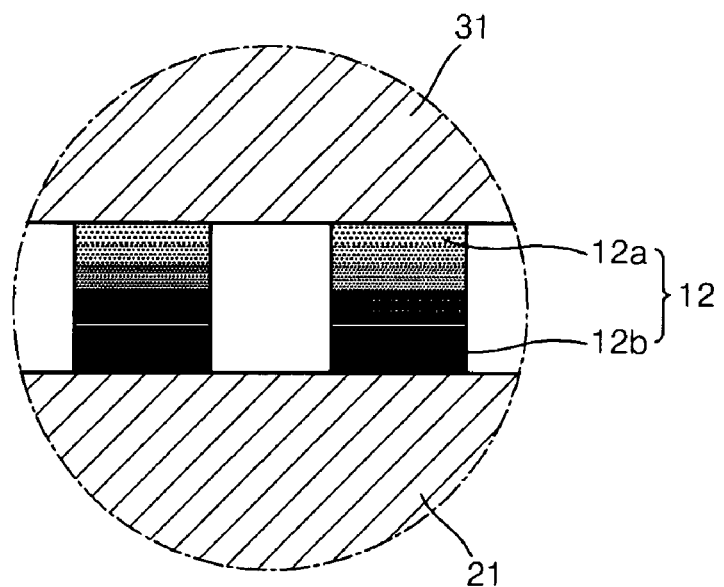

FIG. 21 is a sectional view illustrating a top emission type organic light-emitting display apparatus according to another embodiment of the present invention. Referring to FIG. 21, a ¼ wavelength retardation layer 21 and a linear polarization layer 22 are interposed between a reflective layer 34 and an organic light-emitting device 30. The structure of the linear polarization layer 22 is specifically illustrated in FIG. 22 which is an enlarged view of a part H of FIG. 21. A plurality of grids 12 are disposed on the ¼ wavelength retardation layer 21.

The grids 12 include a first component 12a and a second component 12b which have a concentration gradient in the thickness direction of the grids 12. The first component 12a includes a dielectric material and the second component 12b includes a metal. The content (i.e., concentration) of the first component 12a increases along a thickness direction toward a first electrode 31, and the content (i.e., concentration) of the second component 12b increases along a thickness direction toward the ¼ wavelength retardation layer 21. That is, as it becomes closer to the ¼ wavelength retardation layer 21, the ratio of an opaque metal to a transparent material in the grids 12 is gradually increased. The detailed structure, formation method, and effects of the grids 12 are as described above, and thus, descriptions thereof will be omitted.

Although not shown, the ¼ wavelength retardation layer 21 may be disposed on the reflective layer 34, the organic light-emitting device 30 may be disposed on the ¼ wavelength retardation layer 21, and the linear polarization layer 22 may be disposed on the organic light-emitting device 30.

Figure 23:
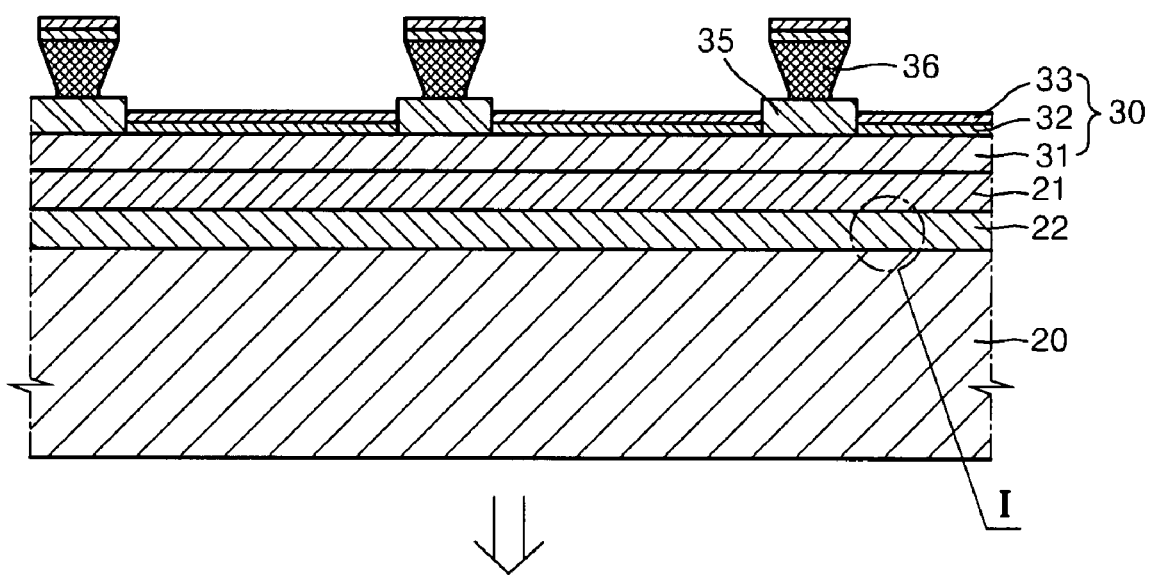
FIG. 23 is a schematic sectional view illustrating a passive matrix (PM) bottom emission type organic light-emitting display apparatus according to an embodiment of the present invention.
Figure 24:
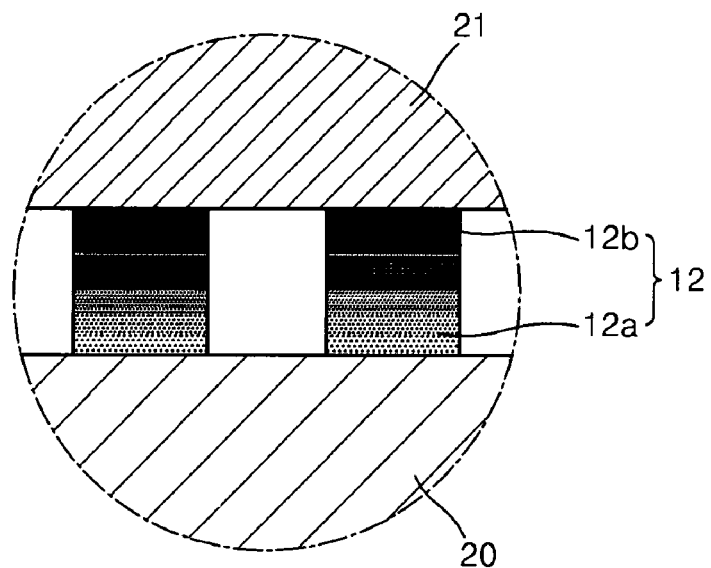
FIG. 24 is an enlarged sectional view illustrating a linear polarization layer of the organic light-emitting display apparatus of FIG. 23.

FIG. 23 is a schematic sectional view illustrating a PM bottom emission type organic light-emitting display apparatus according to an embodiment of the present invention. Referring to FIG. 23, a linear polarization layer 22 and a ¼ wavelength retardation layer 21 are sequentially stacked on a substrate 20, and an organic light-emitting device 30 is disposed on the ¼ wavelength retardation layer 21. A detailed structure of the linear polarization layer 22 is illustrated in FIG. 24 which is an enlarged view of a part I of FIG. 23. A plurality of grids 12 are disposed on the substrate 20. The grids 12 include a first component 12a and a second component 12b which have a concentration gradient in the thickness direction of the grids 12. The first component 12a includes a dielectric material and the second component 12b includes a metal. The content (i.e., concentration) of the first component 12a increases along a thickness direction toward the substrate 20, and the content (i.e., concentration) of the second component 12b increases along a thickness direction toward the ¼ wavelength retardation layer 21. That is, as it becomes closer to the ¼ wavelength retardation layer 21, the ratio of an opaque metal to a transparent material in the grids 12 is gradually increased. The detailed structure, formation method, and effects of the grids 12 are as described above, and thus, descriptions thereof will be omitted.

A first electrode 31 is formed in a stripe pattern on the ¼ wavelength retardation layer 21, and an internal insulator 35 for partitioning the first electrode 31 is disposed on the first electrode 31. A separator 36 orthogonal to the first electrode 31 is disposed on the internal insulator 35 in order to pattern an organic light-emitting layer 32 and a second electrode 33. By the separator 36, the organic light-emitting layer 32 and the second electrode 33 are patterned to cross the first electrode 31. A sealing member (not shown) is disposed on the second electrode 33 in order to protect the organic light-emitting device 30 from the external air. In some cases, the organic light-emitting layer 32 and the second electrode 33 may be patterned in the absence of the separator 36.

In the current embodiment of the present invention, like in the previous embodiments, the linear polarization layer 22 and the ¼ wavelength retardation layer 21 are sequentially stacked on the substrate 20. The linear polarization layer 22 and the ¼ wavelength retardation layer 21 can reduce or prevent the reflection of external light incident on a lower surface of the substrate 20 as viewed in FIG. 23. Moreover, the linear polarization layer 22 and the ¼ wavelength retardation layer 21 can reduce or prevent an interfacial reflection that may be caused by a refractive index difference. Thus, when external light is incident on the grids 12, the grids 12 absorb the external light, thereby reducing or preventing the reflection of the external light.

Although not shown, it should be understood that such a PM bottom emission type display apparatus can include a structure as illustrated in FIG. 8 or 10.

Figure 25:
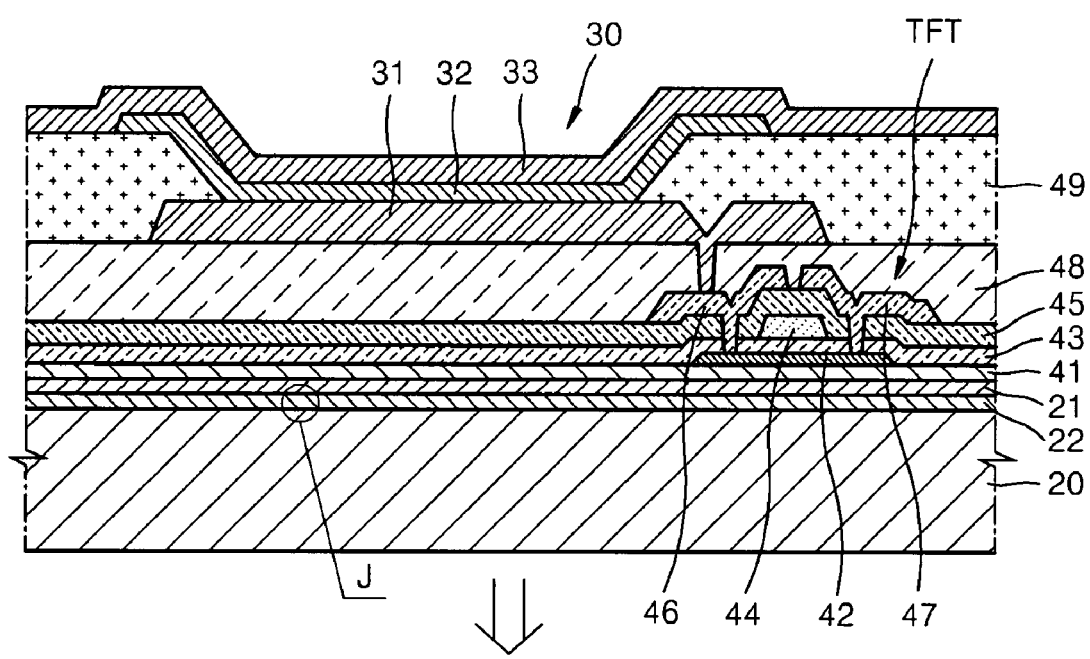
FIG. 25 is a schematic sectional view illustrating an active matrix (AM) bottom emission type organic light-emitting display apparatus according to an embodiment of the present invention.

FIG. 25 is a schematic sectional view illustrating an AM bottom emission type organic light-emitting display apparatus according to an embodiment of the present invention.

Referring to FIG. 25, a thin film transistor TFT is disposed on a substrate 20. At least one thin film transistor TFT is formed in each pixel and is electrically connected to an organic light-emitting device 30.

Figure 26:
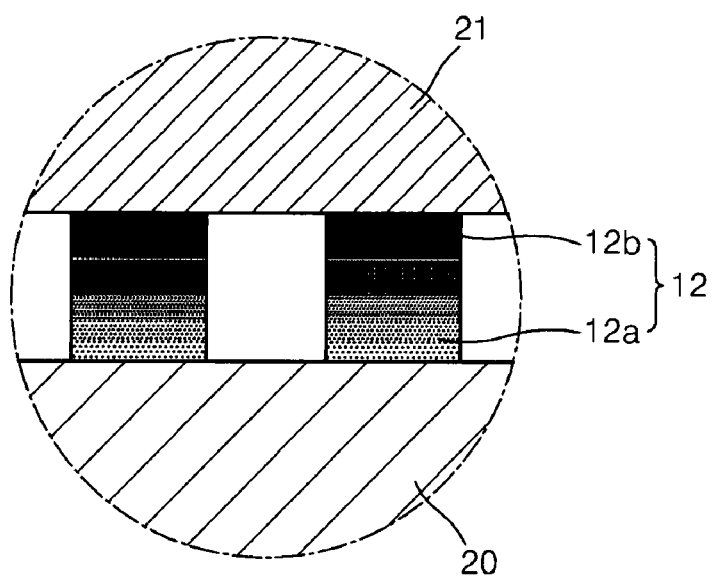
FIG. 26 is an enlarged sectional view illustrating a linear polarization layer of the organic light-emitting display apparatus of FIG. 25.

In detail, a linear polarization layer 22 and a ¼ wavelength retardation layer 21 are sequentially stacked on the substrate 20. The structure of the linear polarization layer 22 is specifically illustrated in FIG. 26 which is an enlarged view of a part J of FIG. 25. A plurality of grids 12 are disposed on the substrate 20. The grids 12 include a first component 12a and a second component 12b which have a concentration gradient in the thickness direction of the grids 12. The first component 12a includes a dielectric material and the second component 12b includes a metal. The content (i.e., concentration) of the first component 12a increases along a thickness direction toward the substrate 20, and the content (i.e., concentration) of the second component 12b increases along a thickness direction toward the ¼ wavelength retardation layer 21. That is, as it becomes closer to the substrate 20, the ratio of a transparent material to an opaque metal in the grids 12 is gradually increased.

A buffer layer 41 is disposed on the ¼ wavelength retardation layer 21, and a semiconductor layer 42 is patterned on the buffer layer 41. A gate insulating layer 43 formed of SiO2, SiNx, or the like is disposed on the semiconductor layer 42, and a gate electrode 44 is disposed on a portion (e.g., a predetermined portion) of the gate insulating layer 43. The gate electrode 44 is connected to a gate line (not shown) for applying a TFT on/off signal. An inter-insulating layer 45 is disposed on the gate electrode 44, and a source electrode 46 and a drain electrode 47 are disposed to respectively contact with source and drain regions of the semiconductor layer 42 via contact holes. The thin film transistor TFT with the above-described structure is covered and protected with a passivation layer 48.

A first electrode 31 serving as an anode is disposed on the passivation layer 48, and is covered with a pixel define layer 49 formed of an insulating material. An opening is formed in the pixel define layer 49, and an organic light-emitting layer 32 is disposed in a region defined by the opening. A second electrode 33 is disposed to cover all pixels.

In the AM structure according to the current embodiment of the present invention, like in the previous embodiments, the linear polarization layer 22 and the ¼ wavelength retardation layer 21 are sequentially stacked on the substrate 20. The linear polarization layer 22 and the ¼ wavelength retardation layer 21 can reduce or prevent the reflection of external light incident on a lower surface of the substrate 20 as viewed in FIG. 25. Moreover, the grids 12 include the first component 12a and the second component 12b which have a concentration gradient, and thus, can reduce or prevent an interfacial reflection that may be caused by a refractive index difference. Thus, when external light is incident on the grids 12, the grids 12 absorb the external light, thereby reducing or preventing the reflection of the external light, resulting in better contrast.

In such an AM bottom emission type organic light-emitting display apparatus, provided that a linear polarization layer is disposed to face external light and a ¼ wavelength retardation layer is disposed to face an organic light-emitting device, the linear polarization layer and the ¼ wavelength retardation layer can be disposed on any surface(s) defined by a substrate, a thin film transistor, and the organic light-emitting device. That is, although not shown, like in FIGS. 6 and 8, after forming a ¼ wavelength retardation layer and/or a linear polarization layer on a surface and/or the other surface of a substrate, a thin film transistor and an organic light-emitting device can be formed on the resultant structure. A ¼ wavelength retardation layer and/or a linear polarization layer can also be disposed at an interface(s) defined by layers constituting a thin film transistor.

Figure 27:
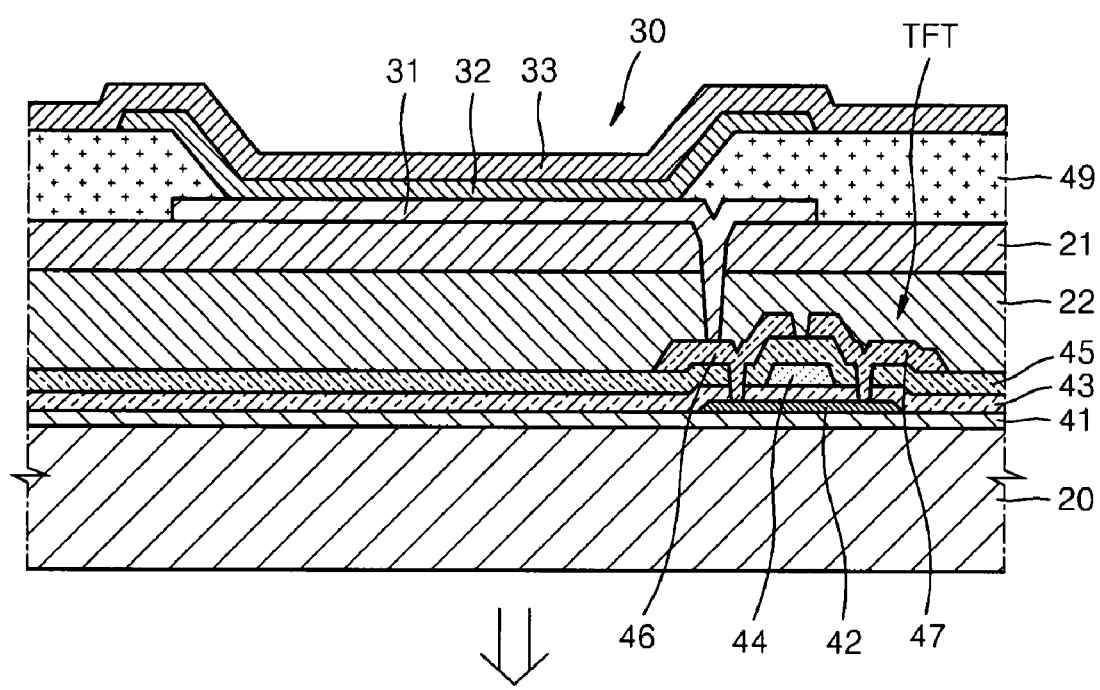
FIG. 27 is a schematic sectional view illustrating an AM bottom emission type organic light-emitting display apparatus according to another embodiment of the present invention.

A linear polarization layer and a ¼ wavelength retardation layer can be used instead of a passivation layer. Referring to FIG. 27, a linear polarization layer 22 and a ¼ wavelength retardation layer 21 are sequentially stacked on an inter-insulating layer 45 instead of forming a passivation layer made of an organic material and/or an inorganic material on a thin film transistor TFT. The structures and effects of other constitutional elements are as described above, and thus, descriptions thereof will be omitted.

Figure 28:
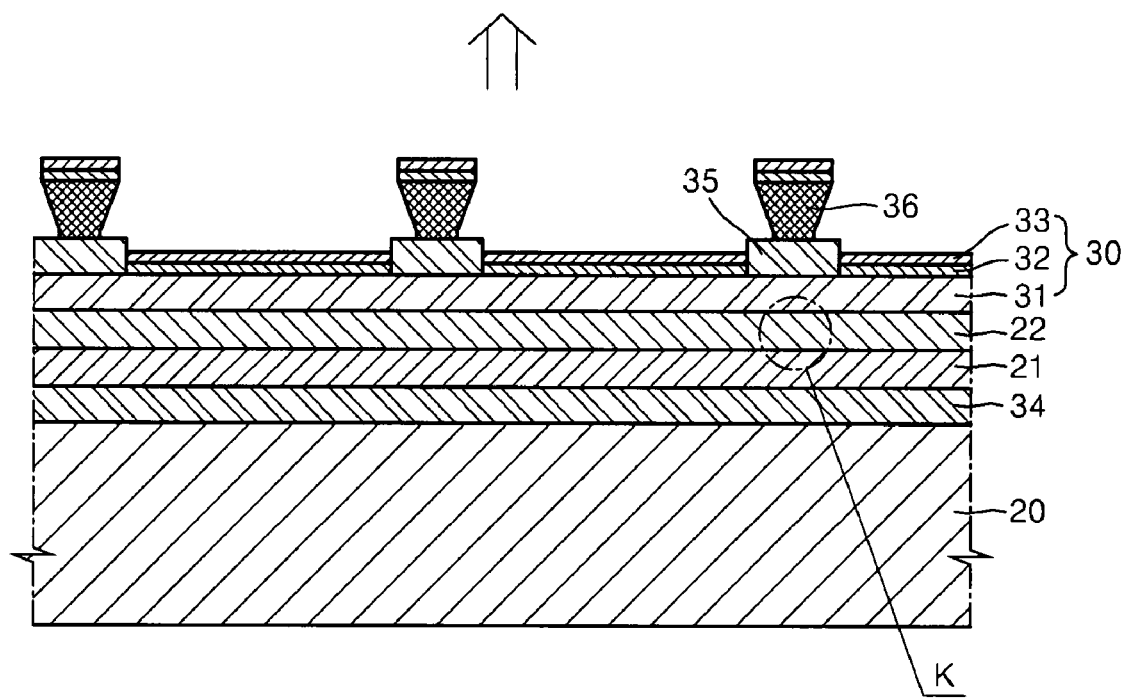
FIG. 28 is a schematic sectional view illustrating a PM top emission type organic light-emitting display apparatus according to an embodiment of the present invention.

FIG. 28 is a schematic sectional view illustrating a PM top emission type organic light-emitting display apparatus according to an embodiment of the present invention.

Referring to FIG. 28, a reflective layer 34 is disposed on a substrate 20, a ¼ wavelength retardation layer 21 and a linear polarization layer 22 are sequentially stacked on the reflective layer 34, and an organic light-emitting device 30 is disposed on the linear polarization layer 22.

Figure 29:
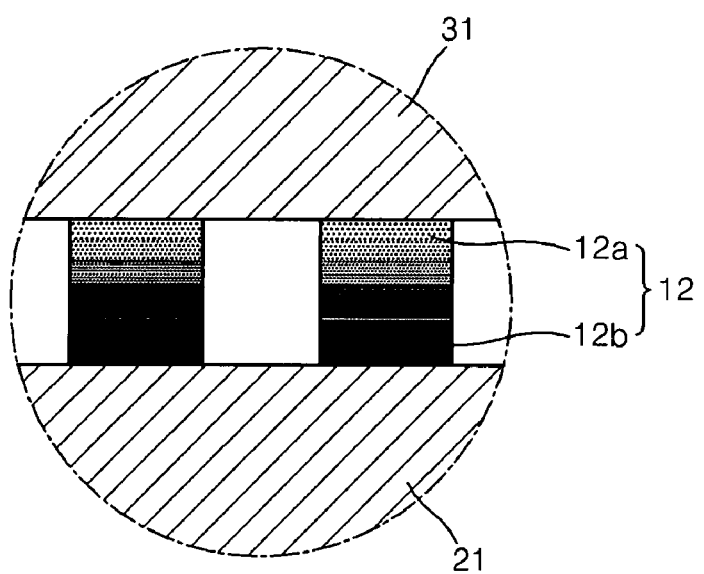
FIG. 29 is an enlarged sectional view illustrating a linear polarization layer of the organic light-emitting display apparatus of FIG. 28.

The structure of the linear polarization layer 22 is specifically illustrated in FIG. 29 which is an enlarged view of a part K of FIG. 28. A plurality of grids 12 are disposed on the ¼ wavelength retardation layer 21. The grids 12 include a first component 12a and a second component 12b which have a concentration gradient in the thickness direction of the grids 12. The first component 12a includes a dielectric material and the second component 12b includes a metal. The content (i.e., concentration) of the first component 12a increases along a thickness direction toward a first electrode 31 and the content (i.e., concentration) of the second component 12b increases along a thickness direction toward the ¼ wavelength retardation layer 21. That is, as it becomes closer to the ¼ wavelength retardation layer 21, the ratio of an opaque metal to a transparent material in the grids 12 is gradually increased.

The first electrode 31 is disposed in a stripe pattern on the linear polarization layer 22, and an internal insulator 35 for partitioning the first electrode 31 is disposed on the first electrode 31. A separator 36 orthogonal to the first electrode 31 is disposed on the internal insulator 35 in order to pattern an organic light-emitting layer 32 and a second electrode 33. By the separator 36, the organic light-emitting layer 32 and the second electrode 33 are patterned to cross with the first electrode 31. A sealing member (not shown) is disposed on the second electrode 33 to protect the organic light-emitting device 30 from the external air. In some cases, the organic light-emitting layer 32 and the second electrode 33 may be patterned in the absence of the separator 36.

In the current embodiment of the present invention, like in the previous embodiments, the reflection of an incident external light does not occur, thereby ensuring a manufacture of thinner displays having better contrast. The structures and effects of the constitutional elements are as described above, and thus, descriptions thereof will be omitted.

Although not shown, it should be understood that the structures illustrated in FIGS. 12 through 20 can be applied to PM top emission organic light-emitting display apparatuses as described above.

Figure 30:
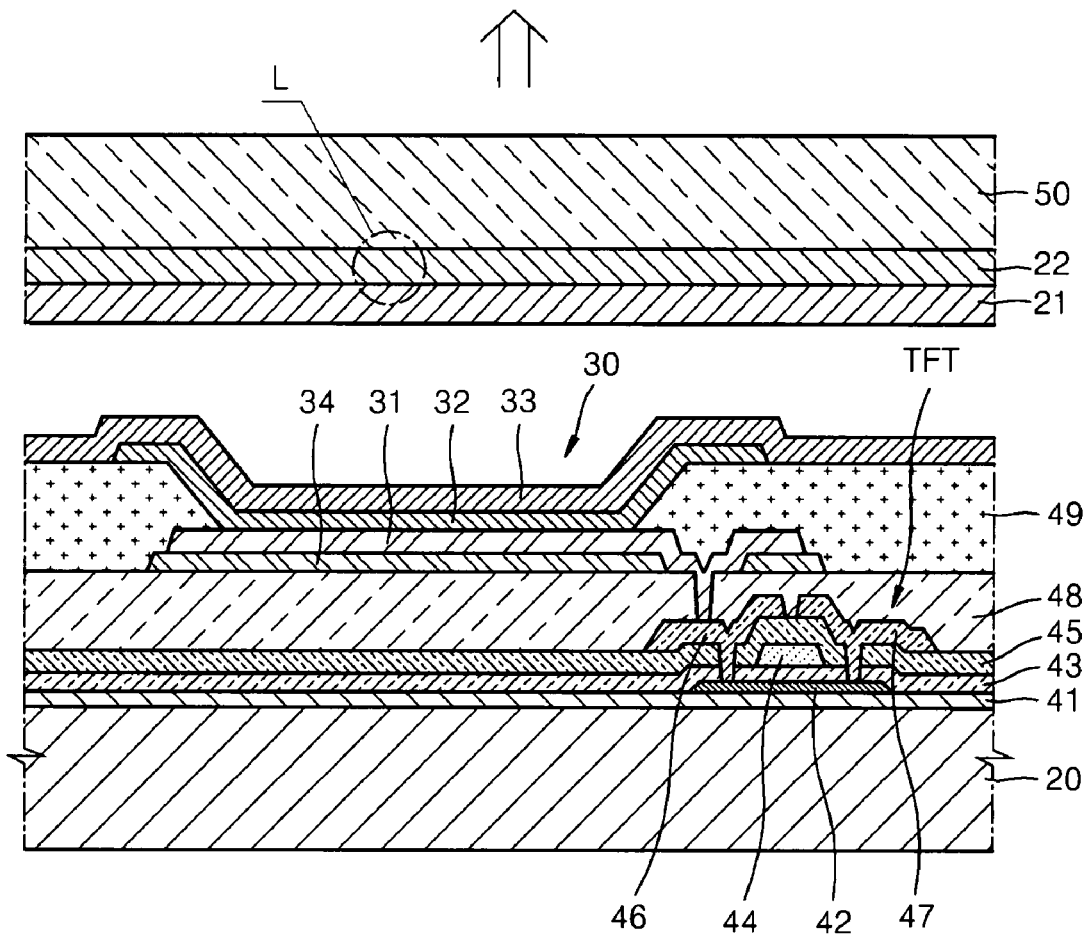
FIG. 30 is a schematic sectional view illustrating an AM top emission type organic light-emitting display apparatus according to an embodiment of the present invention.

FIG. 30 is a schematic sectional view illustrating an AM top emission type organic light-emitting display apparatus according to an embodiment of the present invention.

Referring to FIG. 30, a thin film transistor TFT is disposed on a substrate 20. At least one thin film transistor TFT is formed in each pixel and is electrically connected to an organic light-emitting device 30. The structure of the thin film transistor TFT is as described above with reference to FIG. 25, and thus, a detailed description thereof will be omitted.

A passivation layer 48 is disposed on the thin film transistor TFT to cover the thin film transistor TFT, and a reflective layer 34 is disposed on the passivation layer 48. A first electrode 31 serving as an anode is disposed on the reflective layer 34 and is covered with a pixel define layer 49 formed of an insulating material. An opening is formed in the pixel define layer 49, and an organic light-emitting layer 32 is disposed in a region defined by the opening. A second electrode 33 is disposed to cover all pixels.

Figure 31:
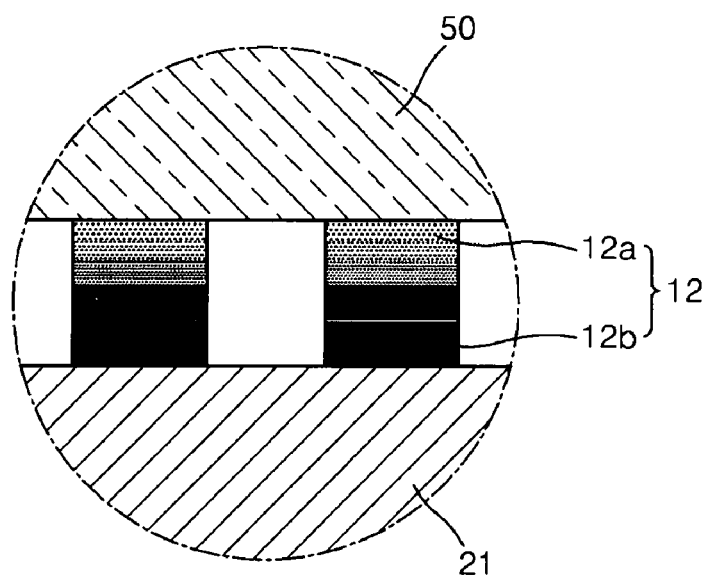
FIG. 31 is an enlarged sectional view illustrating a linear polarization layer of the organic light-emitting display apparatus of FIG. 30.

A linear polarization layer 22 and a ¼ wavelength retardation layer 21 are sequentially stacked on a surface of a sealing member 50 facing the organic light-emitting device 30. The structure of the linear polarization layer 22 is specifically illustrated in FIG. 31 which is an enlarged view of a part L of FIG. 30. A plurality of grids 12 are disposed on the ¼ wavelength retardation layer 21. The grids 12 include a first component 12a and a second component 12b which have a concentration gradient in the thickness direction of the grids 12. The first component 12a includes a dielectric material and the second component 12b includes a metal. The content (i.e., concentration) of the first component 12a increases along a thickness direction toward the sealing member 50, and the content (i.e., concentration) of the second component 12b increases along a thickness direction toward the ¼ wavelength retardation layer 21. That is, as it becomes closer to the sealing member 50, the ratio of a transparent material to an opaque metal in the grids 12 is gradually increased. The detailed structure, formation method, and effects of the grids 12 are as described above with reference to FIGS. 1 through 5, and thus, descriptions thereof will be omitted.

The linear polarization layer 22 and the ¼ wavelength retardation layer 21 can reduce or prevent the reflection of external light incident on the top part of FIG. 30, i.e., on an upper surface of the sealing member 50. Moreover, the grids 12 can reduce or prevent an interfacial reflection that may be caused by a refractive index difference. Thus, when external light is incident on the grids 12, the grids 12 absorb the external light, thereby reducing or preventing the reflection of the external light, resulting in better contrast. Although not shown, it should be understood that such an AM top emission type display apparatus can include any one of structures as illustrated in FIGS. 12 through 22.

The present invention is not limited to organic light-emitting display apparatuses as described above, and can be applied to other flat panel display apparatuses, such as inorganic light-emitting apparatuses, liquid crystal displays (LCDs), and electron emission displays.

Figure 32:
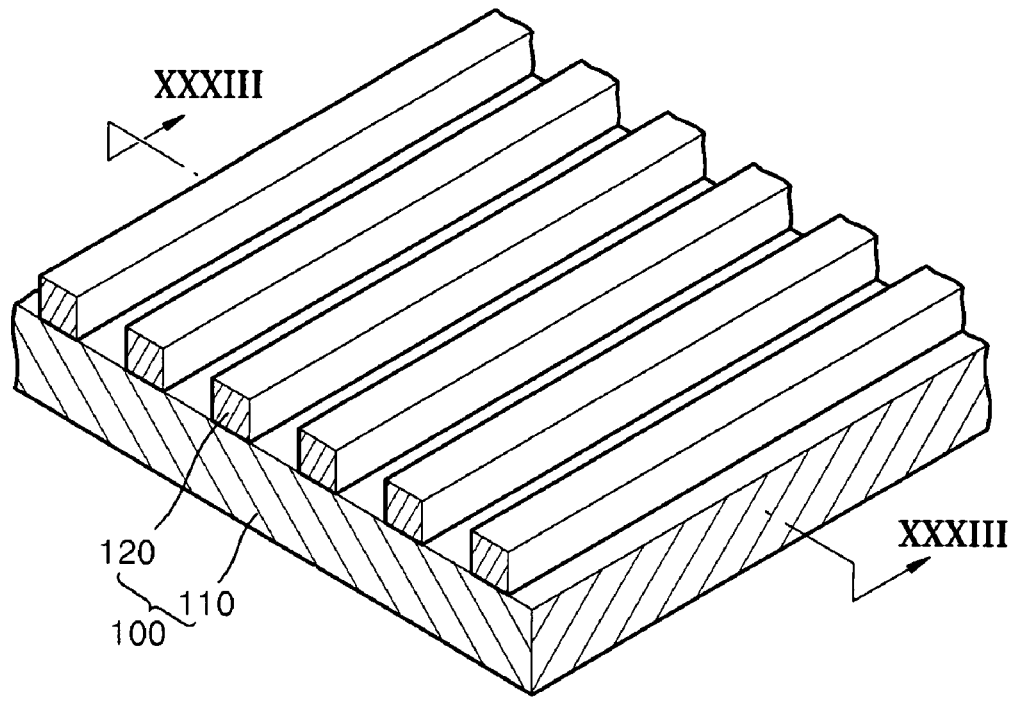
FIG. 32 is a schematic perspective view illustrating a polarizer according to another embodiment of the present invention.
Figure 33:
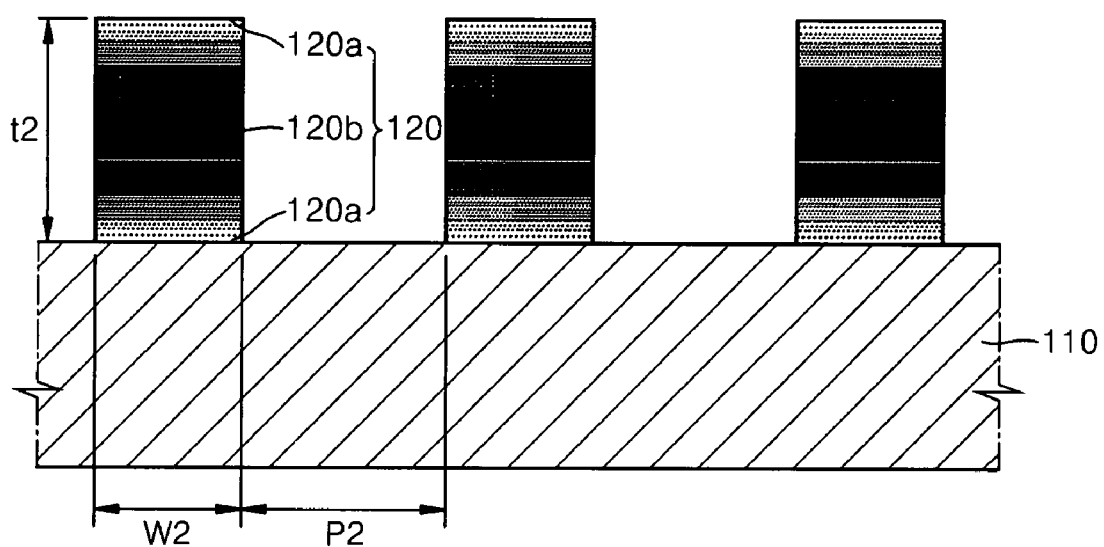
FIG. 33 is a partial sectional view taken along a line XXXIII-XXXIII of FIG. 32.
Figure 34:
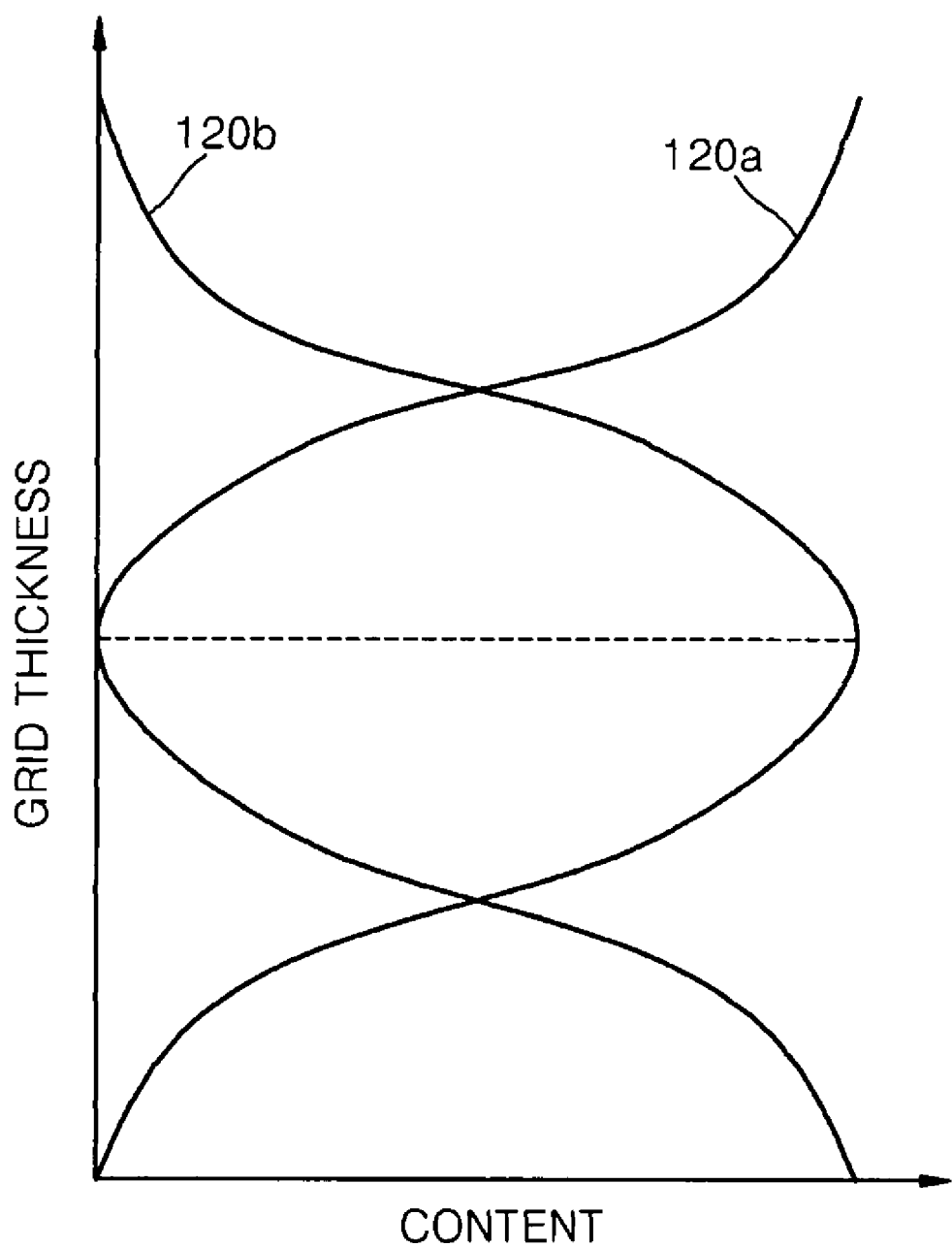
FIG. 34 is a graph illustrating the content (i.e., concentration) of a first component and a second component along the thickness direction of grids in the polarizer of FIG. 33.

FIG. 32 is a schematic perspective view illustrating a polarizer according to another embodiment of the present invention and FIG. 33 is a partial sectional view taken along a line XXXIII-XXXIII of FIG. 32. FIG. 34 is a graph illustrating the content (i.e., concentration) of a first component and a second component along the thickness direction of grids in the polarizer of FIG.33. For the sake of convenience of illustration, matters different from the previous embodiments will be mainly described.

Referring to FIGS. 32 and 33, a polarizer 100 includes a base 110 and a plurality of grids 120. The base 110 may be formed of a transparent material in order to allow light generated from a display apparatus in which the polarizer 100 is to be disposed to efficiently pass through the polarizer 100. For this, the base 110 may be formed of glass or a flexible plastic. In order for the base 110 to be formed as a film, in one embodiment, the base is formed using a plastic material.

The grids 120 are disposed on the base 110. The grids 120 may be patterned in the form of stripes which are spaced apart from each other. In order for the polarizer 100 to be used as a polarizer for visible light, the grids 120 may be formed to a width W2 of 100 to 500 nm and a thickness t2 of 50 to 500 nm. The grids 120 are separated from each other by a pitch P2. In the described embodiment, the pitch P2 of the grids 120 is an important factor for determining the performance of the polarizer 100.

The grids 120 of the current embodiment of the present invention include a first component 120a and a second component 120b.The first component 120a includes a dielectric material. The first component 120a may include an insulating transparent material, e.g., SiOx (x≧1), SiNx (x≧1), MgF2, CaF2, Al2O3, SnO2, or the like. The first component 120a may also include a conductive transparent material, e.g., ITO, IZO, ZnO, or In2O3.The second component 120b includes a metal. For example, the second component 120b may include Fe, Co, V, Ti, Al, Ag, Si, Cr, Mo, Ge, Y, Zn, Zr, W, Ta, Cu, or Pt. The first component 120a and the second component 120b have a concentration gradient in the thickness direction of the grids 120.

Referring to FIGS. 33 and 34, the content (i.e., concentration) of the first component 120a increases along a thickness direction toward both ends (i.e., toward one end or the other) in the thickness direction of the grid 120, and the content (i.e., concentration) of the second component 120b increases along a thickness direction toward the center of the thickness direction of the grids 120 from either end. That is, as shown in FIG. 33, the first component 120a is mainly distributed in upper portions of the grids 120 and in lower portions of the grids 120 closer to the base 110, and the second component 120b is mainly distributed in the center portions of the grids 120.

When external light is incident on the top part of the FIG. 33, i.e., on an opposite side to the base 110, as it becomes closer to the external light, the grids 120 include a higher amount of the first component 120a including a dielectric material. That is, as it goes from the center to the external light incidence side of the thickness direction of the grids 120, the ratio of a dielectric material to an opaque metal in the grids 120 is gradually increased. Therefore, the grids 120 can reduce or prevent an interfacial reflection that may be caused by a refractive index difference. When external light is incident on the grids 120, the grids 120 absorb the external light, thereby reducing or preventing the reflection of the external light.

From the center to the base side in the thickness direction of the grids 120, the content (i.e., concentration) of the first component 120a in the grids 120 increases. When external light is incident on the bottom part of FIG. 33, i.e., on the base 110, as it is closer to the external light, the grids 120 include a higher amount of the first component 120a including a dielectric material. That is, along a thickness direction toward the base 110, the content (i.e., concentration) of the first component 120a including a dielectric material increases. Along a thickness direction away from the base 110 and toward the center portions of the grids 120, the content (i.e., concentration) of the second component 120b increases. From the center to the base side in the thickness direction of the grids 120, the ratio of a dielectric material to an opaque metal in the grids 120 is gradually increased. Therefore, the grids 120 can reduce or prevent an interfacial reflection that may be caused by a refractive index difference. When external light is incident on the grids 120, the grids 120 absorb the external light, thereby reducing or preventing the reflection of the external light.

In order for the first component 120a and the second component 120b to have a concentration gradient, the grids 120 may be formed by a co-deposition process or the like. When forming the grids 120 using a co-deposition process, the deposition rates of the first component 120a and the second component 120b can be adjusted with respect to time so that the content (i.e., concentration) of the first component 120a is inversely proportional to the content (i.e., concentration) of the second component 120b. The co-deposition process can be performed as follows. At an initial stage, the first component 120a is mainly deposited on the base 110. Then, the content (i.e., concentration) of the first component 120a is gradually decreased and the content (i.e., concentration) of the second component 120b is gradually increased so that the second component 120b is mainly deposited at a middle stage. Then, the content (i.e., concentration) of the first component 120a is gradually increased so that the first component 120a is mainly deposited at a final stage.

In the described embodiment, in the center of the thickness direction of the grids 120, only the second component 120b is present, thus forming a metal layer. The metal layer can have an appropriate thickness by adjusting the deposition amount and time of the second component 120b.

A polarizer according to exemplary embodiments of the present invention can be applied in flat panel display apparatuses, e.g., organic light-emitting display apparatuses. Throughout the specification, the present invention will be described in terms of organic light-emitting display apparatuses. In organic light-emitting display apparatuses according to exemplary embodiments of the present invention, a linear polarization layer including a plurality of grids is directly formed on a substrate, a sealing member, or the like, instead of separately using a base. Grids of a linear polarization layer as will be described later are the same as the above-described grids of the polarizer, and thus, detailed descriptions about the structures, materials, and formation methods of the grids will be omitted.

Figure 35:
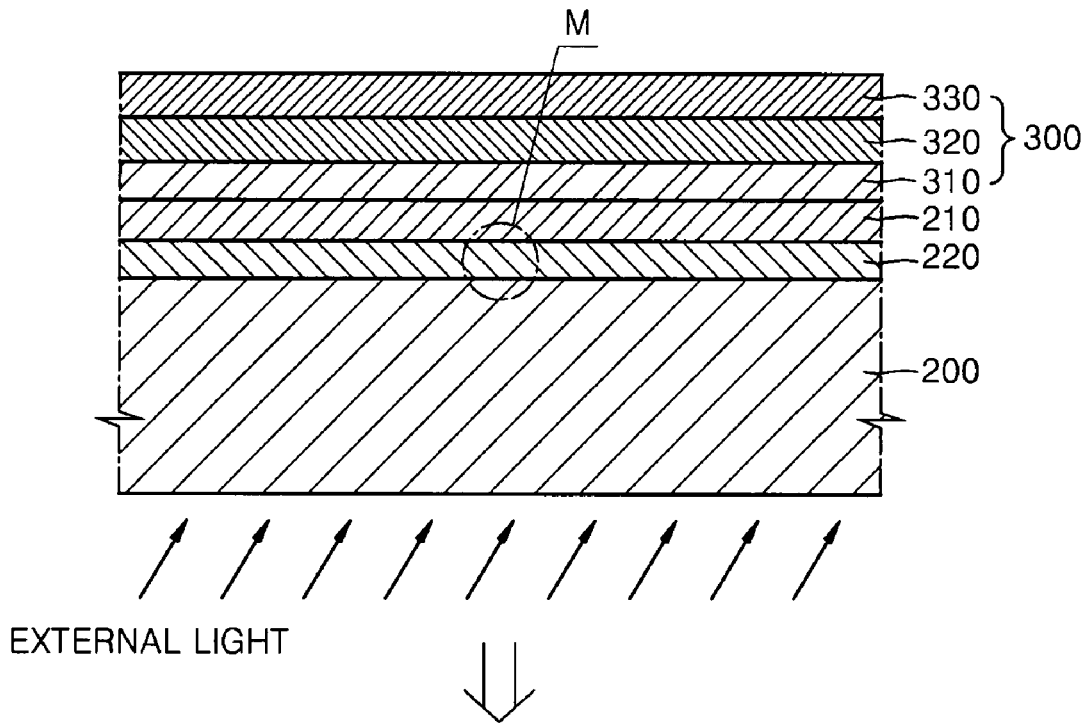
FIGS. 35, 37, and 39 are schematic sectional views illustrating bottom emission type organic light-emitting display apparatuses according to another embodiments of the present invention.

FIG. 35 is a schematic sectional view illustrating a bottom emission type organic light-emitting display apparatus according to an embodiment of the present invention. Referring to FIG. 35, the organic light-emitting display apparatus includes a substrate 200 formed of a transparent material; and a linear polarization layer 220, a ¼ wavelength retardation layer 210, an organic light-emitting device 300, and a sealing member (not shown) which are sequentially disposed on the substrate 200.

The substrate 200 may be formed of a transparent glass material including $SiO_2$ as a main component. Although not shown, a buffer layer may be further disposed on the substrate 200 to make the substrate 200 smooth and to reduce or prevent the penetration of impurity elements. The buffer layer may be formed of $SiO_2$ and/or SiNx, or the like. A material for the substrate 200 is not limited to the above examples and may also be a transparent plastic material.

Figure 36:
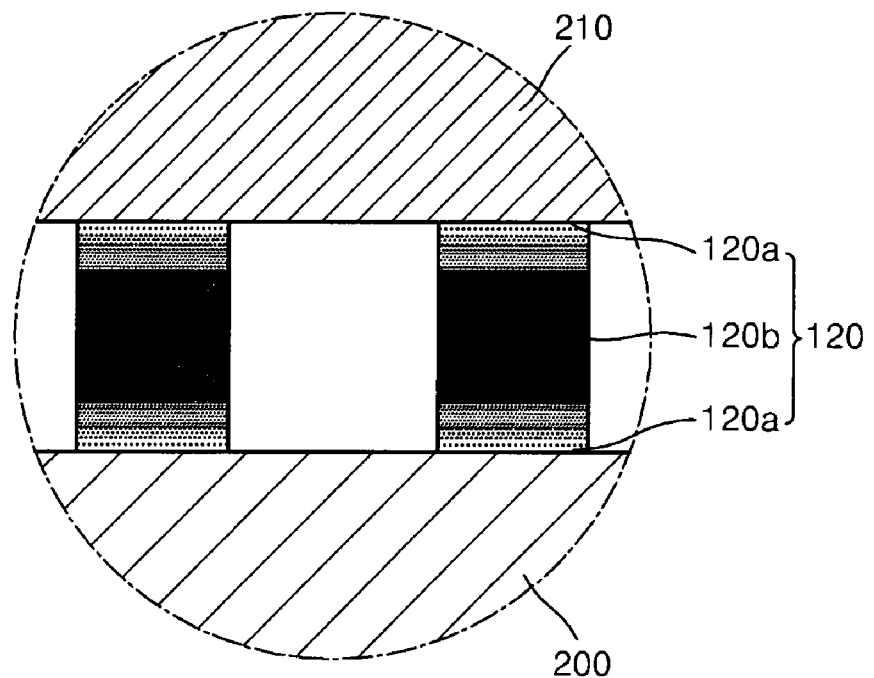
FIGS. 36, 38, and 40 are enlarged sectional views illustrating linear polarization layers of the organic light-emitting display apparatuses of FIGS. 35, 37, and 39, respectively.

The linear polarization layer 220 is disposed on the substrate 200. FIG. 36 is an enlarged view of a part M of FIG. 35 and specifically illustrates the structure of the linear polarization layer 220. The linear polarization layer 220 includes a plurality of grids 120. The grids 120 are interposed between the ¼ wavelength retardation layer 210 and the substrate 200. The grids 120 include a first component 120a and a second component 120b which have a concentration gradient in the thickness direction of the grids 120. The first component 120a includes a dielectric material and the second component 120b includes a metal. The content (i.e., concentration) of the first component 120a increases along a thickness direction from the center to the ¼ wavelength retardation layer side and the substrate side of the grids 120, and the content (i.e., concentration) of the second component 120b increases as the grids 120 along a thickness direction toward the center of the grids 120. That is, along a thickness direction of the grids 120 from the center to the ¼ wavelength retardation layer side and the substrate side of the grids 120, the ratio of a dielectric material to an opaque metal in the grids 120 is gradually increased.

Therefore, the grids 120 can reduce or prevent an interfacial reflection that may be caused by a refractive index difference. Thus, when external light is incident on the substrate 200, the grids 120 absorb the external light, thereby reducing or preventing the reflection of the external light.

Some of external light incident on the substrate 200 may enter into the organic light-emitting display apparatus via the substrate 200 and be reflected from a metal layer or the like of the organic light-emitting display apparatus, and the reflected light may advance toward the substrate 200 from the ¼ wavelength retardation layer 210, thus reducing contrast. At this time, the grids 120 can absorb the reflected light since the content (i.e., concentration) of a dielectric material increases along a thickness direction of the grids 120 toward the ¼ wavelength retardation layer 210, thereby reducing or preventing the reflection of the external light, resulting in better contrast. The structure, formation method, and effects of the grids 120 are as described above, and thus, descriptions thereof will be omitted.

The ¼ wavelength retardation layer 210 is disposed on the linear polarization layer 220. The ¼ wavelength retardation layer 210 may be formed by oblique deposition using an inorganic material. In this case, fine columns obliquely extend from a surface of the linear polarization layer 220. The oblique direction of the columns corresponds to a crystal growing direction. When depositing an inorganic material, the inorganic material is grown in a cylindrical shape. Thus, in the oblique deposition of the inorganic material, the cylindrical structures are slanted at an angle (e.g., a predetermined angle) with respect to a horizontal direction, thereby imparting a birefringence property to the ¼ wavelength retardation layer 210. The ¼ wavelength retardation layer 210 may be formed of an inorganic material, e.g., TiO2, TaOx, or the like. When using CaO or BaO, the ¼ wavelength retardation layer 210 can also have a moisture absorbing property.

The organic light-emitting device 300 is disposed on the ¼ wavelength retardation layer 210. The linear polarization layer 220 and the ¼ wavelength retardation layer 210 are stacked in such a manner that the linear polarization layer 220 is disposed closer than the ¼ wavelength retardation layer 210 to the external light incidence side. A transparent member may be interposed between the linear polarization layer 220 and the ¼ wavelength retardation layer 210.

The organic light-emitting device 300 includes first and second electrodes 310 and 330 facing each other and an organic light-emitting layer 320. The first electrode 310 may be formed of a transparent conductive material, e.g., ITO, IZO, In$_2$O$_3$, or ZnO. The first electrode 310 may be patterned by photolithography. In PM organic light-emitting display apparatuses, the patterns of the first electrode 310 may be stripe-shaped lines that are separated from each other (e.g., by a predetermined distance). In AM organic light-emitting display apparatuses, the patterns of the first electrode 310 may be formed to correspond to pixels. The second electrode 330 is disposed on the first electrode 310. The second electrode 330 may be a reflective electrode and may be formed of aluminum, silver, and/or calcium. The second electrode 330 may be connected to an external terminal (not shown) so as to be used as a cathode. In PM organic light-emitting display apparatuses, the second electrode 330 may be formed as stripes that are orthogonal to the patterns of the first electrode 310. In AM organic light-emitting display apparatuses, the second electrode 330 may be formed over the entire active region for displaying images. The first electrode 310 and the second electrode 330 may also be used as a cathode and an anode, respectively.

The organic light-emitting layer 320 interposed between the first electrode 310 and the second electrode 330 emits light when the first electrode 310 and the second electrode 330 are electrically operated. The organic light-emitting layer 320 may be formed of a low molecular weight organic material or a polymer organic material. When the organic light-emitting layer 320 is formed of a low molecular weight organic material, a hole transport layer, a hole injection layer, etc. may be stacked on a surface of the organic light-emitting layer 320 facing the first electrode 310, and an electron transport layer, an electron injection layer, etc. may be stacked on the other surface of the organic light-emitting layer 320 facing the second electrode 330. In addition, if necessary, various layers can be stacked. An available low molecular weight organic material may be copper phthalocyanine (CuPc), N,N'-di(naphthalene-1-yl)-N,N'-diphenyl-benzidine (NPB), tris-8-hydroxyquinoline aluminum (Alq3), or the like.

When the organic light-emitting layer 320 is formed of a polymer organic material, only a hole transport layer (HTL) may be disposed on a surface of the organic light-emitting layer 320 facing the first electrode 310. Here, the hole transport layer may be formed on the first electrode 310 by inkjet printing or spin coating using poly-(2,4)-ethylene-dihydroxy thiophene (PEDOT), polyaniline (PANI) or the like. The organic light-emitting layer 320 may be formed of PPV, soluble PPV's, cyano-PPV, polyfluorene, or the like, and may be color-patterned using a method commonly known in the art, e.g., inkjet printing, spin coating, or laser-assisted thermal transfer.

In the current embodiment of the present invention, light emitted from the organic light-emitting device 300 advances toward the substrate 200, as illustrated in FIG. 35. A viewer can observe images on the bottom part of FIG. 35, i.e., on a lower surface of the substrate 200. In a conventional bottom emission type organic light-emitting display apparatus, when external light (e.g., sunlight) is incident on a substrate, contrast can be reduced. However, according to the current embodiment of the present invention, the linear polarization layer 220 and the ¼ wavelength retardation layer 210 constitute a circular polarizer, thereby reducing or minimizing the reflection of external light. Among external light incident on a lower surface of the substrate 200, light components parallel to the absorption axis of the linear polarization layer 220 are absorbed in the linear polarization layer 220, and light components parallel to the transmission axis of the linear polarization layer 220 are transmitted through the linear polarization layer 220. The light components parallel to the transmission axis of the linear polarization layer 220 are converted to circularly polarized light rotating in one direction while passing through the ¼ wavelength retardation layer 210. The circularly polarized light is reflected from the second electrode 330 of the organic light-emitting device 300. At this time, the circularly polarized light rotating in one direction is converted to circularly polarized light rotating in the opposite direction. The circularly polarized light rotating in the opposite direction is converted to linearly polarized light orthogonal to the transmission axis of the linear polarization layer 220 while passing through the ¼ wavelength retardation layer 210. The linearly polarized light is absorbed along the absorption axis of the linear polarization layer 220 so that it is not emitted from the lower surface of the substrate 200. Therefore, the reflection of external light is reduced or minimized, thereby ensuring better contrast.

As described above, the linear polarization layer 220 include the plurality of the grids 120. When external light incident on the substrate 200 reaches the linear polarization layer 220, an interfacial reflection due to a refractive index difference is reduced or prevented by the grids 120 having a concentration gradient. Some of external light incident on the substrate 200 may enter into the organic light-emitting display apparatus via the substrate 200 and be reflected from an interface(s) and/or a metal layer constituting the organic light-emitting display apparatus, and the reflected light may be emitted outside the substrate 200. At this time, the grids 120 can absorb the reflected light, thereby reducing or minimizing the reflection of the external light, resulting in better contrast.

The linear polarization layer 220 and the ¼ wavelength retardation layer 210 are directly formed on the substrate 200.

Thus, there is no need to use an adhesive layer or the like, thereby producing a thin organic light-emitting display apparatus. Moreover, an image realized from a light-emitting layer is not transmitted through an adhesive layer, thereby enhancing brightness.

The linear polarization layer 220 and the ¼ wavelength retardation layer 210 can be formed using various methods. The construction of the linear polarization layer 220 and the ¼ wavelength retardation layer 210 can be applied to top emission type organic light-emitting display apparatuses in consideration of the incident direction of external light, as well as to bottom emission type organic light-emitting display apparatuses as described above.

Figure 37:
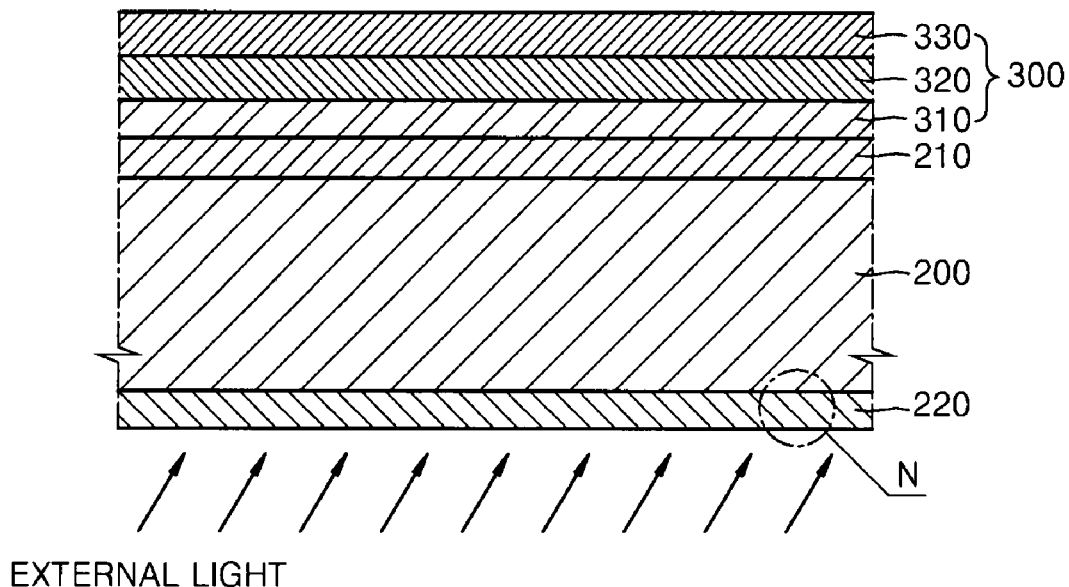
Figure 38:
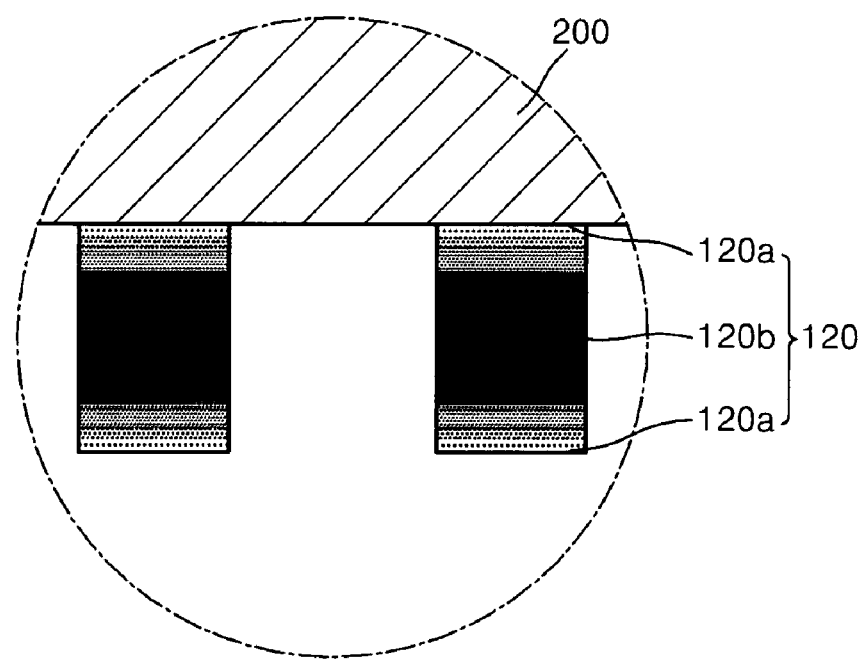

FIG. 37 is a sectional view illustrating a bottom emission type organic light-emitting display apparatus according to another embodiment of the present invention. Referring to FIG. 37, a linear polarization layer 220 is disposed on a surface of a substrate 200 facing external light, and a ¼ wavelength retardation layer 210 is disposed on the other surface of the substrate 200. An organic light-emitting device 300 is disposed on the ¼ wavelength retardation layer 210. A detailed structure of the linear polarization layer 220 is illustrated in FIG. 38 which is an enlarged view of a part N of FIG. 37. The linear polarization layer 220 includes a plurality of grids 120. The grids 120 are disposed on a surface of the substrate 200 opposite to the organic light-emitting device 300. The grids 120 include a first component 120a and a second component 120b which have a concentration gradient in the thickness direction of the grids 120. The first component 120a includes a dielectric material, and the second component 120b includes a metal. The content (i.e., concentration) of the first component 120a increases along a thickness direction of the grids 120 from the center to the substrate side and the opposite side of the grids 120, and the content (i.e., concentration) of the second component 120b increases along a thickness direction toward the center of the grids 120 from either side of the grids 120. That is, along a thickness direction of the grids 120 from the center to the substrate side and the opposite side of the grids 120, the ratio of a dielectric material to an opaque metal in the grids 120 is gradually increased.

Therefore, the grids 120 can reduce or prevent an interfacial reflection that may be caused by a refractive index difference. Thus, when external light is incident in the direction of the substrate 200, the grids 120 absorb the external light, thereby reducing or preventing the reflection of the external light.

Some of external light incident in the direction of the substrate 200 may enter into the organic light-emitting display apparatus via the substrate 200, and be reflected from a metal layer or the like constituting the organic light-emitting display apparatus, and the reflected light may advance toward the substrate 200, thus reducing contrast. At this time, the grids 120 can absorb the reflected light since they have a higher amount of a dielectric material as it is closer to the substrate 200, thereby reducing or preventing the reflection of the external light, resulting in better contrast. The structure, formation method, and effects of the grids 120 are as described above with reference to FIGS. 1 through 3, and thus, descriptions thereof will be omitted.

Figure 39:
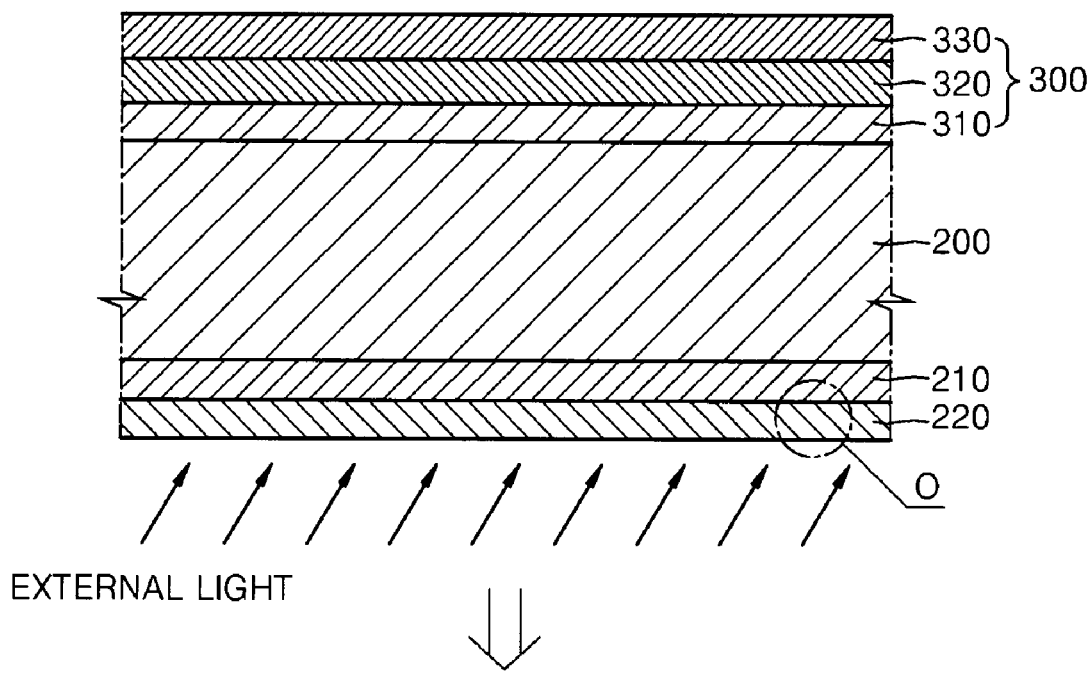

FIG. 39 is a sectional view illustrating a bottom emission type organic light-emitting display apparatus according to another embodiment of the present invention. Referring to FIG. 39, a ¼ wavelength retardation layer 210 and a linear polarization layer 220 are sequentially stacked on a surface of a substrate 200 facing external light, and an organic light-emitting device 300 is disposed on the other surface of the substrate 200. These constitutional elements are as described above.

Figure 40:
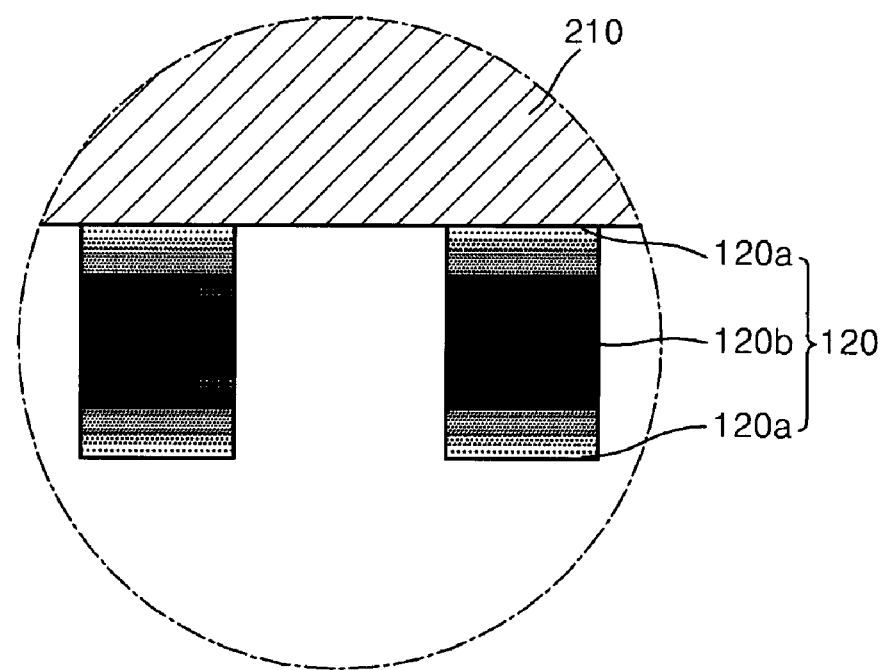

A detailed structure of the linear polarization layer 220 is illustrated in FIG. 40 which is an enlarged view of a part O of FIG. 39. The linear polarization layer 220 includes a plurality of grids 120. The grids 120 are disposed on a surface of the ¼ wavelength retardation layer 210 opposite to the substrate 200. The grids 120 include a first component 120a and a second component 120b which have a concentration gradient in the thickness direction of the grids 120. The first component 120a includes a dielectric material and the second component 120b includes a metal. The content (i.e., concentration) of the first component 120a increases along a thickness direction from the center to the ¼ wavelength retardation layer side and the opposite side of the grids 120, and the content (i.e., concentration) of the second component 120b increases along a thickness direction toward the center of the grids 120 from either side of the grids 120. That is, along a thickness direction from the center to the ¼ wavelength retardation layer side and the opposite side of the grids 120, the ratio of a dielectric material to an opaque metal in the grids 120 is gradually increased.

Therefore, the grids 120 can reduce or prevent an interfacial reflection that may be caused by a refractive index difference. Thus, when external light is incident on the grids 120, the grids 120 absorb the external light, thereby reducing or preventing the reflection of the external light.

Some of external light incident in the direction of the substrate 200 may enter into the organic light-emitting display apparatus via the substrate 200 and be reflected from a metal layer or the like constituting the organic light-emitting display apparatus, and the reflected light may advance toward the ¼ wavelength retardation layer 210 from the substrate 200, thus reducing contrast. At this time, the grids 120 can absorb the reflected light since they have a higher amount of a dielectric material as it is closer to the ¼ wavelength retardation layer 210, thereby reducing or preventing the reflection of the external light, resulting in better contrast. The detailed structure, formation method, and effects of the grids 120 are as described above with reference to FIGS. 1 through 3, and thus, descriptions thereof will be omitted.

Hitherto, the present invention has been illustrated in terms of bottom emission type organic light-emitting display apparatuses displaying images on a substrate side, but is not limited thereto. The present invention can also be applied to top emission type organic light-emitting display apparatuses displaying images on an opposite side to a substrate.

Figure 41:
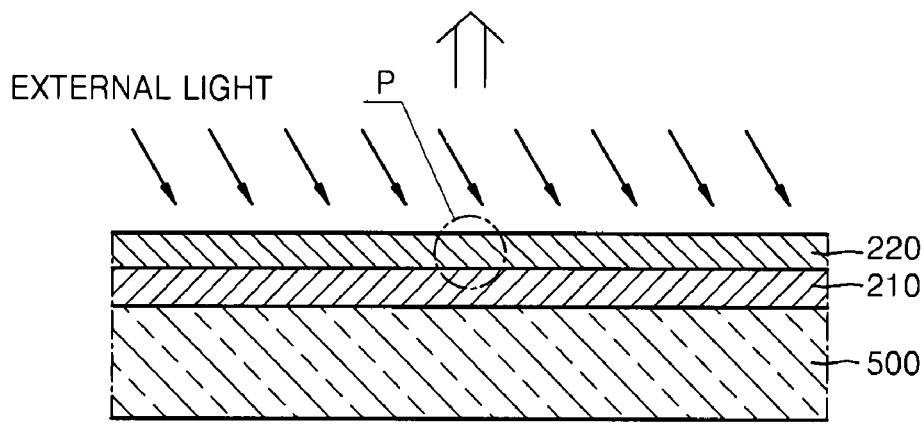
FIGS. 41, 43, 45, 47, and 50 are schematic sectional views illustrating top emission type organic light-emitting display apparatuses according to another embodiments of the present invention.

FIG. 41 is a sectional view illustrating a top emission type organic light-emitting display apparatus according to an embodiment of the present invention. Referring to FIG. 41, the organic light-emitting display apparatus includes a substrate 200; and a reflective layer 340, an organic light-emitting device 300, and a sealing member 500 which are stacked on the substrate 200.

The substrate 200 may be a transparent glass substrate as described above, but does not necessarily require a transparent property. Moreover, the substrate 200 may also be formed of plastic or metal in order to have a flexible property. When forming the substrate 200 using a metal, an insulating layer is further disposed on a surface of a metal layer.

The reflective layer 340 disposed on a surface of the substrate 200 may be formed of Ag, Mg, Al, Pt, Pd, Au, Ni, Nd, Ir, Cr, or a compound thereof. A first electrode 310 may be formed on the reflective layer 340 using a material having a high work function, e.g., ITO, IZO, ZnO, or $In_2O_3$. The first electrode 310 is used as an anode. If the first electrode 310 is used as a cathode, the first electrode 310 may be formed of Ag, Mg, Al, Pt, Pd, Au, Ni, Nd, Ir, Cr, or a compound thereof, so that the first electrode 310 can be used both as an a cathode and a reflective layer. Hereinafter, the present invention will be described in terms of use of the first electrode 310 as an anode.

A second electrode 330 is formed as a transmissive electrode. The second electrode 330 may be formed as a thin translucent film using a material having a low work function, e.g., Li, Ca, LiF/Al, Al, Mg, or Ag. Of course, a transparent conductor, e.g., ITO, IZO, ZnO, or $In_2O_3$ may be disposed on the translucent film in order to solve a high resistance problem due to a decreased thickness. An organic light-emitting layer 320 interposed between the first electrode 310 and the second electrode 330 is as described above.

The sealing member 500 sealing the organic light-emitting device 300 is disposed on the organic light-emitting device 300. The sealing member 500 serves to protect the organic light-emitting device 300 from external moisture or oxygen and is formed of a transparent material. For this, the sealing member 500 may be a glass substrate, a plastic substrate, or a multi-layered structure including an organic material and an inorganic material.

Figure 42:
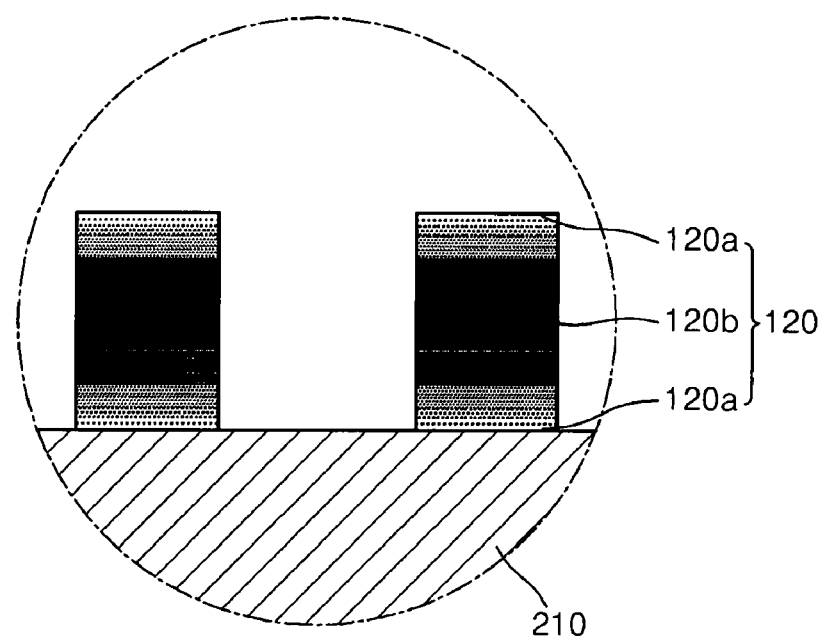
FIGS. 42, 44, 46, 48, and 51 are enlarged sectional views illustrating linear polarization layers of the organic light-emitting display apparatuses of FIGS. 41, 43, 45, 47, and 50, respectively.

A ¼ wavelength retardation layer 210 and a linear polarization layer 220 are sequentially stacked on an upper surface of the sealing member 500, i.e., on a surface of the sealing member 500 opposite to the organic light-emitting device 300. The structure of the linear polarization layer 220 is specifically illustrated in FIG. 42 which is an enlarged view of a part P of FIG. 41. The linear polarization layer 220 includes a plurality of grids 120. The grids 120 are disposed on a surface of the ¼ wavelength retardation layer 210 opposite to the sealing member 500. The grids 120 include a first component 120a and a second component 120b which have a concentration gradient in the thickness direction of the grids 120. The first component 120a includes a dielectric material, and the second component 120b includes a metal. The content (i.e., concentration) of the first component 120a increases along a thickness direction from the center to the ¼ wavelength retardation layer side and the opposite side of the grids 120, and the content (i.e., concentration) of the second component 120b increases along a thickness direction toward the center of the grids 120 from either side of the grids 120. That is, along a thickness direction from the center to the ¼ wavelength retardation layer side and the opposite side of the grids 120, the ratio of a dielectric material to an opaque metal in the grids 120 is gradually increased.

Therefore, the grids 120 can reduce or prevent an interfacial reflection that may be caused by a refractive index difference. Thus, when external light is incident on the grids 120, the grids 120 absorb the external light, thereby reducing or preventing the reflection of the external light.

Some of external light incident in the direction of the sealing member 500 may enter into the organic light-emitting display apparatus via the sealing member 500 and be reflected from a metal layer or the like constituting the organic light-emitting display apparatus, and the reflected light may advance toward the ¼ wavelength retardation layer 210 from the sealing member 500, thus reducing contrast. At this time, the grids 120 can absorb the reflected light since they have a higher amount of a dielectric material as it is closer to the ¼ wavelength retardation layer 210, thereby reducing or preventing the reflection of the external light, resulting in better contrast. The detailed structure, formation method, and effects of the grids 120 are as described above with reference to FIGS. 1 through 3, and thus, descriptions thereof will be omitted.

According to the current embodiment of the present invention, when an external light incident on an image display side, i.e., external light incident on the top part of FIG. 41 sequentially pass through the linear polarization layer 220 and the ¼ wavelength retardation layer 210 and is then reflected from a surface of the reflective layer 340, the reflected light cannot be transmitted through the linear polarization layer 220. The principle is as described above.

Figure 43:
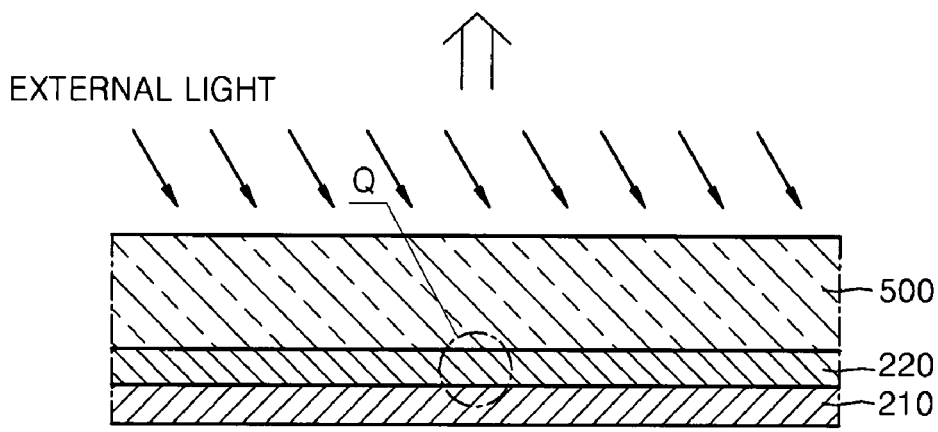
Figure 44:
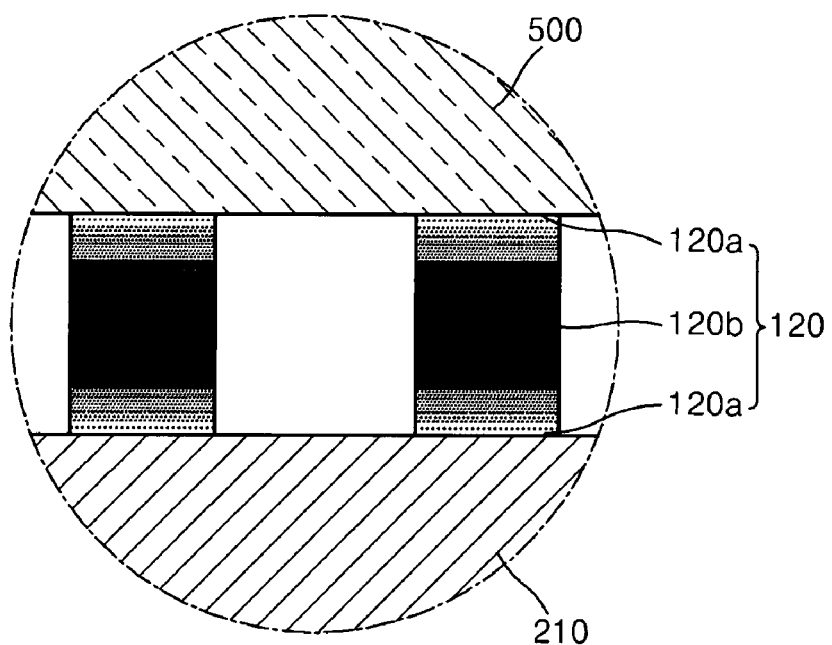

FIG. 43 is a sectional view illustrating a top emission type organic light-emitting display apparatus according to another embodiment of the present invention. Referring to FIG. 43, a linear polarization layer 220 and a ¼ wavelength retardation layer 210 are sequentially stacked on a surface of a sealing member 500 facing an organic light-emitting device 300. The structure of the linear polarization layer 220 is specifically illustrated in FIG. 44 which is an enlarged view of a part Q of FIG. 43. The linear polarization layer 220 includes a plurality of grids 120. The grids 120 are interposed between the sealing member 500 and the ¼ wavelength retardation layer 210. The grids 120 include a first component 120a and a second component 120b which have a concentration gradient in the thickness direction of the grids 120. The first component 120a includes a dielectric material and the second component 120b includes a metal. The content (i.e., concentration) of the first component 120a increases along a thickness direction from the center to the ¼ wavelength retardation layer side and the sealing member side of the grids 120, and the content (i.e., concentration) of the second component 120b increases along a thickness direction toward the center of the grids 120 from either side of the grids 120. That is, along a thickness direction from the center to the ¼ wavelength retardation layer side and the sealing member side of the grids 120, the ratio of a dielectric material to an opaque metal in the grids 120 is gradually increased.

Therefore, the grids 120 can reduce or prevent an interfacial reflection that may be caused by a refractive index difference. Thus, when external light is incident in the direction of the sealing member 500, the grids 120 absorb the external light, thereby reducing or preventing the reflection of the external light.

Some of external light incident in the direction of the sealing member 500 may enter into the organic light-emitting display apparatus via the sealing member 500 and be reflected from a metal layer or the like constituting the organic light-emitting display apparatus, and the reflected light may advance toward the sealing member 500 from the ¼ wavelength retardation layer 210, thus reducing contrast. At this time, the grids 120 can absorb the reflected light since they have a higher amount of a dielectric material as it is closer to the ¼ wavelength retardation layer 210, thereby reducing or preventing the reflection of the external light, resulting in better contrast. The detailed structure, formation method, and effects of the grids 120 are as described above with reference to FIGS. 1 through 3, and thus, descriptions thereof will be omitted.

Figure 45:
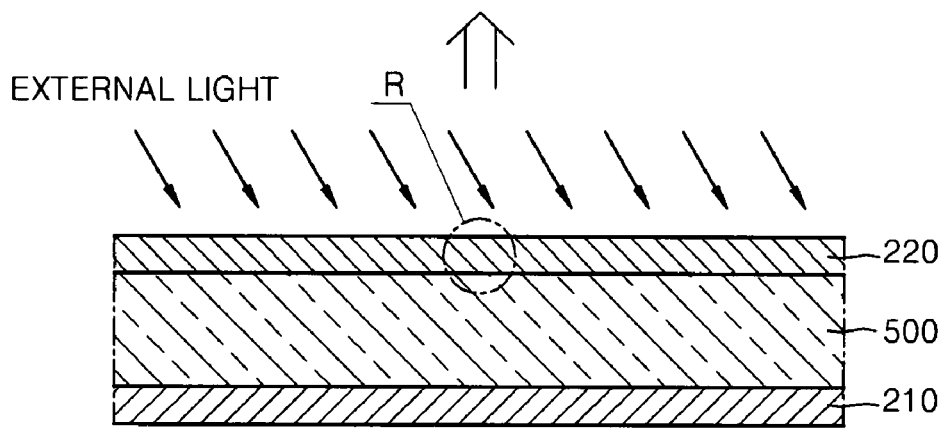
Figure 46:
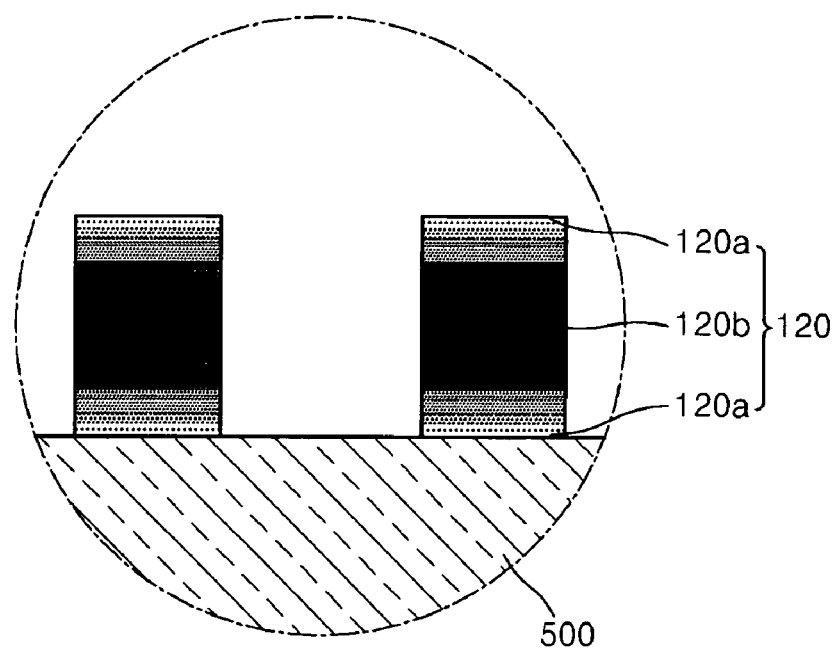

FIG. 45 is a sectional view illustrating a top emission type organic light-emitting display apparatus according to another embodiment of the present invention. Referring to FIG. 45, a linear polarization layer 220 is disposed on a surface of a sealing member 500 facing external light, and a ¼ wavelength retardation layer 210 is disposed on the other surface of the sealing member 500 facing an organic light-emitting device 300. The structure of the linear polarization layer 220 is specifically illustrated in FIG. 46 which is an enlarged view of a part R of FIG. 45. The linear polarization layer 220 includes a plurality of grids 120. The grids 120 are disposed on a surface of the sealing member 500 opposite to the organic light-emitting device 300. The grids 120 include a first component 120a and a second component 120b which have a concentration gradient in the thickness direction of the grids 120. The first component 120a includes a dielectric material and the second component 120b includes a metal. The content (i.e., concentration) of the first component 120a increases along a thickness direction from the center to the sealing member side and the opposite side of the grids 120, and the content (i.e., concentration) of the second component 120b increases along a thickness direction toward the center of the grids 120 from either side of the grids 120. That is, along a thickness direction from the center to the sealing member side and the opposite side of the grids 120, the ratio of a dielectric material to an opaque metal in the grids 120 is gradually increased.

Therefore, the grids 120 can reduce or prevent an interfacial reflection that may be caused by a refractive index difference. Thus, when external light is incident on the grids 120, the grids 120 absorb the external light, thereby reducing or preventing the reflection of the external light.

Some of external light incident in the direction of the sealing member 500 may enter into the organic light-emitting display apparatus via the sealing member 500 and be then reflected from a metal layer or the like of the organic light-emitting display apparatus, and the reflected light may advance toward the sealing member 500 from the ¼ wavelength retardation layer 210, thus reducing contrast. At this time, the grids 120 can absorb the reflected light since they include a higher amount of a dielectric material as it is closer to the sealing member 500, thereby reducing or preventing the reflection of the external light, resulting in better contrast. The detailed structure, formation method, and effects of the grids 120 are as described above with reference to FIGS. 1 through 3, and thus, descriptions thereof will be omitted.

Figure 47:
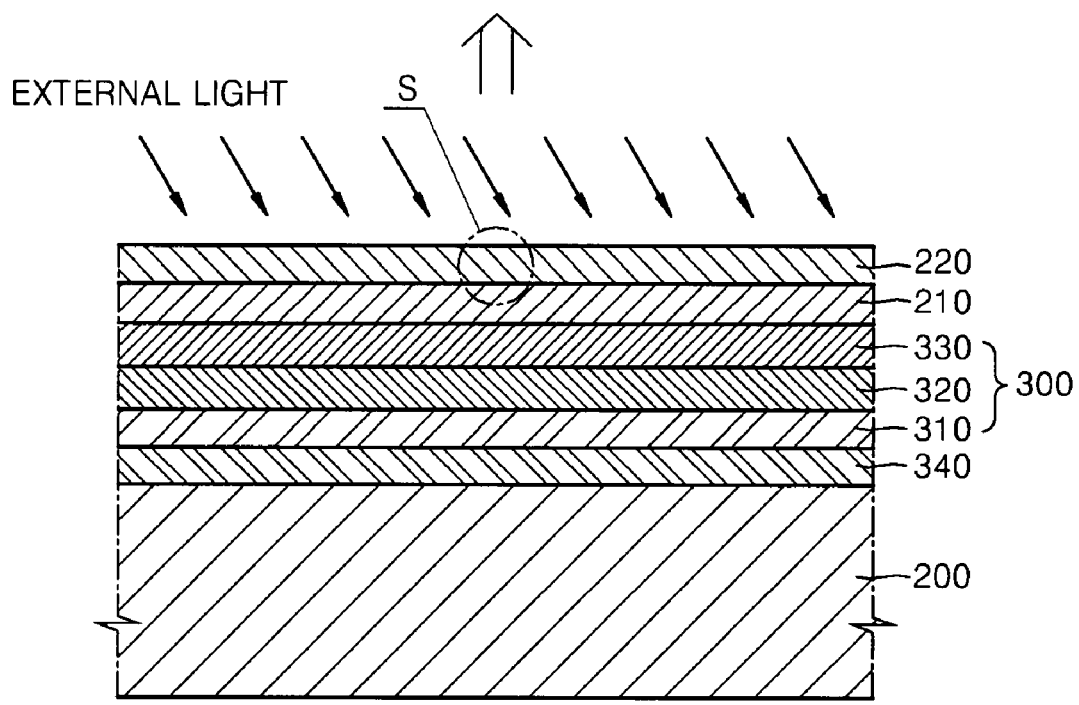
Figure 48:
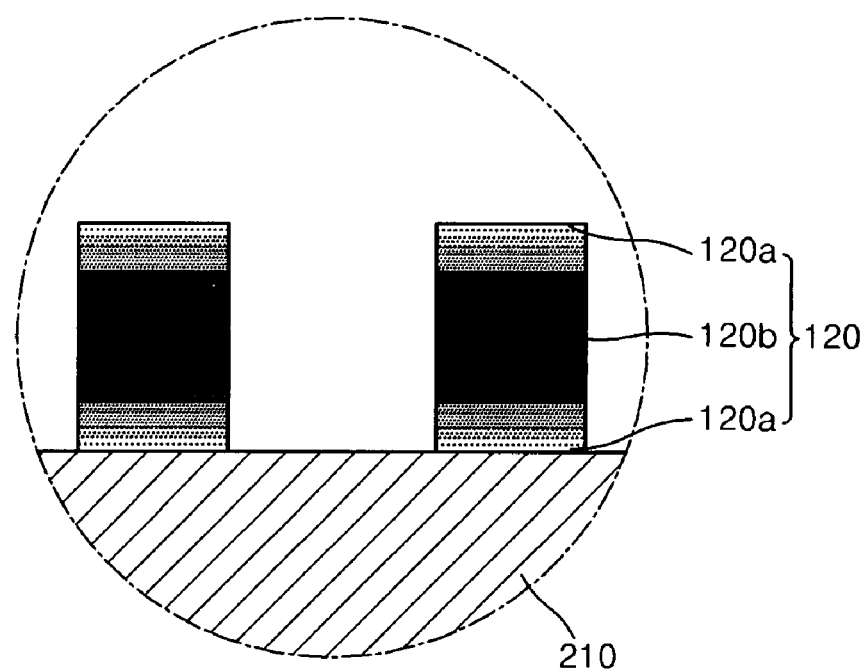

FIG. 47 is a sectional view illustrating a top emission type organic light-emitting display apparatus according to another embodiment of the present invention. Referring to FIG. 47, a reflective layer 340 is disposed on a substrate 200, an organic light-emitting device 300 is disposed on the reflective layer 340, a ¼ wavelength retardation layer 210 is disposed on the organic light-emitting device 300, and a linear polarization layer 220 is disposed on the ¼ wavelength retardation layer 210. The structure of the linear polarization layer 220 is specifically illustrated in FIG. 48 which is an enlarged view of a part S of FIG. 47. A plurality of grids 120 are disposed on the ¼ wavelength retardation layer 210.

The linear polarization layer 220 includes the grids 120. The grids 120 are disposed on the ¼ wavelength retardation layer 210. The grids 120 include a first component 120a and a second component 120b which have a concentration gradient in the thickness direction of the grids 120. The first component 120a includes a dielectric material and the second component 120b includes a metal. The content (i.e., concentration) of the first component 120a increases along a thickness direction from the center to the ¼ wavelength retardation layer side and the opposite side of the grids 120, and the content (i.e., concentration) of the second component 120b increases along a thickness direction toward the center of the grids 120 from either end of the grids 120. That is, along a thickness direction from the center to the ¼ wavelength retardation layer side and the opposite side of the grids 120, the ratio of a dielectric material to an opaque metal in the grids 120 is gradually increased.

The detailed structure, formation method, and effects of the grids 120 are as described above with reference to FIGS. 1 through 3, and thus, descriptions thereof will be omitted.

Figure 49:
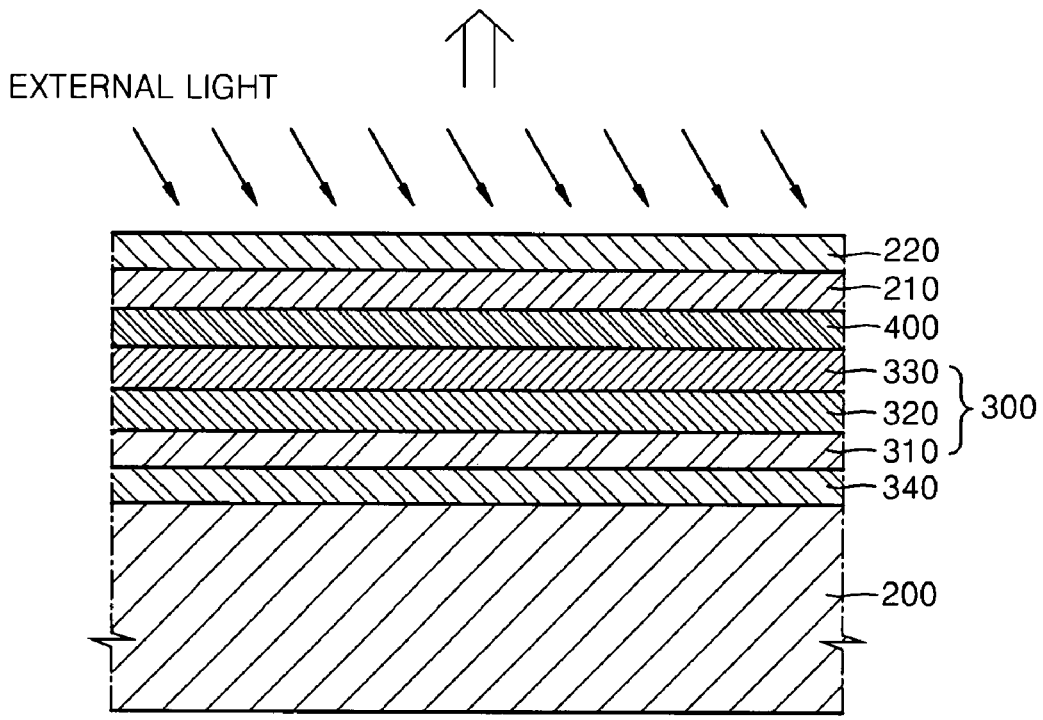
FIG. 49 is a schematic sectional view illustrating a modified embodiment of the top emission type organic light-emitting display apparatus of FIG. 47.

A protective layer may be interposed between a second electrode 330 and the ¼ wavelength retardation layer 210. Referring to FIG. 49, a protective layer 400 is disposed between a second electrode 330 of an organic light-emitting device 300 and a ¼ wavelength retardation layer 210. The structure of FIG. 49 is the same as the structure of FIG. 47 except the protective layer 400, and thus, only the protective layer 400 will be described. The protective layer 400 serves to reduce or prevent damage to the second electrode 330 which may be caused when forming the ¼ wavelength retardation layer 210. The protective layer 400 is formed of an inorganic material or an organic material. The inorganic material may be metal oxide, metal nitride, metal carbide, metal oxynitride, or a compound thereof. Examples of the metal oxide include silicon oxide, aluminum oxide, titanium oxide, indium oxide, tin oxide, indium tin oxide, and compounds thereof. Examples of the metal nitride include aluminum nitride, silicon nitride, and compounds thereof. The metal carbide may be silicon carbide, and the metal oxynitride may be silicon oxynitride. The inorganic material may also be silicone, or a ceramic derivative of silicone or metal. In addition, diamond-like carbon (DLC) may be used. The organic material may be an organic polymer, an inorganic polymer, an organometallic polymer, a hybrid organic/inorganic polymer, or the like. The organic material may also be an acrylic resin.

Figure 50:
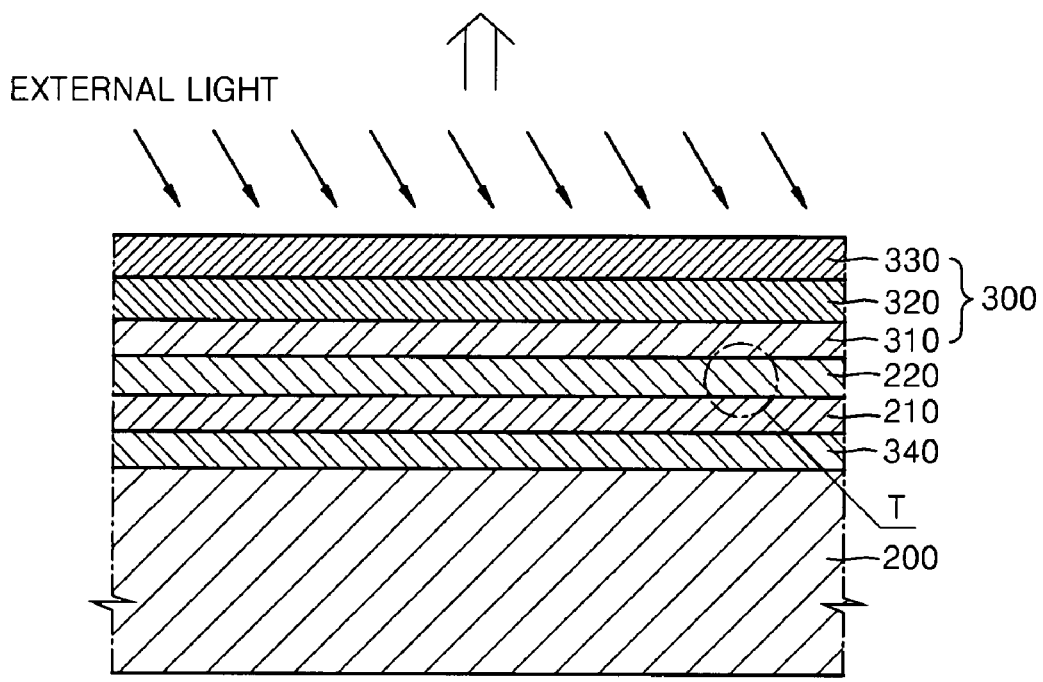
Figure 51:
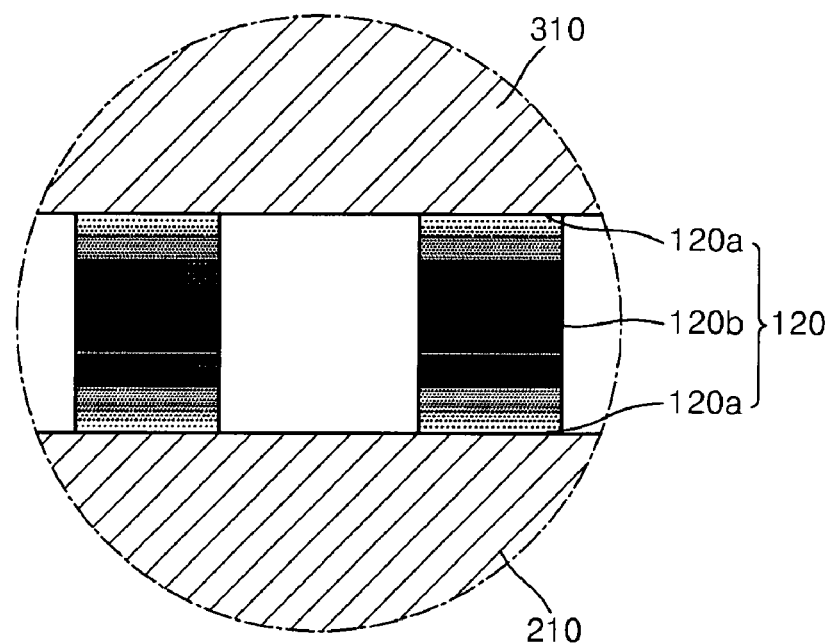

FIG. 50 is a sectional view illustrating a top emission type organic light-emitting display apparatus according to another embodiment of the present invention. Referring to FIG. 50, a ¼ wavelength retardation layer 210 and a linear polarization layer 220 are interposed between a reflective layer 340 and an organic light-emitting device 300. The structure of the linear polarization layer 220 is specifically illustrated in FIG. 51 which is an enlarged view of a part T of FIG. 50. A plurality of grids 120 are disposed on the ¼ wavelength retardation layer 210.

The linear polarization layer 220 includes the grids 120. The grids 120 are interposed between the ¼ wavelength retardation layer 210 and a first electrode 310. The grids 120 include a first component 120a and a second component 120b which have a concentration gradient in the thickness direction of the grids 120. The first component 120a includes a dielectric material and the second component 120b includes a metal. The content (i.e., concentration) of the first component 120a increases along a thickness direction from the center to the ¼ wavelength retardation layer side and the first electrode side of the grids 120, and the content (i.e., concentration) of the second component 120b increases along a thickness direction toward the center of the grids 120 from either side of the grids 120. That is, along a thickness direction from the center to the ¼ wavelength retardation layer side and the first electrode side of the grids 120, the ratio of a dielectric material to an opaque metal in the grids 120 is gradually increased.

The detailed structure, formation method, and effects of the grids 120 are as described above with reference to FIGS. 1 through 3, and thus, descriptions thereof will be omitted.

Although not shown, the ¼ wavelength retardation layer 210 may be disposed on the reflective layer 340, the organic light-emitting device 30 may be disposed on the ¼ wavelength retardation layer 21, and the linear polarization layer 22 may be disposed on the organic light-emitting device 30.

Figure 52:
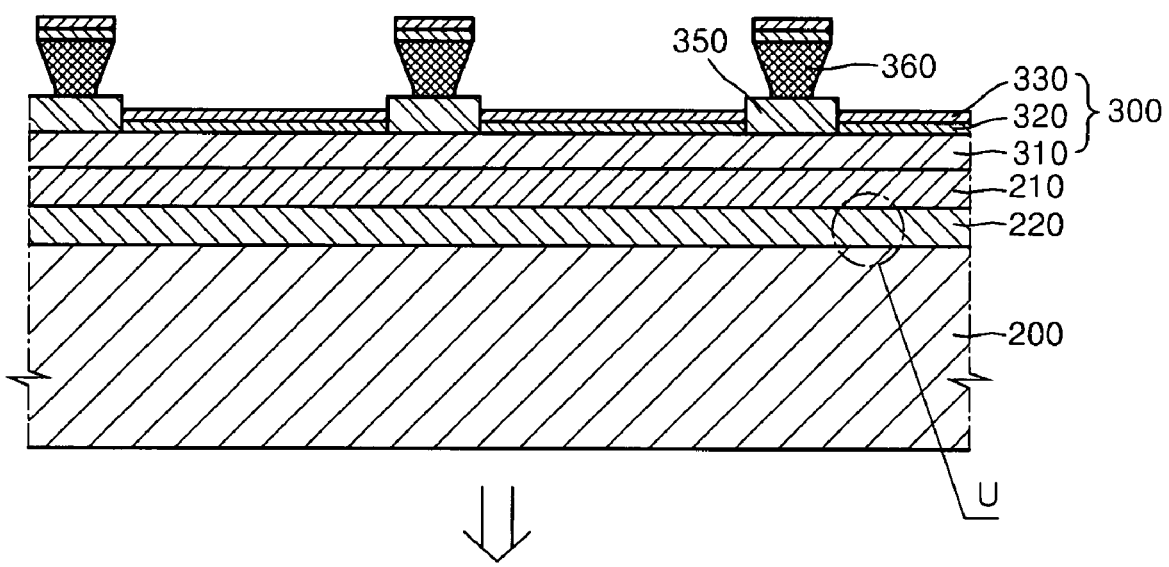
FIG. 52 is a schematic sectional view illustrating a PM bottom emission type organic light-emitting display apparatus according to another embodiment of the present invention.
Figure 53:
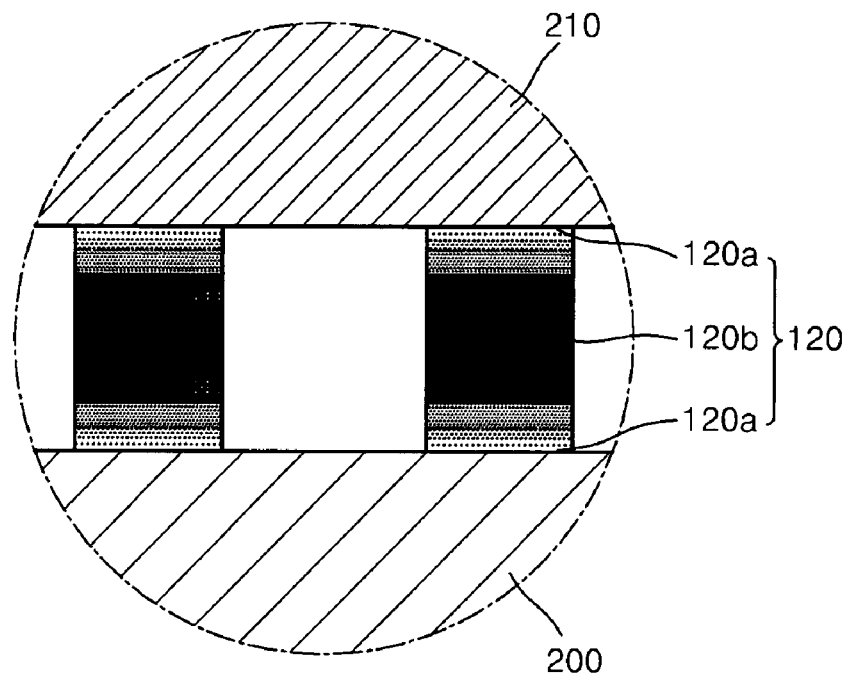
FIG. 53 is an enlarged sectional view illustrating a linear polarization layer of the organic light-emitting display apparatus of FIG. 52.

FIG. 52 is a schematic sectional view illustrating a PM bottom emission type organic light-emitting display apparatus according to an embodiment of the present invention. Referring to FIG. 52, a linear polarization layer 220 and a ¼ wavelength retardation layer 210 are sequentially stacked on a substrate 200, and an organic light-emitting device 300 is disposed on the ¼ wavelength retardation layer 210. A detailed structure of the linear polarization layer 220 is illustrated in FIG. 53 which is an enlarged view of a part U of FIG. 52. The linear polarization layer 220 includes a plurality of grids 120. The grids 120 are interposed between the ¼ wavelength retardation layer 210 and the substrate 200. The grids 120 include a first component 120a and a second component 120b which have a concentration gradient in the thickness direction of the grids 120. The first component 120a includes a dielectric material and the second component 120b includes a metal. The content (i.e., concentration) of the first component 120a increases along a thickness direction from the center to the ¼ wavelength retardation side and the substrate side of the grids 120, and the content (i.e., concentration) of the second component 120b increases along a thickness direction toward the center of the grids 120 from either side of the grids 120. That is, along a thickness direction from the center to the ¼ wavelength retardation side and the substrate side of the grids 120, the ratio of a dielectric material to an opaque metal in the grids 120 is gradually increased.

Therefore, the grids 120 can reduce or prevent an interfacial reflection that may be caused by a refractive index difference. Thus, when external light is incident in the direction of the substrate 200, the grids 120 absorb the external light, thereby reducing or preventing the reflection of the external light.

Some of external light incident in the direction of the substrate 200 may enter into the organic light-emitting display apparatus via the substrate 200 and be reflected from a meta layer or the like of the organic light-emitting display apparatus, and the reflected light may advance toward the substrate 200 from the ¼ wavelength retardation layer 210, thus reducing contrast. At this time, the grids 120 absorb the reflected light since they include a higher amount of a dielectric material as it is closer to the ¼ wavelength retardation layer 210, thereby reducing or preventing the reflection of the external light, resulting in better contrast. The detailed structure, formation method, and effects of the grids 120 are as described above with reference to FIGS. 1 through 3, and thus, descriptions thereof will be omitted.

A first electrode 310 is formed in a stripe pattern on the ¼ wavelength retardation layer 210, and an internal insulator 350 partitioning the first electrode 310 is disposed on the first electrode 310. A separator 360 orthogonal to the first electrode 310 is disposed on the internal insulator 350 in order to pattern an organic light-emitting layer 320 and a second electrode 330. By the separator 360, the organic light-emitting layer 320 and the second electrode 330 are patterned to cross with the first electrode 310. A sealing member (not shown) is disposed on the second electrode 330 in order to protect the organic light-emitting device 300 from the external air. In some cases, the organic light-emitting layer 320 and the second electrode 330 may be patterned in the absence of the separator 360.

In the current embodiment of the present invention, like in the previous embodiments, the linear polarization layer 220 and the ¼ wavelength retardation layer 210 are sequentially stacked on the substrate 200. The linear polarization layer 220 and the ¼ wavelength retardation layer 210 can reduce or prevent the reflection of external light incident on a lower surface of the substrate 200 as viewed in FIG. 52. Moreover, the grids 120 can reduce or prevent an interfacial reflection that may be caused by a refractive index difference. Thus, when external light is incident on the grids 120, the grids 120 absorb the external light, thereby reducing or preventing the reflection of the external light.

Although not shown, it should be understood that such a PM bottom emission type display apparatus can include a structure as illustrated in FIG. 37 or 38.

Figure 54:
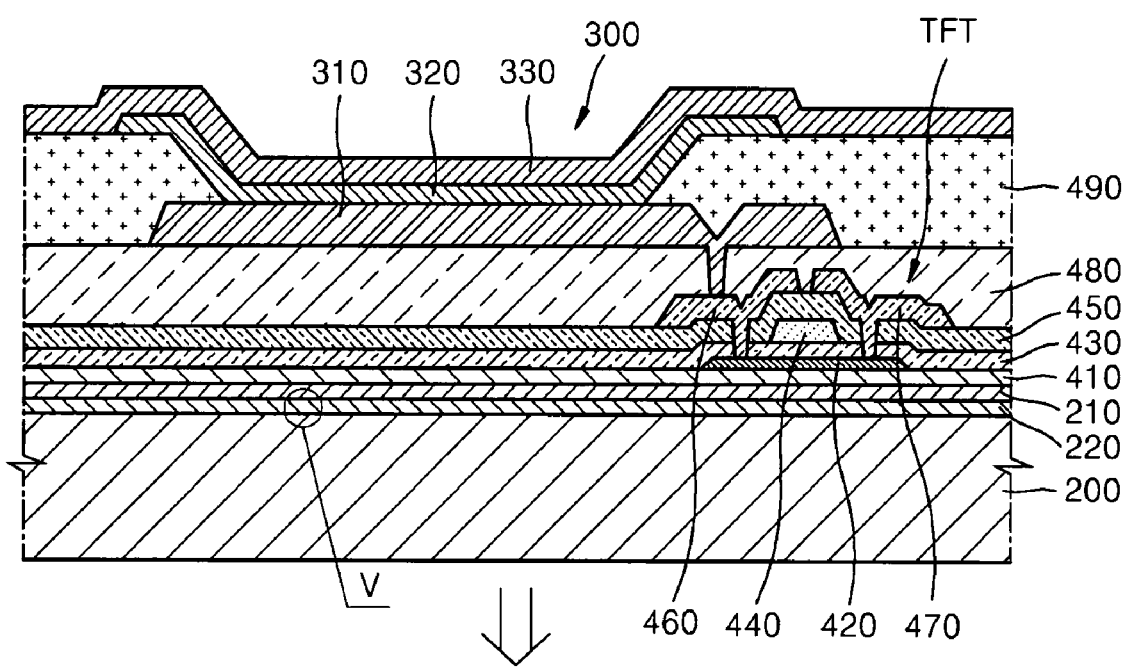
FIG. 54 is a schematic sectional view illustrating an AM bottom emission type organic light-emitting display apparatus according to another embodiment of the present invention.

FIG. 54 is a schematic sectional view illustrating an AM bottom emission type organic light-emitting display apparatus according to an embodiment of the present invention.

Referring to FIG. 54, a thin film transistor TFT is disposed on a substrate 200. At least one thin film transistor TFT is formed in each pixel and is electrically connected to an organic light-emitting device 300.

Figure 55:
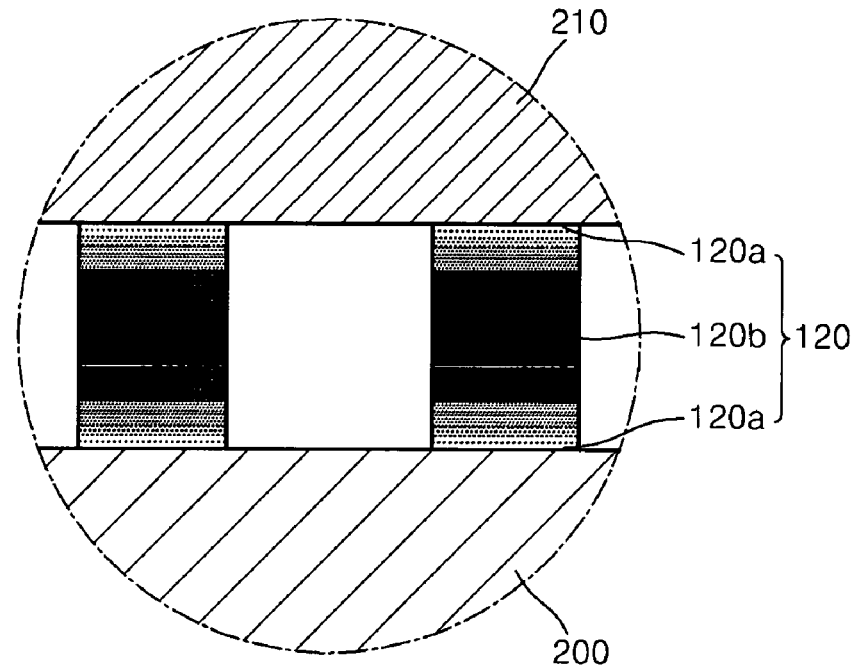
FIG. 55 is an enlarged sectional view illustrating a linear polarization layer of the organic light-emitting display apparatus of FIG. 54.

In detail, a linear polarization layer 220 and a ¼ wavelength retardation layer 210 are sequentially stacked on the substrate 200. The structure of the linear polarization layer 220 is specifically illustrated in FIG. 55 which is an enlarged view of a part V of FIG. 54. The structure of FIG. 55 is the same as that of FIG. 36, and thus, a detailed description thereof will be omitted.

A buffer layer 410 is disposed on the ¼ wavelength retardation layer 210, and a semiconductor layer 420 is patterned on the buffer layer 410. A gate insulating layer 430 formed of SiO2, SiNx, or the like is disposed on the semiconductor layer 420, and a gate electrode 440 is disposed on a portion (e.g., predetermined portion) of the gate insulating layer 430. The gate electrode 440 is connected to a gate line (not shown) applying a TFT on/off signal. An inter-insulating layer 450 is disposed on the gate electrode 440, and a source electrode 460 and a drain electrode 470 are disposed to respectively contact with source and drain regions of the semiconductor layer 420 via contact holes. The thin film transistor TFT with the above-described structure is covered and protected with a passivation layer 480.

A first electrode 310 serving as an anode is disposed on the passivation layer 480, and is covered with a pixel define layer 490 formed of an insulating material. An opening is formed in the pixel define layer 490, and an organic light-emitting layer 320 is disposed in a region defined by the opening. A second electrode 330 is disposed to cover all pixels.

In the AM structure according to the current embodiment of the present invention, like in the previous embodiments, the linear polarization layer 220 and the ¼ wavelength retardation layer 210 are sequentially stacked on the substrate 200. The linear polarization layer 220 and the ¼ wavelength retardation layer 210 can reduce or prevent the reflection of external light incident on a lower surface of the substrate 200 as viewed in FIG. 54. Moreover, the linear polarization layer 220 and the ¼ wavelength retardation layer 210 can reduce or prevent an interfacial reflection that may be caused by a refractive index difference.

In such an AM bottom emission type organic light-emitting display apparatus, provided that a linear polarization layer is disposed to face external light and a ¼ wavelength retardation layer is disposed to face an organic light-emitting device, the linear polarization layer and the ¼ wavelength retardation layer can be disposed on any surface(s) defined by a substrate, a thin film transistor, and the organic light-emitting device. That is, although not shown, like in FIGS. 37 and 39, after forming a ¼ wavelength retardation layer and/or a linear polarization layer on a surface and/or the other surface of a substrate, a thin film transistor and an organic light-emitting device can be formed on the resultant structure. A ¼ wavelength retardation layer and/or a linear polarization layer can also be disposed at an interface(s) defined by any layers constituting a thin film transistor.

Figure 56:
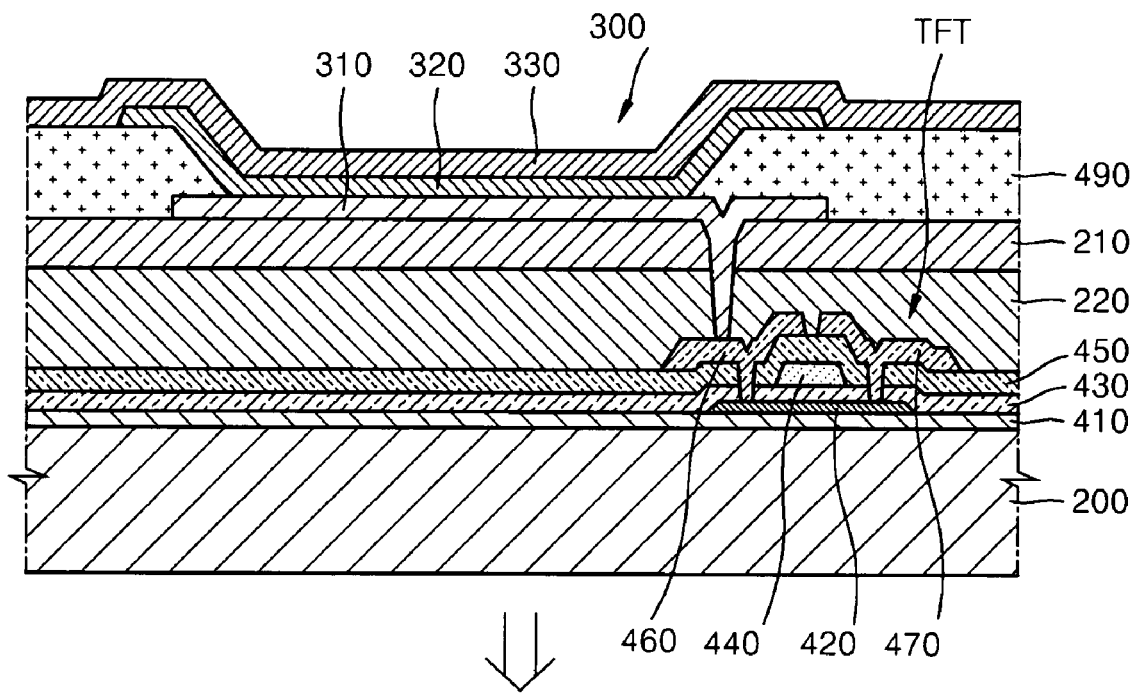
FIG. 56 is a schematic sectional view illustrating an AM bottom emission type organic light-emitting display apparatus according to another embodiment of the present invention.

A linear polarization layer and a ¼ wavelength retardation layer can be used instead of a passivation layer. Referring to FIG. 56, a linear polarization layer 220 and a ¼ wavelength retardation layer 210 are sequentially stacked on an inter-insulating layer 450 instead of forming a passivation layer made of an organic material and/or an inorganic material on a thin film transistor TFT. The structures and effects of other constitutional elements are as described above, and thus, descriptions thereof will be omitted.

Figure 57:
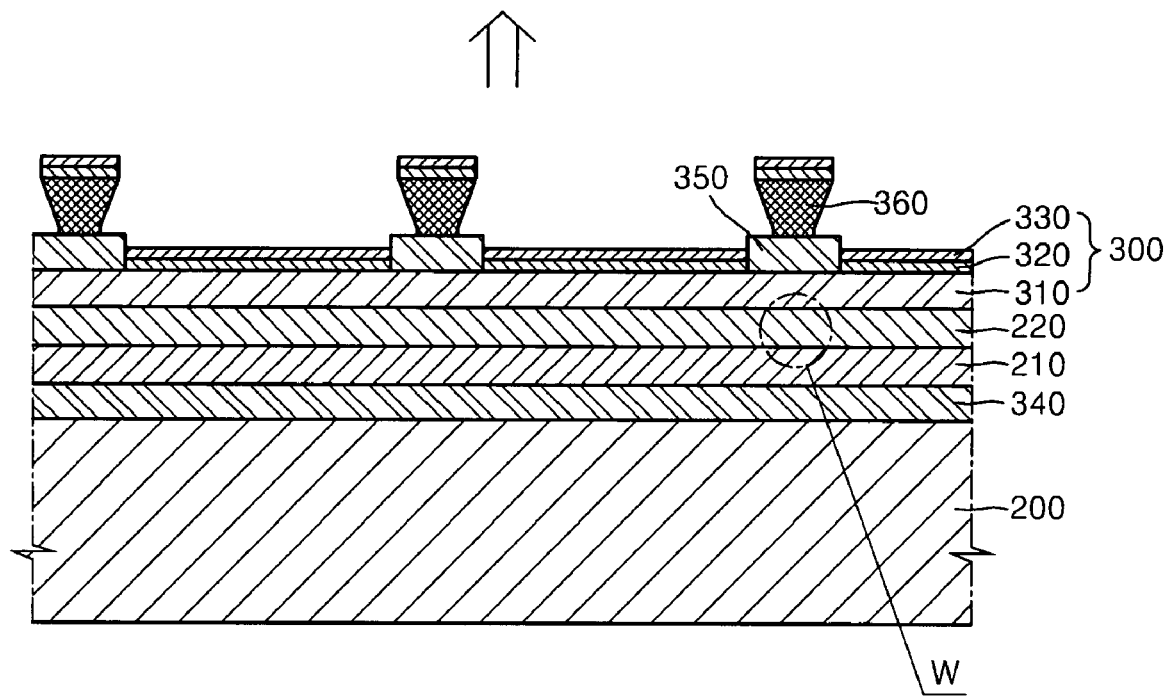
FIG. 57 is a schematic sectional view illustrating a PM top emission type organic light-emitting display apparatus according to another embodiment of the present invention.

FIG. 57 is a schematic sectional view illustrating a PM top emission type organic light-emitting display apparatus according to an embodiment of the present invention.

Referring to FIG. 57, a reflective layer 340 is disposed on a substrate 200, a ¼ wavelength retardation layer 210 and a linear polarization layer 220 are sequentially stacked on the reflective layer 340, and an organic light-emitting device 300 is disposed on the linear polarization layer 220.

Figure 58:
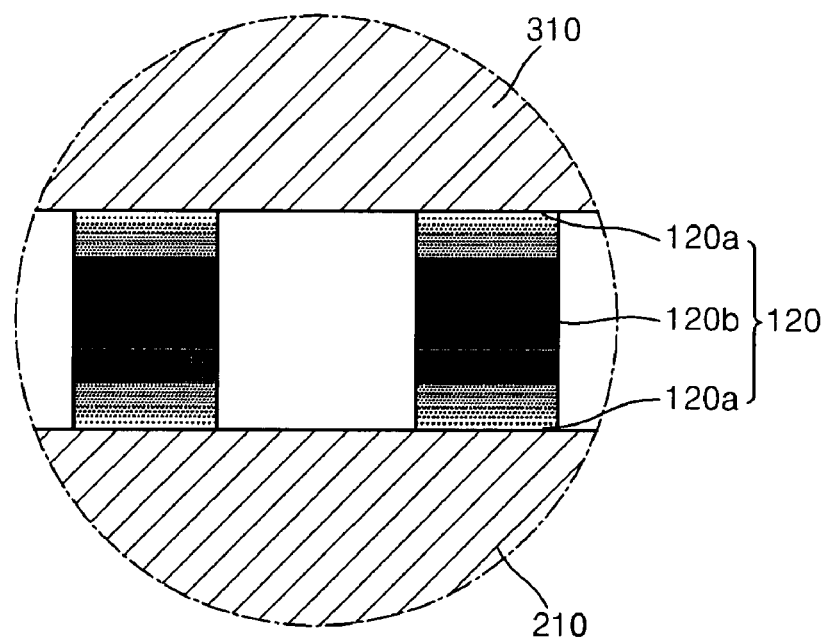
FIG. 58 is an enlarged sectional view illustrating a linear polarization layer of the organic light-emitting display apparatus of FIG. 57.

The structure of the linear polarization layer 220 is specifically illustrated in FIG. 58 which is an enlarged view of a part W of FIG. 57. The structure of FIG. 58 is the same as that of FIG. 51, and thus, a detailed description thereof will be omitted.

A first electrode 310 is disposed in a stripe pattern on the linear polarization layer 220, and an internal insulator 350 partitioning the first electrode 310 is disposed on the first electrode 310. A separator 360 orthogonal to the first electrode 310 is disposed on the internal insulator 350 in order to pattern an organic light-emitting layer 320 and a second electrode 330. By the separator 360, the organic light-emitting layer 320 and the second electrode 330 are patterned to cross with the first electrode 310. A sealing member (not shown) is disposed on the second electrode 330 to protect the organic light-emitting device 300 from the external air. In some cases, the organic light-emitting layer 320 and the second electrode 330 may be patterned in the absence of the separator 360.

In the current embodiment of the present invention, like in the previous embodiments, the reflection of an incident external light does not occur, thereby ensuring a manufacture of thinner displays having better contrast. The structures and effects of the constitutional elements are as described above, and thus, descriptions thereof will be omitted.

Although not shown, it should be understood that the structures illustrated in FIGS. 41 through 49 can be applied to PM top emission organic light-emitting display apparatuses as described above.

Figure 59:
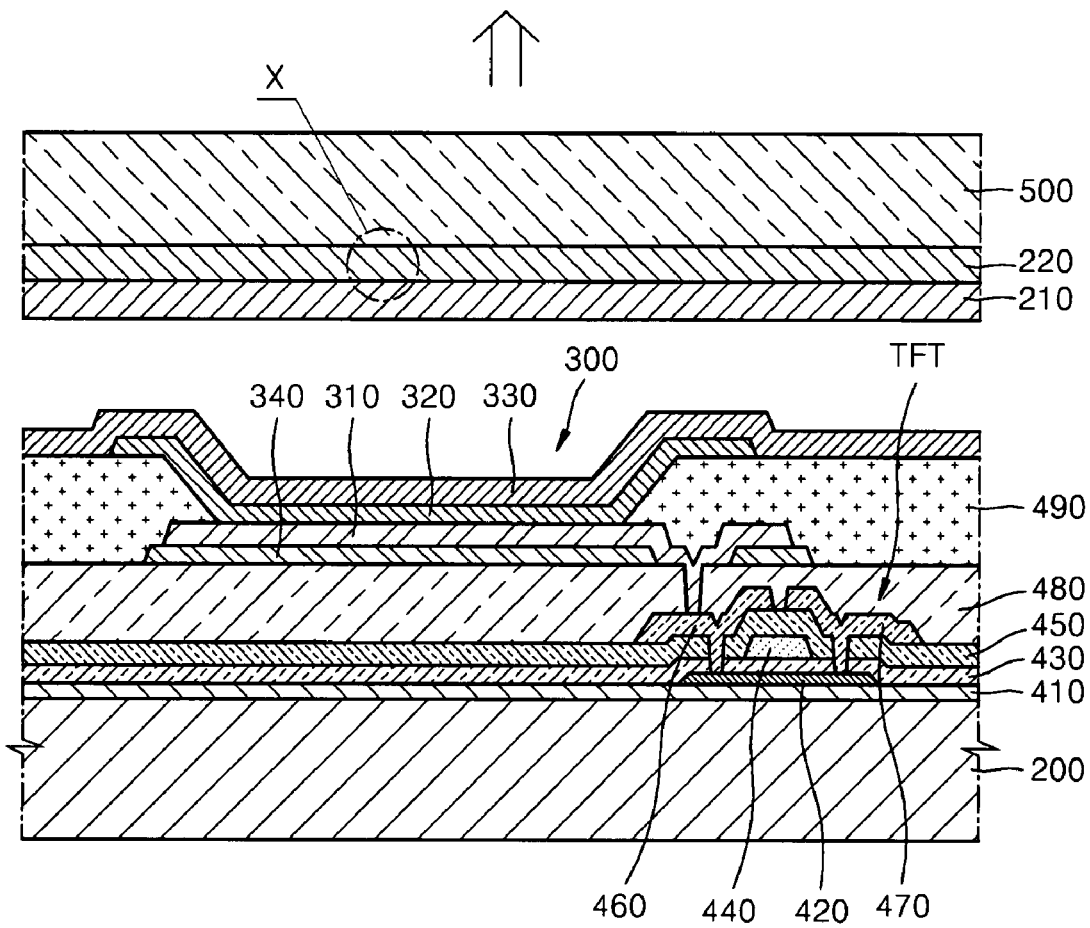
FIG. 59 is a schematic sectional view illustrating an AM top emission type organic light-emitting display apparatus according to another embodiment of the present invention.

FIG. 59 is a schematic sectional view illustrating an AM top emission type organic light-emitting display apparatus according to an embodiment of the present invention.

Referring to FIG. 59, a thin film transistor TFT is disposed on a substrate 200. At least one thin film transistor TFT is formed in each pixel and is electrically connected to an organic light-emitting device 300. The structure of the thin film transistor TFT is as described above with reference to FIG. 54, and thus, a detailed description thereof will be omitted.

A passivation layer 480 is disposed on the thin film transistor TFT to cover the thin film transistor TFT, and a reflective layer 340 is disposed on the passivation layer 480. A first electrode 310 serving as an anode is disposed on the reflective layer 340 and is covered with a pixel define layer 490 formed of an insulating material. An opening is formed in the pixel define layer 490, and an organic light-emitting layer 320 is disposed in a region defined by the opening. A second electrode 330 is disposed to cover all pixels.

Figure 60:
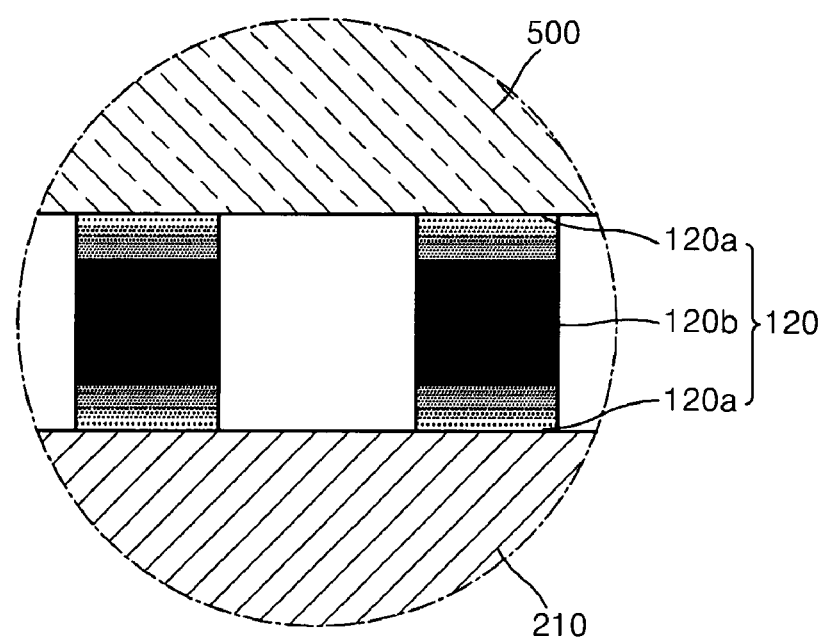
FIG. 60 is an enlarged sectional view illustrating a linear polarization layer of the organic light-emitting display apparatus of FIG. 59.

A linear polarization layer 220 and a ¼ wavelength retardation layer 210 are sequentially stacked on a surface of a sealing member 500 facing the organic light-emitting device 300. The structure of the linear polarization layer 220 is specifically illustrated in FIG. 60 which is an enlarged view of a part X of FIG. 59. The structure of FIG. 60 is the same as that of FIG. 44, and thus, a detailed description thereof will be omitted.

The linear polarization layer 220 and the ¼ wavelength retardation layer 210 can reduce or prevent the reflection of external light incident on the top part of FIG. 59, i.e., on an upper surface of the sealing member 500. Moreover, the grids 120 can reduce or prevent an interfacial reflection that may be caused by a refractive index difference. Thus, when external light is incident on the grids 120, the grids 120 absorb the external light, thereby reducing or preventing the reflection of the external light, resulting in better contrast. Although not shown, it should be understood that such an AM top emission type display apparatus can include any one of structures as illustrated in FIGS. 41 through 51.

The present invention is not limited to organic light-emitting display apparatuses as described above, and can be applied to other flat panel display apparatuses, such as inorganic light-emitting apparatuses, LCDs, and electron emission displays.

A polarizer and a flat panel display apparatus according to the present invention can enhance contrast and visibility.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A polarizer having an external light incidence side facing an external light, and a side opposite the external light incidence side and spaced from the external light incidence side in a thickness direction of the polarizer, the polarizer comprising:
   a base; and
   a plurality of grids on the base, the plurality of grids comprising a first component and a second component intermixed with the first component, and having a thickness in the thickness direction of the polarizer,
   wherein the first component comprises a dielectric material and the second component comprises a metal, and
   wherein a concentration of the first component in the grids increases in accordance with a first concentration gradient along a first direction parallel to the thickness direction toward the external light incidence side, and a concentration of the second component in the grids increases in accordance with a second concentration gradient along a second direction parallel to the thickness direction away from the external light incidence side.

2. The polarizer of claim 1, wherein the first component comprises at least one selected from the group consisting of $SiO_x(x \geq 1)$, $SiN_x(x \geq 1)$, $MgF_2$, $CaF_2$, $Al_2O_3$, $SnO_2$, indium tin oxide (ITO), indium zinc oxide (IZO), ZnO, and $In_2O_3$.

3. The polarizer of claim 1, wherein the second component comprises at least one selected from the group consisting of Fe, Co, V, Ti, Al, Ag, Si, Cr, Mo, Ge, Y, Zn, Zr, W, Ta, Cu, and Pt.

4. The polarizer of claim 1, wherein the grids have a stripe shape and are separated from each other.

5. An organic light-emitting display apparatus having an image display side, the organic light-emitting display apparatus comprising:
   a substrate;
   an organic light-emitting device on the substrate for displaying images at the image display side;

a sealing member on the organic light-emitting device;

a ¼ wavelength retardation layer on a surface corresponding to at least one of the substrate, the organic light-emitting device, or the sealing member; and a linear polarization layer on another surface corresponding to at least one of the substrate, the organic light-emitting device, or the sealing member or on a surface of the ¼ wavelength retardation layer, the linear polarization layer being closer than the ¼ wavelength retardation layer to the image display side, wherein the linear polarization layer comprises a plurality of grids including a first component and a second component intermixed with the first component, the first component comprises a dielectric material, and the second component comprises a metal, and wherein a concentration of the first component in the grids increases in accordance with a first concentration gradient along a first direction parallel to the thickness direction toward the image display side, and a concentration of the second component in the grids increases in accordance with a second concentration gradient along a second direction parallel to the thickness direction away from the image display side.

6. The organic light-emitting display apparatus of claim 5, wherein the images are displayed toward the substrate, and wherein the linear polarization layer is on the substrate, the ¼ wavelength retardation layer is on the linear polarization layer, and the organic light-emitting device is on the ¼ wavelength retardation layer.

7. The organic light-emitting display apparatus of claim 5, wherein the images are displayed toward the substrate, and wherein the ¼ wavelength retardation layer is on a side of the substrate, the organic light-emitting device is on the ¼ wavelength retardation layer, and the linear polarization layer is on an opposite side of the substrate from the ¼ wavelength retardation layer.

8. The organic light-emitting display apparatus of claim 5, wherein the images are displayed toward the substrate, and wherein the ¼ wavelength retardation layer and the linear polarization layer are sequentially on a side of the substrate opposite to the organic light-emitting device.

9. The organic light-emitting display apparatus of claim 5, wherein the images are displayed toward the sealing member, and wherein the ¼ wavelength retardation layer is on the organic light-emitting device, and the linear polarization layer is on the ¼ wavelength retardation layer.

10. The organic light-emitting display apparatus of claim 9, further comprising a protective layer between the organic light-emitting device and the ¼ wavelength retardation layer.

11. The organic light-emitting display apparatus of claim 5, wherein the images are displayed toward the sealing member, and wherein the ¼ wavelength retardation layer and the linear polarization layer are sequentially on a side of the sealing member opposite to the organic light-emitting device.

12. The organic light-emitting display apparatus of claim 5, wherein the images are displayed toward the sealing member, and wherein the ¼ wavelength retardation layer is on a side of the sealing member facing the organic light-emitting device, and the linear polarization layer is on an opposite side of the sealing member from the ¼ wavelength retardation layer.

13. The organic light-emitting display apparatus of claim 5, wherein the images are displayed toward the sealing member, and wherein the linear polarization layer is on a side of the sealing member facing the organic light-emitting device, and the ¼ wavelength retardation layer is on a side of the linear polarization layer facing the organic light-emitting device.

14. The organic light-emitting display apparatus of claim 5, wherein the images are displayed toward the sealing member, and wherein a reflective layer is further interposed between the substrate and the organic light-emitting device, the ¼ wavelength retardation layer is between the reflective layer and the organic light-emitting device, and the linear polarization layer is on the organic light-emitting device.

15. The organic light-emitting display apparatus of claim 5, wherein the first component comprises at least one selected from the group consisting of $SiOx(x \geq 1)$, $SiNx(x \geq 1)$, $MgF2$, $CaF2$, $Al2O3$, and $SnO2$.

16. The organic light-emitting display apparatus of claim 5, wherein the second component comprises at least one selected from the group consisting of Fe, Co, V, Ti, Al, Ag, Si, Cr, Mo, Ge, Y, Zn, Zr, W, Ta, Cu, and Pt.

17. The organic light-emitting display apparatus of claim 5, wherein the grids have a stripe shape and are separated from each other.

18. A polarizer having an external light incidence side facing an external light, and a side opposite the external light incidence side and spaced from the external light incidence side in a thickness direction of the polarizer, the polarizer comprising:

a base; and a plurality of grids on the base, the plurality of grids comprising a first component including a dielectric material and a second component intermixed with the first component and including a metal, and having a thickness between a first end and a second end in the thickness direction of the polarizer and having a center between the first and second ends along the thickness direction, wherein a concentration of the first component in the grids increases in accordance with a first concentration gradient along a first direction parallel to the thickness direction from the center toward the first end or the second end, and a concentration of the second component in the grids increases in accordance with a second concentration gradient along a second direction parallel to the thickness direction toward the center from the first end or the second end.

19. The polarizer of claim 18, wherein the first component comprises at least one selected from the group consisting of $SiOx(x \geq 1)$, $SiNx(x \geq 1)$, $MgF2$, $CaF2$, $Al2O3$, $SnO2$, ITO, IZO, ZnO, and $In2O3$.

20. The polarizer of claim 18, wherein the second component comprises at least one selected from the group consisting of Fe, Co, V, Ti, Al, Ag, Si, Cr, Mo, Ge, Y, Zn, Zr, W, Ta, Cu, and Pt.

21. An organic light-emitting display apparatus having an image display side, the organic light-emitting display apparatus comprising:

a substrate;

an organic light-emitting device on the substrate for displaying images at the image display side;

a sealing member on the organic light-emitting device;

a ¼ wavelength retardation layer on a surface corresponding to at least one of the substrate, the organic light-emitting device, or the sealing member; and a linear polarization layer on another surface corresponding to at least one of the substrate, the organic light-emitting device, or the sealing member or on a surface of the ¼ wavelength retardation layer, the linear polarization layer being closer than the ¼ wavelength retardation layer to the image display side, wherein the linear polarization layer comprises a plurality of grids including a first component including a dielectric material and a second component intermixed with the first component and including a metal, and having a thickness between a first end and a second end in a thickness direction of the grids and having a center between the first and second ends along the thickness direction, wherein a concentration of the first component in the grids increases in accordance with a first concentration gradient along a first direction parallel to the thickness direction from the center toward the first end or the second end, and a concentration of the second component increases in accordance with a second concentration gradient along a second direction parallel to the thickness direction toward the center from the first end or the second end.

22. The organic light-emitting display apparatus of claim 21, wherein the images are displayed toward the substrate, and wherein the linear polarization layer is on the substrate, the ¼ wavelength retardation layer is on the linear polarization layer, and the organic light-emitting device is on the ¼ wavelength retardation layer.

23. The organic light-emitting display apparatus of claim 21, wherein the images are displayed toward the substrate, and wherein the ¼ wavelength retardation layer is on a side of the substrate, the organic light-emitting device is on the ¼ wavelength retardation layer, the linear polarization layer is on an opposite side of the substrate from the ¼ wavelength retardation layer.

24. The organic light-emitting display apparatus of claim 21, wherein the images are displayed toward the substrate, and wherein the ¼ wavelength retardation layer and the linear polarization layer are sequentially on a side of the substrate opposite to the organic light-emitting device.

25. The organic light-emitting display apparatus of claim 21, wherein the images are displayed toward the sealing member, and wherein the ¼ wavelength retardation layer is on the organic light-emitting device, and the linear polarization layer is on the ¼ wavelength retardation layer.

26. The organic light-emitting display apparatus of claim 25, further comprising a protective layer between the organic light-emitting device and the ¼ wavelength retardation layer.

27. The organic light-emitting display apparatus of claim 21, wherein the images are displayed toward the sealing member, and wherein the ¼ wavelength retardation layer and the linear polarization layer are sequentially on a side of the sealing member opposite to the organic light-emitting device.

28. The organic light-emitting display apparatus of claim 21, wherein the images are displayed toward the sealing member, and wherein the ¼ wavelength retardation layer is on a side of the sealing member facing the organic light-emitting device, and the linear polarization layer is on an opposite side of the sealing member from the ¼ wavelength retardation layer.

29. The organic light-emitting display apparatus of claim 21, wherein the images are displayed toward the sealing member, and wherein the linear polarization layer is on a side of the sealing member facing the organic light-emitting device, and the ¼ wavelength retardation layer is on a side of the linear polarization layer facing the organic light-emitting device.

30. The organic light-emitting display apparatus of claim 21, wherein the images are displayed toward the sealing member, and wherein a reflective layer is further interposed between the substrate and the organic light-emitting device, the ¼ wavelength retardation layer is between the reflective layer and the organic light-emitting device, and the linear polarization layer is on the organic light-emitting device.

31. The organic light-emitting display apparatus of claim 21, wherein the first component comprises at least one selected from the group consisting of SiOx(x≧1), SiNx(x≧1), MgF2, CaF2, Al2O3, and SnO2.

32. The organic light-emitting display apparatus of claim 21, wherein the second component comprises at least one selected from the group consisting of Fe, Co, V, Ti, Al, Ag, Si, Cr, Mo, Ge, Y, Zn, Zr, W, Ta, Cu, and Pt.

33. The organic light-emitting display apparatus of claim 21, wherein the grids have a stripe shape and are separated from each other.

* * * * *